United States Patent
Young et al.

(10) Patent No.: US 9,713,254 B2
(45) Date of Patent: *Jul. 18, 2017

(54) DEVICE COMPONENTS WITH SURFACE-EMBEDDED ADDITIVES AND RELATED MANUFACTURING METHODS

(71) Applicant: TPK HOLDING CO., LTD., Grand Cayman (KY)

(72) Inventors: Michael Eugene Young, Emeryville, CA (US); Arjun Daniel Srinivas, San Francisco, CA (US); Matthew R. Robinson, San Francisco, CA (US); Alexander Chow Mittal, Berkeley, CA (US)

(73) Assignee: TPK Holding Co., Ltd, Grand Cayman (VG)

( * ) Notice: Subject to any disclaimer, the term of this patent is extended or adjusted under 35 U.S.C. 154(b) by 0 days.

This patent is subject to a terminal disclaimer.

(21) Appl. No.: 14/873,567

(22) Filed: Oct. 2, 2015

(65) Prior Publication Data
US 2016/0029482 A1   Jan. 28, 2016

Related U.S. Application Data

(63) Continuation of application No. 14/299,938, filed on Jun. 9, 2014, now Pat. No. 9,185,798, which is a
(Continued)

(51) Int. Cl.
*H01L 33/00* (2010.01)
*H01L 31/00* (2006.01)
(Continued)

(52) U.S. Cl.
CPC ......... *H05K 1/09* (2013.01); *H01L 31/02167* (2013.01); *H01L 31/0481* (2013.01);
(Continued)

(58) Field of Classification Search
CPC ............. H01L 31/0481; H01L 31/0203; H01L 31/02167; H01L 31/055; H05K 1/09;
(Continued)

(56) References Cited

U.S. PATENT DOCUMENTS 3,751,287 A   8/1973  Baier et al.
3,849,284 A   11/1974 Kossmann
(Continued)

FOREIGN PATENT DOCUMENTS

CN   101427357   5/2009
CN   101589473   11/2009
(Continued)

OTHER PUBLICATIONS

Chi, G. J., et al., "Antibacterial activity of anodized aluminum with deposited silver," Surface and Coatings Technology 157, pp. 162-165, (2002).
(Continued)

*Primary Examiner* — Dao H Nguyen
(74) *Attorney, Agent, or Firm* — Cooper Legal Group, LLC

(57) ABSTRACT

Active or functional additives are embedded into surfaces of host materials for use as components in a variety of electronic or optoelectronic devices, including solar devices, smart windows, displays, and so forth. Resulting surface-embedded device components provide improved performance, as well as cost benefits arising from their compositions and manufacturing processes.

20 Claims, 24 Drawing Sheets

Related U.S. Application Data continuation of application No. 13/205,526, filed on Aug. 8, 2011, now Pat. No. 8,749,009.

(60) Provisional application No. 61/371,688, filed on Aug. 7, 2010, provisional application No. 61/446,926, filed on Feb. 25, 2011.

(51) Int. Cl.

| | | |
|---|---|---|
| *H01B 1/06* | (2006.01) | |
| *H01M 4/02* | (2006.01) | |
| *H05K 1/09* | (2006.01) | |
| *H01L 31/048* | (2014.01) | |
| *H01L 31/055* | (2014.01) | |
| *H01L 31/0216* | (2014.01) | |
| *H05K 1/02* | (2006.01) | |
| *H05K 1/11* | (2006.01) | |
| *H05K 1/03* | (2006.01) | |
| *H01L 31/05* | (2014.01) | |

(52) U.S. Cl.
CPC ............ *H01L 31/05* (2013.01); *H01L 31/055* (2013.01); *H05K 1/0274* (2013.01); *H05K 1/0313* (2013.01); *H05K 1/115* (2013.01); *H05K 2201/0302* (2013.01); *H05K 2201/0326* (2013.01); *H05K 2201/0364* (2013.01); *H05K 2201/10977* (2013.01); *Y02E 10/52* (2013.01); *Y02E 10/54* (2013.01); *Y02E 10/542* (2013.01)

(58) Field of Classification Search
CPC .... H05K 1/0313; H05K 1/0274; H05K 1/115; Y02E 10/50; Y02E 10/52; Y02E 10/54
USPC ......... 257/434, 436, 439, E31.117, E31.119, 257/E31.127, E21.449; 345/174; 136/243, 246, 251
See application file for complete search history.

(56) References Cited

U.S. PATENT DOCUMENTS

| | | | |
|---|---|---|---|
| 4,391,278 A | 7/1983 | Cahalan et al. | |
| 4,419,479 A | 12/1983 | Springer | |
| 4,604,427 A | 8/1986 | Roberts et al. | |
| 5,071,221 A | 12/1991 | Fujitani et al. | |
| 5,212,017 A | 5/1993 | Meder | |
| 5,368,894 A | 11/1994 | Lammers et al. | |
| 5,474,814 A | 12/1995 | Komatsu et al. | |
| 5,492,769 A | 2/1996 | Pryor et al. | |
| 5,656,222 A | 8/1997 | Berry et al. | |
| 5,878,153 A | 3/1999 | Mikulec et al. | |
| 5,879,740 A | 3/1999 | Miyazaki | |
| 5,879,741 A | 3/1999 | Itoh | |
| 6,156,550 A | 12/2000 | Glad | |
| 6,187,448 B1 | 2/2001 | Hanoka et al. | |
| 6,236,493 B1 | 5/2001 | Schmidt et al. | |
| 6,248,342 B1 | 6/2001 | Trogolo et al. | |
| 6,383,397 B1 | 5/2002 | Kojima | |
| 6,602,932 B2 | 8/2003 | Feldheim et al. | |
| 6,881,448 B1 | 4/2005 | Hattori | |
| 6,882,051 B2 | 4/2005 | Majumdar et al. | |
| 7,160,297 B2 | 1/2007 | Nesbitt | |
| 7,642,463 B2 | 1/2010 | Guiheen et al. | |
| 7,785,557 B2 | 8/2010 | Gruner et al. | |
| 7,842,432 B2 | 11/2010 | Niu et al. | |
| 7,849,424 B2 | 12/2010 | Wolk et al. | |
| 7,863,760 B2 | 1/2011 | Daniels et al. | |
| 7,960,027 B2 | 6/2011 | Guiheen et al. | |
| 7,963,760 B2* | 6/2011 | Cho ........................ | B29C 33/02 219/537 |
| 7,981,325 B2* | 7/2011 | Kosowsky ............. | B82Y 10/00 252/511 |
| 8,018,568 B2 | 9/2011 | Allemand et al. | |
| 8,049,333 B2 | 11/2011 | Alden et al. | |
| 8,094,247 B2 | 1/2012 | Allemand et al. | |
| 8,138,568 B2 | 3/2012 | Yoon et al. | |
| 8,174,667 B2 | 5/2012 | Allemand et al. | |
| 8,294,025 B2* | 10/2012 | Fonash ................... | B82Y 20/00 136/252 |
| 8,460,747 B2 | 6/2013 | Veerasamy | |
| 8,466,366 B2 | 6/2013 | Srinivas et al. | |
| 8,518,472 B2 | 8/2013 | Veerasamy | |
| 8,530,262 B2 | 9/2013 | Van Duren et al. | |
| 8,604,332 B2 | 12/2013 | Veerasamy | |
| 8,609,975 B2 | 12/2013 | Veerasamy | |
| 8,749,009 B2* | 6/2014 | Young ................ | H01L 31/0481 257/439 |
| 8,852,689 B2 | 10/2014 | Srinivas et al. | |
| 9,185,798 B2* | 11/2015 | Young ................ | H01L 31/0481 257/439 |
| 2002/0115747 A1 | 8/2002 | Feldheim et al. | |
| 2002/0119251 A1 | 8/2002 | Chen et al. | |
| 2002/0175408 A1 | 11/2002 | Majumdar et al. | |
| 2003/0129415 A1 | 7/2003 | Rasmussen et al. | |
| 2003/0157354 A1 | 8/2003 | Van Veghel et al. | |
| 2003/0203207 A1 | 10/2003 | Pessey et al. | |
| 2004/0095658 A1 | 5/2004 | Buretea et al. | |
| 2004/0166166 A1 | 8/2004 | Matsunami et al. | |
| 2004/0169151 A1 | 9/2004 | Yagi et al. | |
| 2005/0233504 A1 | 10/2005 | Doi et al. | |
| 2006/0038182 A1 | 2/2006 | Rogers et al. | |
| 2006/0068025 A1 | 3/2006 | Chang et al. | |
| 2006/0111008 A1 | 5/2006 | Arthur et al. | |
| 2006/0115536 A1 | 6/2006 | Yacaman et al. | |
| 2006/0194037 A1 | 8/2006 | Fink et al. | |
| 2006/0257637 A1 | 11/2006 | Pereira et al. | |
| 2006/0257638 A1 | 11/2006 | Glatkowski et al. | |
| 2007/0065651 A1* | 3/2007 | Glatkowski ............ | B82Y 30/00 428/297.4 |
| 2007/0074316 A1* | 3/2007 | Alden .................... | B82Y 30/00 257/784 |
| 2007/0093181 A1 | 4/2007 | Lugg et al. | |
| 2007/0104605 A1 | 5/2007 | Hampden-Smith et al. | |
| 2007/0153353 A1 | 7/2007 | Gruner | |
| 2007/0158611 A1 | 7/2007 | Oldenburg | |
| 2007/0196650 A1 | 8/2007 | Yamamoto et al. | |
| 2007/0264481 A1 | 11/2007 | DeSimone et al. | |
| 2007/0275230 A1 | 11/2007 | Murphy et al. | |
| 2007/0298253 A1 | 12/2007 | Hata et al. | |
| 2008/0143906 A1 | 6/2008 | Allemand et al. | |
| 2008/0152870 A1 | 6/2008 | Takada et al. | |
| 2008/0193634 A1 | 8/2008 | Yaniv et al. | |
| 2008/0259262 A1 | 10/2008 | Jones et al. | |
| 2008/0276987 A1* | 11/2008 | Flood ............... | H01L 31/035281 136/256 |
| 2009/0095341 A1 | 4/2009 | Pfenninger et al. | |
| 2009/0129004 A1* | 5/2009 | Gruner ............. | H01L 31/02246 361/679.21 |
| 2009/0165844 A1 | 7/2009 | Dutta | |
| 2009/0188697 A1 | 7/2009 | Guiheen et al. | |
| 2009/0229652 A1 | 9/2009 | Mapel et al. | |
| 2010/0012190 A1 | 1/2010 | Goto et al. | |
| 2010/0078624 A1* | 4/2010 | Moon ................... | B82Y 20/00 257/13 |
| 2010/0197068 A1 | 8/2010 | Poon et al. | |
| 2010/0230344 A1 | 9/2010 | Srinivas et al. | |
| 2010/0273060 A1 | 10/2010 | Yang et al. | |
| 2010/0297497 A1* | 11/2010 | Takahata ............... | H01M 4/64 429/209 |
| 2011/0139253 A1 | 6/2011 | Wachi et al. | |
| 2011/0162711 A1 | 7/2011 | Takeuchi et al. | |
| 2011/0217544 A1* | 9/2011 | Young ................... | B29C 37/0032 428/327 |
| 2011/0281070 A1 | 11/2011 | Mittal et al. | |
| 2012/0055013 A1 | 3/2012 | Finn | |
| 2012/0094090 A1 | 4/2012 | Yamazaki et al. | |
| 2012/0098419 A1 | 4/2012 | Chiba et al. | |
| 2012/0132930 A1 | 5/2012 | Young et al. | |
| 2012/0214056 A1* | 8/2012 | Gozdz ................... | H01M 4/485 429/189 |
| 2012/0273262 A1 | 11/2012 | Chu | |

(56) References Cited

U.S. PATENT DOCUMENTS

| | | |
|---|---|---|
| 2013/0000952 A1 | 1/2013 | Srinivas et al. |
| 2013/0014980 A1 | 1/2013 | Takeda et al. |
| 2013/0056244 A1 | 3/2013 | Srinivas et al. |
| 2013/0277625 A1 | 10/2013 | Srinivas et al. |
| 2013/0319729 A1 | 12/2013 | Poon |
| 2013/0341074 A1 | 12/2013 | Virkar et al. |
| 2014/0014171 A1 | 1/2014 | Alam et al. |

FOREIGN PATENT DOCUMENTS

| | | |
|---|---|---|
| JP | 08-157743 | 6/1996 |
| JP | 2007-530741 | 1/2007 |
| JP | 2007-039392 | 2/2007 |
| JP | 2007-229989 | 9/2007 |
| JP | 2008-200613 | 9/2008 |
| JP | 2008-288333 | 11/2008 |
| JP | 2009-063744 | 3/2009 |
| JP | 2009-512122 | 3/2009 |
| JP | 2009-526132 A | 7/2009 |
| JP | 2010-258020 | 11/2010 |
| KR | 10-1997-0701751 A | 4/1997 |
| KR | 10-2004-0012298 A | 2/2004 |
| KR | 10-0669237 B1 | 1/2007 |
| KR | 10201170541 | 6/2011 |
| WO | WO-01/18734 | 3/2001 |
| WO | WO-2004/069736 A2 | 8/2004 |
| WO | WO-2005/061598 A1 | 7/2005 |
| WO | WO-2005/089480 A2 | 9/2005 |
| WO | WO-2005/089480 A3 | 9/2005 |
| WO | WO-2005/116757 | 12/2005 |
| WO | WO-2006/030981 | 3/2006 |
| WO | WO-2007/003516 A2 | 1/2007 |
| WO | WO-2007/013871 | 2/2007 |
| WO | WO-2007/022226 | 2/2007 |
| WO | WO-2007/031446 | 3/2007 |
| WO | WO-2007/039227 A1 | 4/2007 |
| WO | WO-2007/095058 A2 | 8/2007 |
| WO | WO-2008/150867 A2 | 12/2008 |
| WO | WO-2008/150867 A3 | 12/2008 |
| WO | WO-2009/063744 | 5/2009 |
| WO | WO-2009/148131 | 12/2009 |
| WO | WO-2010/010838 | 1/2010 |
| WO | WO-2010/018734 | 2/2010 |
| WO | WO-2010/022353 A1 | 2/2010 |
| WO | WO-2010/030374 A2 | 3/2010 |
| WO | WO-2010/150619 A1 | 12/2010 |
| WO | WO-2011/106438 | 9/2011 |
| WO | WO-2011/106730 A2 | 9/2011 |
| WO | WO-2011/106730 A3 | 9/2011 |
| WO | WO-2012/021460 A2 | 2/2012 |
| WO | WO-2012/021460 A3 | 2/2012 |
| WO | WO-2012/021460 A9 | 2/2012 |

OTHER PUBLICATIONS

English Translation of Second Notice of Reasons for Rejection on Japanese Application No. 2011-524032 dated Aug. 26, 2013, 4 pages.
Examination Report received for AU Appln. No. 2011289620 dated Dec. 20, 2013.
Final Office Action for U.S. Appl. No. 13/035,888 dated Jul. 19, 2012.
Final Office Action received for U.S. Appl. No. 13/035,888 dated Nov. 5, 2013.
Final Office Action received for U.S. Appl. No. 13/205,526 dated Dec. 31, 2013.
First Office Action received on Chinese Application No. 200880100186.0 dated Sep. 14, 2011, 12 pages.
Hu et al. "Scalable coating and properties of transparent, flexible, silver nanowire electrodes." ACS Nano 4(5):2955-2963 (2010).
Int'l Search Report and Written Opinion received for PCT/US2011/046969 dated Feb. 20, 2012.
International Preliminary Report on Patentability on International Application No. PCT/US2008/065083 dated Sep. 17, 2009.
International Preliminary Report on Patentability on International Application No. PCT/US2009/054655 dated Oct. 3, 2011, 58 pages.
International Preliminary Report on Patentability received for PCT/US2011/046969 dated Feb. 21, 2013.
International Search Report and Written Opinion for Application No. PCT/US2008/065083 dated Dec. 16, 2008.
Lee, "Solution-Processed Metal Nanowire Mesh Transparent Electrodes," Nano Letters, (2008), vol. 8, No. 2, pp. 689-692.
Non-final Office Action received for U.S. Appl. No. 13/059,963 dated Jul. 31, 2013.
Notice of Acceptance for Australia Patent Application No. 2011289620, dated Feb. 3, 2014.
Notice of Allowance received for U.S. Appl. No. 13/205,526 dated Jan. 30, 2014.
Notice of Reasons for Rejection received for JP Appln. No. 2013-524152 dated Sep. 19, 2014.
Starostina, N., et al., "Part II: Sample Preparation for AFM Particle Characterization," Pacific Nanotechnology Inc., (2006).
WO2005/116757 is the English counterpart of JP 2007-530741.
US2008/0143906 is the English counterpart of CN 101427357.
US2008/0193634 is the English counterpart of CN 101589473.
WO2007/031446 is the English counterpart of JP 2009-512122.
US2007/0298253 is the English counterpart of WO2006/030981.
US2011/162711 is the English counterpart of WO2009/148131.

* cited by examiner

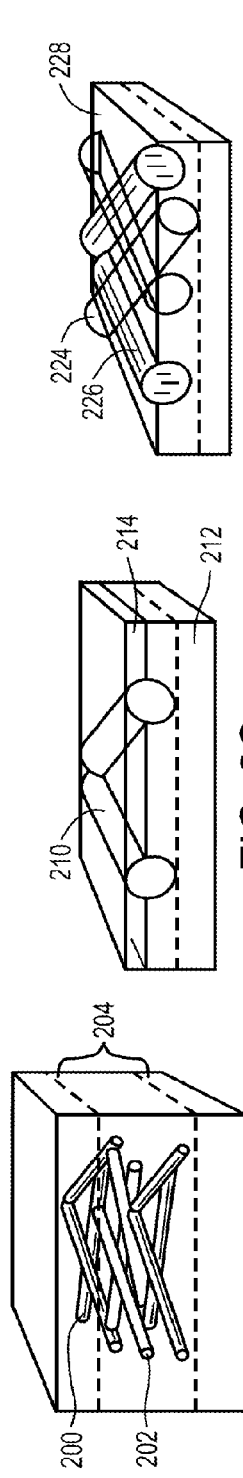
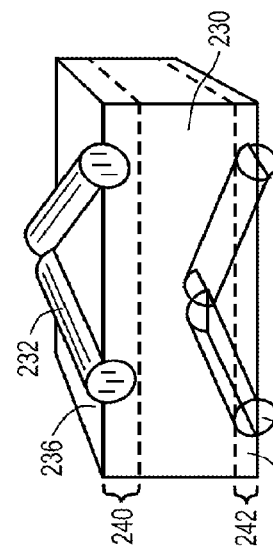
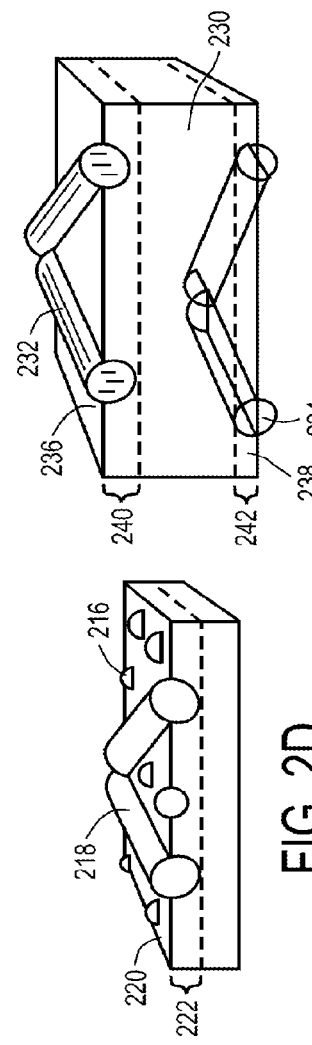
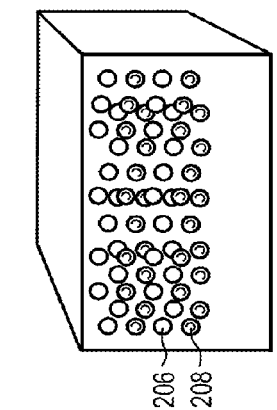
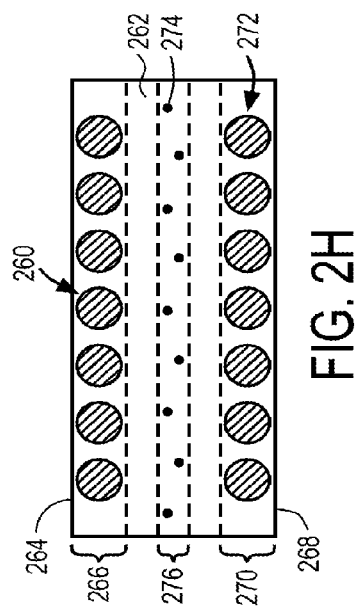
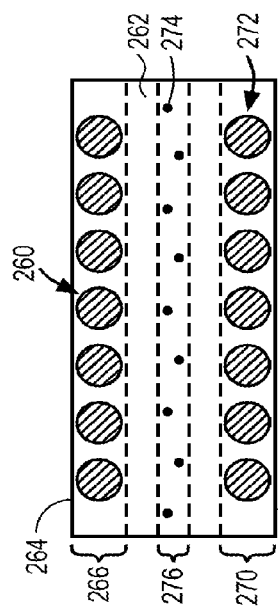
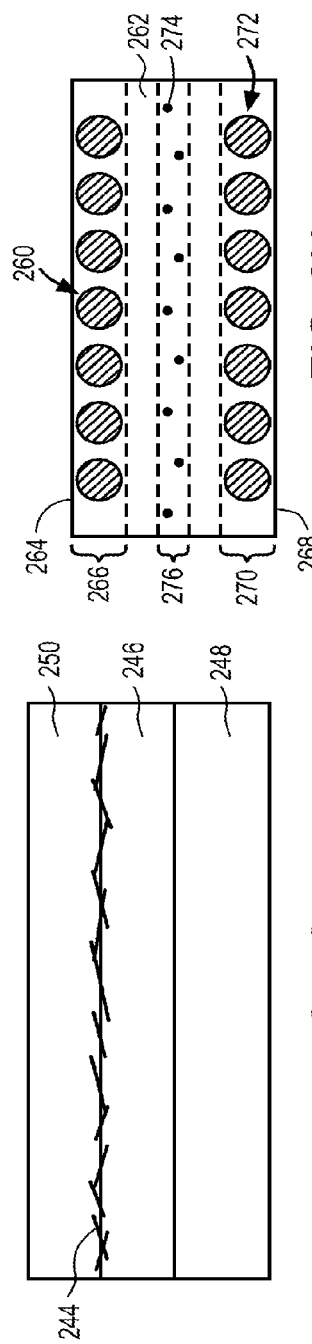
FIG. 2A  FIG. 2B  FIG. 2C  FIG. 2D  FIG. 2E  FIG. 2F  FIG. 2G  FIG. 2H

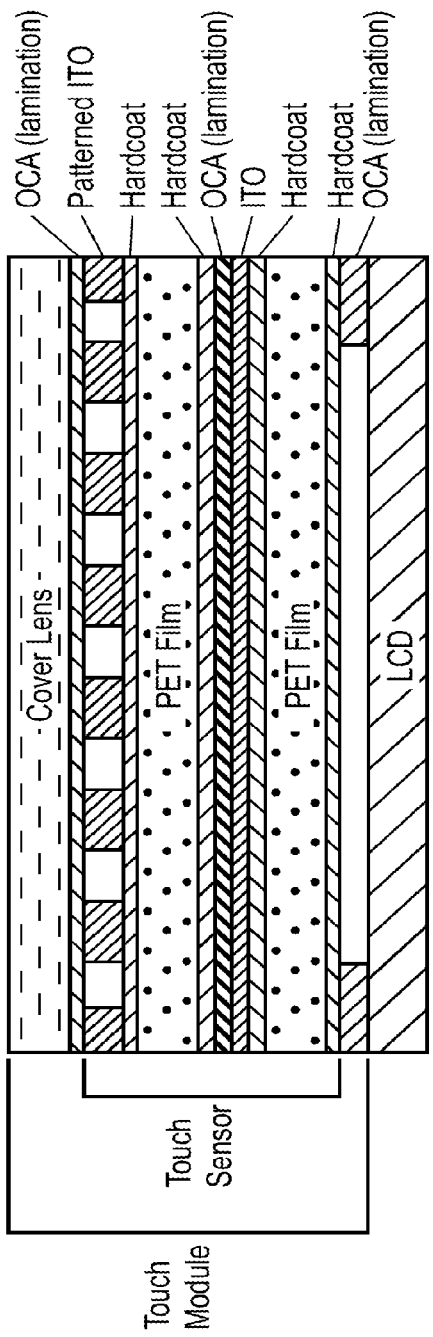
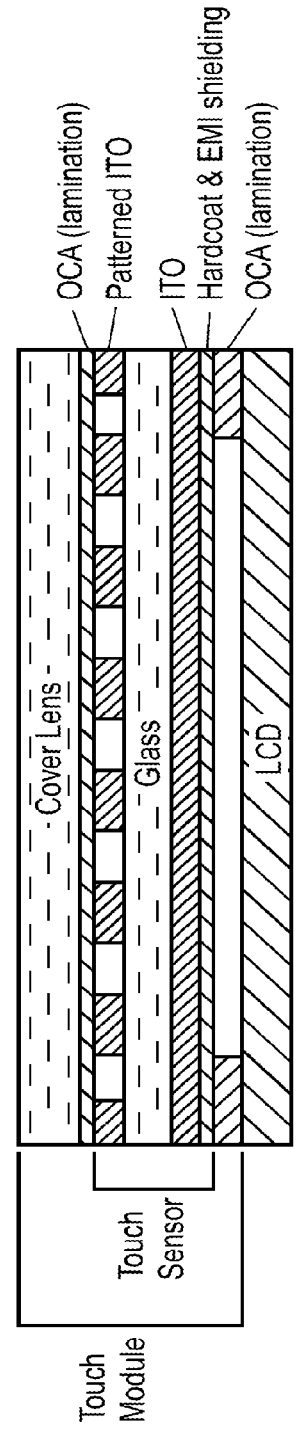

Touch-on-cover lens technology diagram

On-cell technology diagram (OLED)

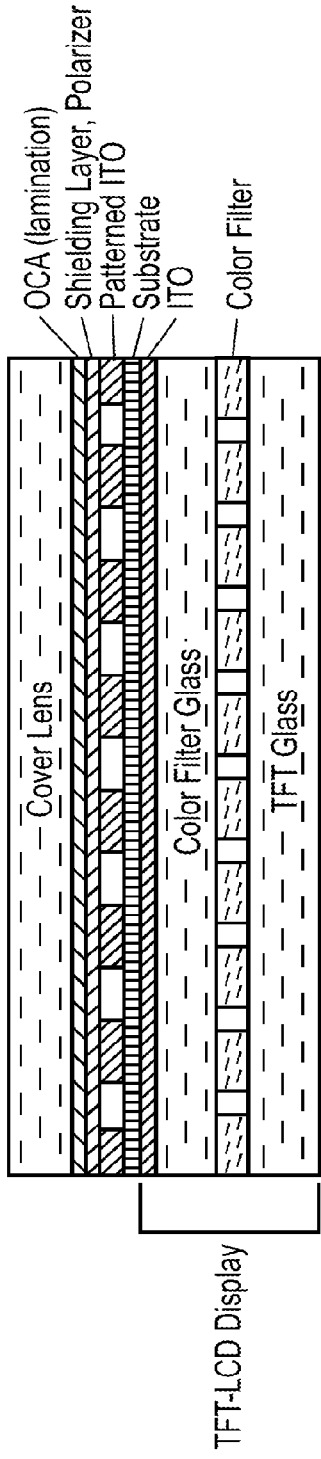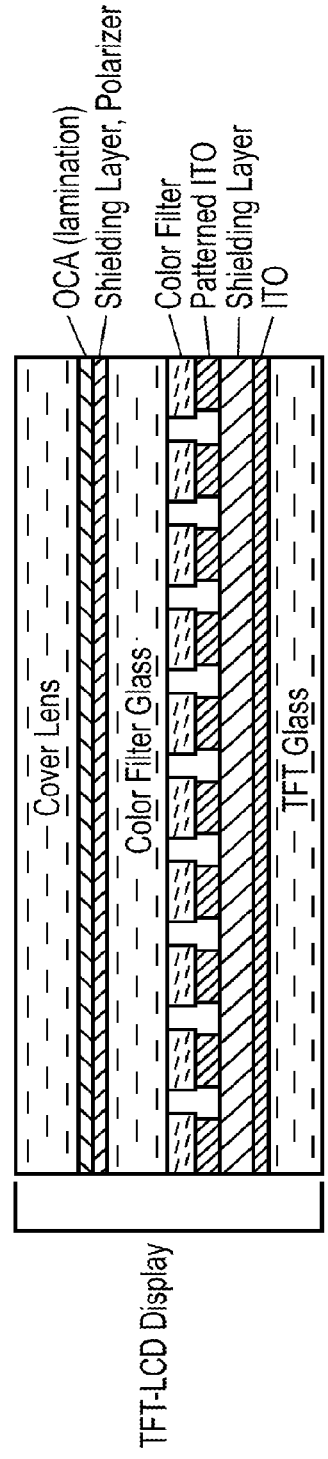
FIG. 12G
FIG. 12H

DEVICE COMPONENTS WITH SURFACE-EMBEDDED ADDITIVES AND RELATED MANUFACTURING METHODS

CROSS REFERENCE TO RELATED APPLICATIONS

This application is a continuation of U.S. patent application Ser. No. 14/299,938, filed on Jun. 9, 2014, which a continuation of U.S. patent application Ser. No. 13/205,526, filed on Aug. 8, 2011, now U.S. Pat. No. 8,749,009, issued on Jun. 10, 2014, which claims the benefit of U.S. Provisional Application No. 61/371,688, filed on Aug. 7, 2010, and U.S. Provisional Application No. 61/446,926, filed on Feb. 25, 2011, the disclosures of which are incorporated herein by reference in their entireties.

FIELD OF THE INVENTION

The invention relates generally to structures with embedded additives. More particularly, the invention relates to device components with surface-embedded additives to impart functionality such as electrical conductivity, thermal conductivity, spectral shifting, absorption enhancement, and color change.

BACKGROUND

Functionalizing structures by incorporation of active or functional particles is an area of interest to a number of fields. One conventional technique involves bulk incorporation, resulting in particles being dispersed throughout a bulk of a base material. Bulk incorporation suffers from various deficiencies, including non-uniform mixing and agglomeration of particles within a base material and adverse impact on the processability of the base material. Bulk incorporation is also inefficient if the goal is to expose particles at the surface, since a number of particles remain dispersed within an interior of the base material. Another conventional technique involves coating processes. Coating processes also suffer from various deficiencies, including non-uniform mixing and agglomeration of particles within a coating material, poor adhesion, delamination, and high roughness.

It is against this background that a need arose to develop the surface-embedded device components and related manufacturing methods described herein.

SUMMARY

Embodiments of the invention relate to active or functional additives that are embedded into embedding surfaces of host materials for use as components in a variety of electronic or optoelectronic devices, including solar devices, smart windows, displays, touch sensor panels, touch displays, and so forth.

Embodiments of surface-embedded device components provide improved performance, as well as cost benefits arising from their composition and manufacturing process. The device components can be manufactured by, for example, a surface embedding process in which additives are physically embedded into a host material, while preserving desired characteristics of the host material and imparting additional desired characteristics to the resulting surface-embedded device components, such as electrical conductivity and spectral shifting.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

For a better understanding of the nature and objects of some embodiments of the invention, reference should be made to the following detailed description taken in conjunction with the accompanying drawings.

FIG. 2A, FIG. 2B, FIG. 2C, FIG. 2D, FIG. 2E, FIG. 2F, FIG. 2G, and FIG. 2H illustrate additional surface-embedded device components implemented in accordance with embodiments of the invention.

FIG. 12A, FIG. 12B, FIG. 12C, FIG. 12D, FIG. 12E, FIG. 12F, FIG. 12G, and FIG. 12H are schematics of a number of electronic device architectures representing different types of touch sensors and displays according to an embodiment of the invention.

DETAILED DESCRIPTION

Definitions

Figure 1A:
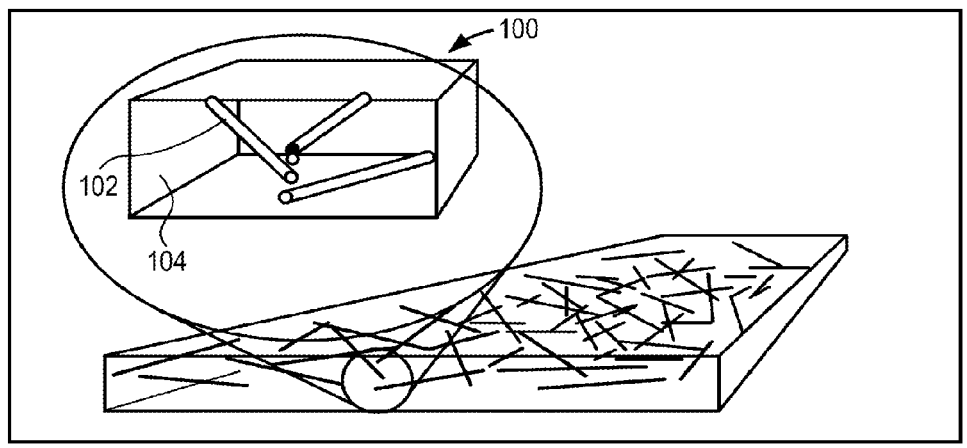
FIG. 1A illustrates a device component in which additives are mixed throughout a bulk of a device layer.

The following definitions apply to some of the aspects described with regard to some embodiments of the invention. These definitions may likewise be expanded upon herein.

As used herein, the singular terms "a," "an," and "the" include plural referents unless the context clearly dictates otherwise. Thus, for example, reference to an object can include multiple objects unless the context clearly dictates otherwise.

As used herein, the term "set" refers to a collection of one or more objects. Thus, for example, a set of objects can include a single object or multiple objects. Objects of a set can also be referred to as members of the set. Objects of a set can be the same or different. In some instances, objects of a set can share one or more common characteristics.

As used herein, the term "adjacent" refers to being near or adjoining Adjacent objects can be spaced apart from one another or can be in actual or direct contact with one another. In some instances, adjacent objects can be connected to one another or can be formed integrally with one another.

As used herein, the terms "connect," "connected," and "connection" refer to an operational coupling or linking Connected objects can be directly coupled to one another or can be indirectly coupled to one another, such as via another set of objects.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing methods described herein.

As used herein, the terms "optional" and "optionally" mean that the subsequently described event or circumstance may or may not occur and that the description includes instances where the event or circumstance occurs and instances in which it does not.

As used herein, relative terms, such as "inner," "interior," "outer," "exterior," "top," "bottom," "front," "rear," "back," "upper," "upwardly," "lower," "downwardly," "vertical," "vertically," "lateral," "laterally," "above," and "below," refer to an orientation of a set of objects with respect to one another, such as in accordance with the drawings, but do not require a particular orientation of those objects during manufacturing or use.

As used herein, the term "sub-nanometer range" or "sub-nm range" refers to a range of dimensions less than about 1 nanometer ("nm"), such as from about 0.1 nm to about 1 nm.

As used herein, the term "nanometer range" or "nm range" refers to a range of dimensions from about 1 nm to about 1 micrometer ("µm"). The nm range includes the "lower nm range," which refers to a range of dimensions from about 1 nm to about 10 nm, the "middle nm range," which refers to a range of dimensions from about 10 nm to about 100 nm, and the "upper nm range," which refers to a range of dimensions from about 100 nm to about 1 µm.

As used herein, the term "micrometer range" or "µm range" refers to a range of dimensions from about 1 µm to about 1 millimeter ("mm"). The µm range includes the "lower µm range," which refers to a range of dimensions from about 1 µm to about 10 µm, the "middle µm range," which refers to a range of dimensions from about 10 µm to about 100 µm, and the "upper µm range," which refers to a range of dimensions from about 100 µm to about 1 mm.

As used herein, the term "aspect ratio" refers to a ratio of a largest dimension or extent of an object and an average of remaining dimensions or extents of the object, where the remaining dimensions are orthogonal with respect to one another and with respect to the largest dimension. In some instances, remaining dimensions of an object can be substantially the same, and an average of the remaining dimensions can substantially correspond to either of the remaining dimensions. For example, an aspect ratio of a cylinder refers to a ratio of a length of the cylinder and a cross-sectional diameter of the cylinder. As another example, an aspect ratio of a spheroid refers to a ratio of a major axis of the spheroid and a minor axis of the spheroid.

As used herein, the term "sub-nano-sized additive" refers to an additive that has at least one dimension in the sub-nm range. A sub-nano-sized additive can have any of a wide variety of shapes, and can be formed of a wide variety of materials.

As used herein, the term "nano-sized additive" refers to an additive that has at least one dimension in the nm range. A nano-sized additive can have any of a wide variety of shapes, and can be formed of a wide variety of materials. Examples of nano-sized additives include nanowires, nanotubes, nanoplatelets, and nanoparticles.

As used herein, the term "nanowire" refers to an elongated, nano-sized additive that is substantially solid. Typically, a nanowire has a lateral dimension (e.g., a cross-sectional dimension in the form of a width, a diameter, or a width or diameter that represents an average across orthogonal directions) in the nm range, a longitudinal dimension (e.g., a length) in the µm range, and an aspect ratio that is about 3 or greater.

As used herein, the term "nanoplatelet" refers to a planar-like nano-sized additive that is substantially solid.

As used herein, the term "nanotube" refers to an elongated, hollow, nano-sized additive. Typically, a nanotube has a lateral dimension (e.g., a cross-sectional dimension in the form of a width, an outer diameter, or a width or outer diameter that represents an average across orthogonal directions) in the nm range, a longitudinal dimension (e.g., a length) in the µm range, and an aspect ratio that is about 3 or greater.

As used herein, the term "nanoparticle" refers to a spheroidal, nano-sized additive. Typically, each dimension (e.g., a cross-sectional dimension in the form of a width, a diameter, or a width or diameter that represents an average across orthogonal directions) of a nanoparticle is in the nm range, and the nanoparticle has an aspect ratio that is less than about 3, such as about 1.

As used herein, the term "micron-sized additive" refers to an additive that has at least one dimension in the µm range. Typically, each dimension of a micron-sized additive is in the µm range or beyond the µm range. A micron-sized additive can have any of a wide variety of shapes, and can be formed of a wide variety of materials. Examples of micron-sized additives include microwires, microtubes, and microparticles.

As used herein, the term "microwire" refers to an elongated, micron-sized additive that is substantially solid. Typically, a microwire has a lateral dimension (e.g., a cross-sectional dimension in the form of a width, a diameter, or a width or diameter that represents an average across orthogonal directions) in the µm range and an aspect ratio that is about 3 or greater.

As used herein, the term "microtube" refers to an elongated, hollow, micron-sized additive. Typically, a microtube has a lateral dimension (e.g., a cross-sectional dimension in the form of a width, an outer diameter, or a width or outer diameter that represents an average across orthogonal directions) in the µm range and an aspect ratio that is about 3 or greater.

As used herein, the term "microparticle" refers to a spheroidal, micron-sized additive. Typically, each dimension (e.g., a cross-sectional dimension in the form of a width, a diameter, or a width or diameter that represents an average across orthogonal directions) of a microparticle is in the µm range, and the microparticle has an aspect ratio that is less than about 3, such as about 1.

As used herein, the term "ultraviolet range" refers to a range of wavelengths from about 5 nm to about 400 nm.

As used herein, the term "visible range" refers to a range of wavelengths from about 400 nm to about 700 nm.

As used herein, the term "infrared range" refers to a range of wavelengths from about 700 nm to about 2 mm.

As used herein, the term "encapsulant" refers to a pottant or potting material, a front sheet, an interlayer, an optically clear adhesive (or OCA), and/or a back sheet material used for encapsulating or sealing an electronic device to be a barrier from the environment and/or as an optical bonding material. In some instances, an encapsulant can both serve as an encapsulating material and a front sheet. In some instances, an encapsulant may include one or more of the following materials: ethylene vinyl acetate (or EVA), polyvinyl butyral (or PVB), an ionomer, thermoplastic polyurethane (or TPU), thermoplastic polyolefin (or TPO), thermoplastic elastomer (or TPE), silicone, siloxane, any other polymer, diamond-like carbon thin films, sol-gel, sodium silicate, and encapsulants available as Teonex® PEN, Teflon®, Melinex® ST, Elvax® PV EVA, DuPont PV5200 Encapsulant, DuPont PV5300 Encapsulant, Dow Corning PV-6100 Encapsulant, 1-2577 Low VOC coating, 1-2620 Low VOC Coating, PV-6150 cell encapsulant, PV Potting agents, PV sealants, Dow Enlight polyolefin encapsulant films, STR EVA Photocap® A9918P/UF, STR Photocap 25539P thermoplastic encapsulant, STR Laminates, Solutia Vistasolar EVA, Etimex Solar GmbH encapsulants, Saflex PVB, Salfex PG41 thin gauge encapsulant, Cytec encapsulants, DuPont PV5400 ionomer encapsulant sheet, Ellsworth epoxy encapsulants, V-gool EVA encapsulant, Bixby Bix-Cure EVA, Saint-Gobain LightSwitch Frontsheet Complete, Saint-Gobain LightSwitch encapsulant, 3M 8171, 3M 8172, or any combination or variation of standard encapsulant, front sheet, or back sheet materials.

Device Components with Surface-Embedded Additives

The surface-embedded device components described herein differ from other possible approaches that seek to attain desired characteristics through incorporation of active or functional additives. Three other approaches are illustrated in FIG. 1A through FIG. 1C and are contrasted with improved surface-embedded device components illustrated and described with reference to FIG. 1D through FIG. 1I and FIG. 2A through FIG. 2H.

Figure 1B:
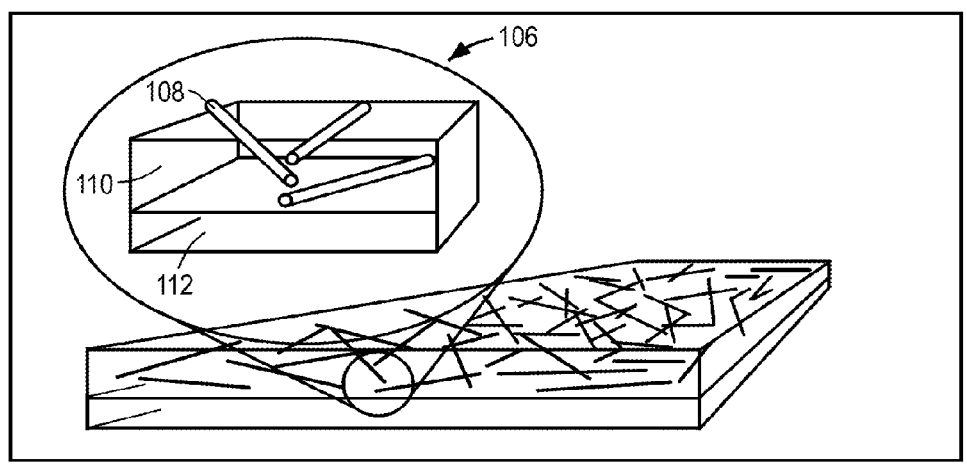
FIG. 1B illustrates a device component in which additives are mixed throughout one device layer that is on top of another device layer.
Figure 1C:
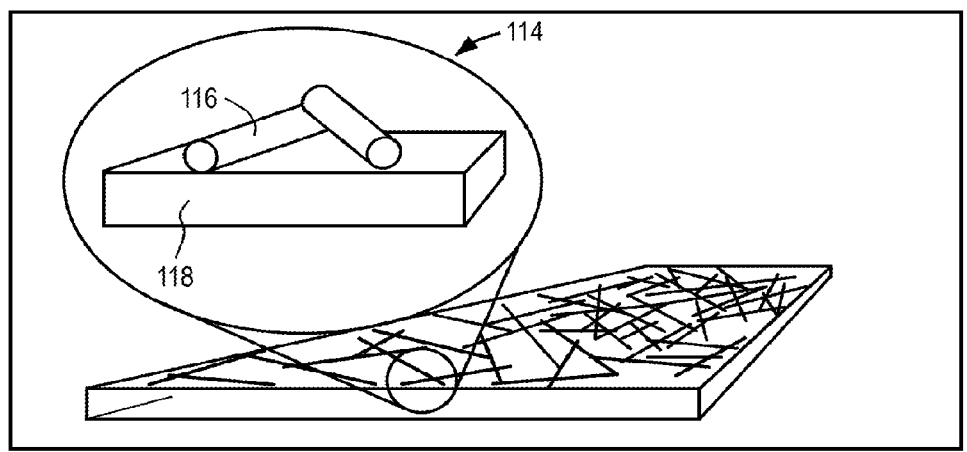
FIG. 1C illustrates a device component in which additives are superficially or surface-deposited on top of a device layer.

FIG. 1A illustrates a device component 100 in which additives 102 are mixed throughout a bulk of a device layer 104. FIG. 1B illustrates a device component 106 in which additives 108 are mixed throughout one device layer 110, which (along with the additives 108) is coated or otherwise disposed on top of another device layer 112. FIG. 1C illustrates a device component 114 in which additives 116 are superficially or surface-deposited on top of a device layer 118. A configuration such as depicted in FIG. 1C can have poor adhesion of the surface-deposited additives 116 to the device layer 118.

Figure 1D:
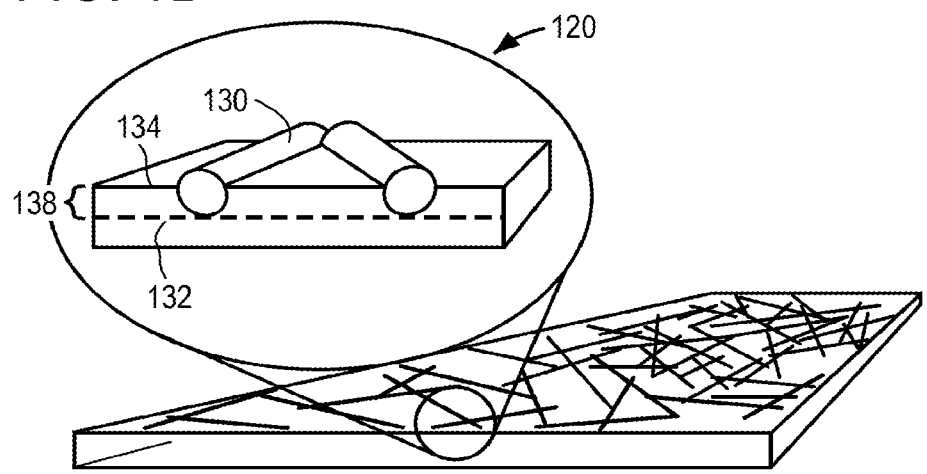
FIG. 1D, FIG. 1E, FIG. 1F, FIG. 1G, FIG. 1H, and FIG. 1I illustrate various surface-embedded device components implemented in accordance with embodiments of the invention.

In contrast, FIG. 1D through FIG. 1I illustrate various surface-embedded device components 120, 122, 124, 126, 128, and 170 implemented in accordance with embodiments of the invention. FIG. 1D is a schematic of surface-embedded additives 130 that are partially exposed and partially buried into a top, embedding surface 134 of a host material 132, which corresponds to a device layer or other component of an electronic or optoelectronic device. The embedding surface 134 also can be a bottom surface of the host material 132. As illustrated in FIG. 1D, the additives 130 are localized adjacent to the embedding surface 134 and within an embedding region 138 of the host material 132, with a remainder of the host material 132 largely devoid of the additives 130. In the illustrated embodiment, the embedding region 138 is relatively thin (e.g., having a thickness less than or much less than an overall thickness of the host material 132, or having a thickness comparable to a characteristic dimension of the additives 130), and, therefore, can be referred to as "planar" or "planar-like." Through proper selection of the host material 132, such as certain polymers or polymer-containing composite materials, the device component 120 can be transparent and flexible, as well as lightweight. However, other embodiments can be implemented in which the device component 120 need not be transparent or flexible. The device component 120 (as well as other surface-embedded structures described herein) can be much smoother than conventional structures. High smoothness (e.g., low roughness) can be desirable because roughness can lead to penetration into adjacent device layers, poor adhesion to adjacent device layers, delamination, and other undesirable effects.

Figure 1E:
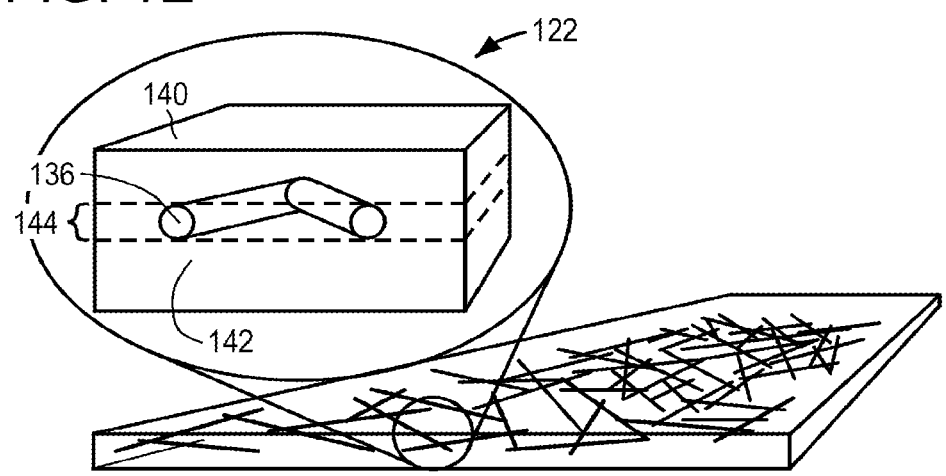

FIG. 1E is a schematic of surface-embedded additives 136 that are fully embedded into a top, embedding surface 140 of a host material 142, which corresponds to a device layer or other component of an electronic or optoelectronic device. The embedding surface 140 also can be a bottom surface of the host material 142. As illustrated in FIG. 1E, the additives 136 are localized adjacent to the embedding surface 140 and within an embedding region 144 of the host material 142, with a remainder of the host material 142 largely devoid of the additives 136. In the illustrated embodiment, the embedding region 144 is relatively thin (e.g., having a thickness less than or much less than an overall thickness of the host material 142, or having a thickness comparable to a characteristic dimension of the additives 136), and, therefore, can be referred to as "planar" or "planar-like." In such manner, the additives 136 can remain in a substantially planar configuration, despite being fully embedded underneath the embedding surface 140 by a certain relatively uniform distance. Through proper selection of the host material 142, such as certain polymers or polymer-containing composite materials, the device component 122 can be transparent and flexible, as well as lightweight. However, other embodiments can be implemented in which the device component 122 need not be transparent or flexible. FIG. 1I is a schematic similar to FIG. 1E, but with additives 172 fully embedded and close to (or just underneath) a top, embedding surface 176 of a host material 174.

Figure 1F:
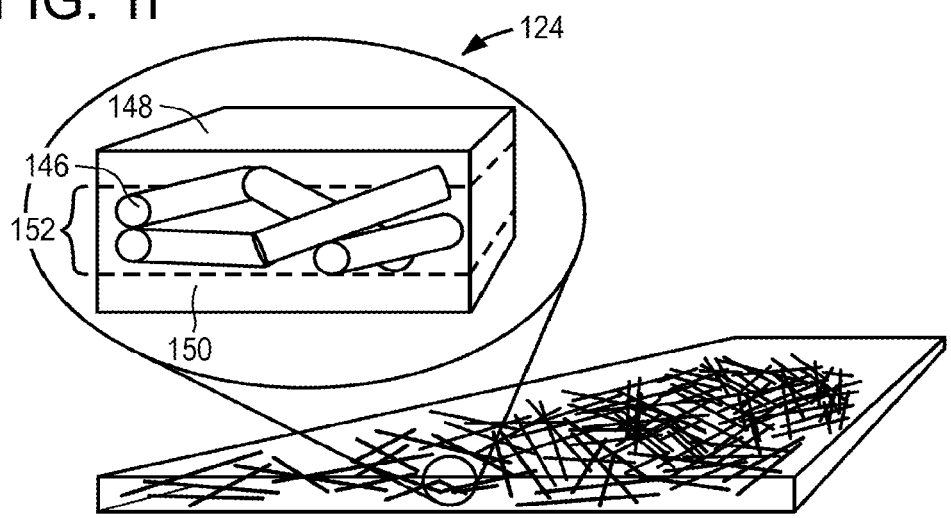

FIG. 1F is a schematic of surface-embedded additives 146 that are fully embedded into a top, embedding surface 148 of a host material 150, which corresponds to a device layer or other component of an electronic or optoelectronic device. The embedding surface 148 also can be a bottom surface of the host material 150. As illustrated in FIG. 1F, the additives 146 are localized adjacent to the embedding surface 148 and within an embedding region 152 of the host material 150, with a remainder of the host material 150 largely devoid of the additives 146. In the illustrated embodiment, a thickness of the embedding region 152 is greater than a characteristic dimension of the additives 146 (e.g., a cross-sectional diameter of an individual one of the additives 146 or an average cross-sectional diameter across the additives 146), but still less than (or much less than) an overall thickness of the host material 150. The additives 146 can be distributed or arranged within the embedding region 152 as multiple layers, with the additives 146 of a particular layer remaining in a substantially planar configuration, despite being fully embedded underneath the embedding surface 148. Note that, although not illustrated in FIG. 1F, another implementation would be similar to FIG. 1F, but with the additives 146 partially exposed at the embedding surface 148 of the host material 150.

Figure 1G:
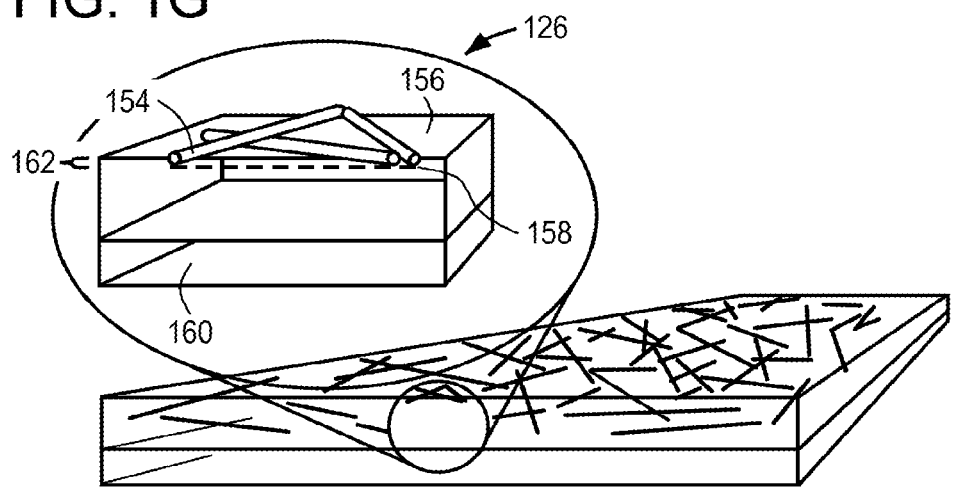

FIG. 1G is a schematic of surface-embedded additives 154 that are partially exposed and partially buried into a top, embedding surface 156 of a host material 158, which corresponds to one device layer that is coated or otherwise disposed on top of another device layer 160. The host material 158 can be implemented as a coating or other secondary material, such as a slurry or a paste, that is disposed on top of the device layer 160 serving as a substrate. As illustrated in FIG. 1G, the additives 154 are localized adjacent to the embedding surface 156 and within an embedding region 162 of the host material 158, with a remainder of the host material 158 largely devoid of the additives 154. It is also contemplated that the additives 154 can be distributed throughout a larger volume fraction within the host material 158, such as in the case of a relatively thin coating having a thickness comparable to a characteristic dimension of the additives 154. In the illustrated embodiment, the embedding region 162 is relatively thin, and, therefore, can be referred to as "planar" or "planar-like." Note that, although not illustrated in FIG. 1G, another implementation would be similar to FIG. 1G, but with the additives 154 fully embedded below the embedding surface 156 of the host material 158.

Figure 1H:
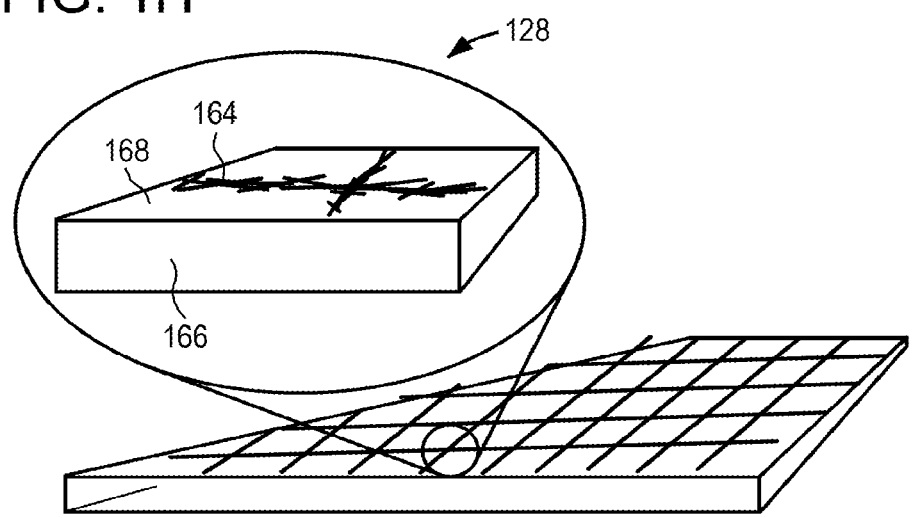
Figure 1I:
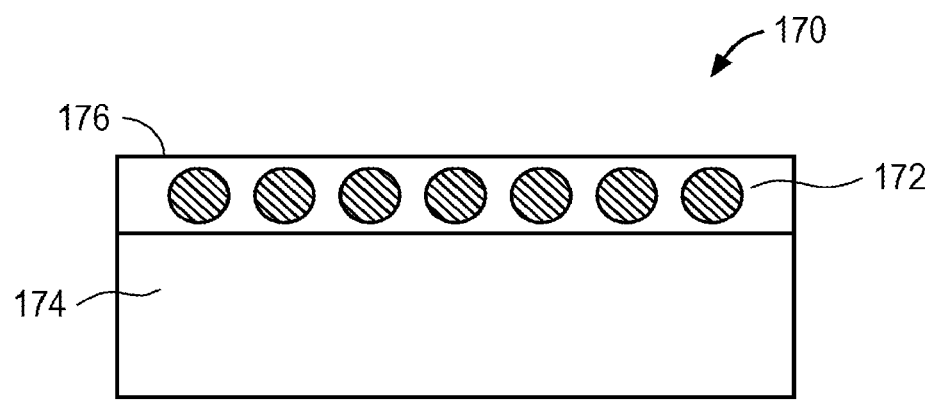

FIG. 1H is a schematic of surface-embedded additives 164 that are localized across a host material 166 so as to form an ordered pattern. The additives 164 can be partially embedded into a top, embedding surface 168 and localized within an embedding region of the host material 166 (e.g., similar to FIG. 1D and FIG. 1G), fully embedded below the embedding surface 168 (e.g., similar to FIG. 1E, FIG. 1I, and FIG. 1F), or a combination thereof, but the additives 164 are not located uniformly across the host material 166 but rather are patterned. Note that, although a grid pattern is illustrated in FIG. 1H, patterns, in general, can include aperiodic (or non-periodic, random) patterns as well as periodic patterns, such as diamond patterns, square patterns, rectangular patterns, triangular patterns, various polygonal patterns, wavy patterns, angular patterns, interconnect patterns (e.g., in the form circuitry in electronic or optoelectronic devices), or any combination thereof. FIG. 1H illustrates that, although the formation of a pattern occurs, a zoomed up view of a "line" section of the pattern reveals that the configuration of the individual "line" section includes surface-embedded additives similar to any, or a combination, of the configurations illustrated in FIG. 1D through FIG. 1G, FIG. 1I, and FIG. 2 below. To provide desired characteristics such as electrical conductivity, thermal conductivity, and absorption enhancement, the additives 164 (as well as the additives illustrated in FIG. 1D through FIG. 1G, FIG. 1I, and FIG. 2 below) can include metallic nanowires, such as silver (or Ag) nanowires, copper (or Cu) nanowires, or a combination thereof, with a longitudinal dimension that is, on average, shorter than a characteristic length of the pattern (e.g., a length of an individual "line" section), a longitudinal dimension that is, on average, longer than a characteristic width of the pattern (e.g., a width of an individual "line" section), or both. Other types of additives and other combinations of additives also can be used in place of, or in combination with, metallic nanowires, such as nanoparticles including silver nanoparticles or other metallic nanoparticles. In some embodiments, the additives 164 can be sintered or otherwise fused to form solid lines, which can serve as interconnects or interconnection grids for use in devices such as solar devices, touch sensors, and smart windows. Such embodiments provide a number of advantages over conventional approaches, including enhanced durability and allowing the omission of a coating or other binding material that can be prone to delamination and that can inhibit conductivity or increase resistance.

Other configurations of surface-embedded device components are illustrated in FIG. 2A through FIG. 2H. Certain aspects of the surface-embedded device components illustrated in FIG. 2A through FIG. 2H can be implemented in a similar fashion as illustrated and described above in FIG. 1D through FIG. 1I, and those aspects are not repeated below.

FIG. 2A is a schematic of surface-embedded additives that include at least two different types of additives 200 and 202 in the form of different types of nanowires, different types of nanotubes, or a combination thereof. In general, the additives 200 and 202 can differ, for example, in terms of their dimensions, shapes, material composition, or a combination thereof. As illustrated in FIG. 2A, the additives 200 and 202 are localized within an embedding region 204 in a particular arrangement, such as in a layered arrangement. Each layer can primarily include a respective, different type of additive, although additives of different types also can cross between layers. Such a layered arrangement of the additives 200 and 202 also can be described in terms of different embedding regions, with each different type of additive being localized within a respective embedding region. Although the additives 200 and 202 are illustrated as fully embedded, it is contemplated that at least some of the additives 200 and 202 can be partially embedded and surface-exposed. FIG. 2B is a schematic similar to FIG. 2A, but with at least two different types of additives 206 and 208 in the form of different types of nanoparticles. It is also contemplated that nanoparticles can be included in combination with either, or both, nanowires and nanotubes. It is further contemplated that other embodiments described herein in terms of a particular type of additive can be implemented with different types of additives. Although the additives 206 and 208 are illustrated as fully embedded, it is contemplated that at least some of the additives 206 and 208 can be partially embedded and surface-exposed.

FIG. 2C is a schematic of surface-embedded additives 210 that are partially embedded into a host material 212, which corresponds to one device layer, and where another device layer 214 implemented as a coating fills in around the additives 210, either fully covering the additives 210 or leaving them partially exposed as illustrated in FIG. 2C. The device layer 214 can have the same or a similar composition as the host material 212 (or other host materials described herein), or can have a different composition to provide additional or modified functionality, such as when implemented using an electrically conductive material or semiconductor (e.g., indium tin oxide ("ITO"), $ZnO(i)$, $ZnO:Al$, $ZnO:B$, $SnO_2:F$, $Cd_2SnO_4$, $CdS$, $ZnS$, another doped metal oxide, an electrically conductive or semiconducting polymer, a fullerene-based coating, such as carbon nanotube-based coating, or another electrically conductive material that is transparent) to serve as a buffer layer to adjust a work function in the context of solar devices or to provide a conductive path for the flow of an electric current, in place of, or in combination with, a conductive path provided by the surface-embedded additives 210. In the case of ITO, for example, the presence of the surface-embedded additives 210 can provide cost savings by allowing a reduced amount of ITO to be used and, therefore, a reduced thickness of the device layer 214 (relative to the absence of the additives 210), such as a thickness less than about 100 nm, no greater than about 75 nm, no greater than about 50 nm, no greater than about 40 nm, no greater than about 30 nm, no greater than about 20 nm, or no greater than about 10 nm, and down to about 5 nm or less. Additionally, the presence of the surface-embedded additives 210 can allow for solution deposition of ITO (instead of sputtering) with a low temperature cure. The resulting, relatively low conductivity ITO layer can still satisfy work function matching, while the additives 210 can mitigate the reduced conductivity exhibited by solution-deposited ITO without high temperature cure. It is contemplated that the additives 210 can be arranged in a pattern (e.g., a grid pattern or any other pattern such as noted above for FIG. 1H), and the device layer 214 can be formed with a substantially matching pattern (e.g., a matching grid pattern or any other matching pattern such as noted above for FIG. 1H) so as to either fully cover the additives 210 or leaving them partially exposed. Alternatively, or in conjunction, a network of the additives 210 can be supplemented by a regular conductive grid that is deposited or otherwise applied.

The surface-embedded device component illustrated in FIG. 2C can also be useful, for example, as a touch sensor panel, a touch sensor, or a touch display, where the additives 210 can form a projected capacitive touch sensor, a capacitive touch sensor, a resistive touch sensor, or a combination thereof. In certain embodiments, the host material 212 is, for example, an optically clear adhesive (or OCA). In certain embodiments, the additives 210 can serve as a transparent conducting electrode that is patterned, unpatterned, or a combination thereof. Such implementations help to, inter alia, reduce the number of layers included in a touch sensor.

FIG. 2D is a schematic similar to FIG. 1D, but with nanoparticles 216 surface-embedded in combination with nanowires 218 (or other high aspect ratio additives) and localized within a "planar" or "planar-like" embedding region 222. Although not illustrated, either, or both, of the nanoparticles 216 and the nanowires 218 can be fully below a top, embedding surface 220 (e.g., similar to the configuration illustrated in FIG. 1E, FIG. 1F, or FIG. 1I).

FIG. 2E is a schematic similar to FIG. 1D, but with at least two different types of additives 224 and 226 in the form of different types of nanowires, different types of nanotubes, or a combination of nanowires and nanotubes. Although not illustrated, either, or both, of the different types of additives 224 and 226 can be fully below a top, embedding surface 228 (e.g., similar to the configuration illustrated in FIG. 1E, FIG. 1F, or FIG. 1I).

FIG. 2F is a schematic of a host material 230, where the host material 230 is embedded with additives on either side of the host material 230. In particular, additives 232 are at least partially embedded into a top, embedding surface 236 of the host material 230 and localized adjacent to the top, embedding surface 236 and within an embedding region 240 of the host material 230, while additives 234 are at least partially embedded into a bottom, embedding surface 238 of the host material 230 and localized adjacent to the bottom, embedding surface 238 and within an embedding region 242 of the host material 230. It is contemplated that, for any particular side of the host material 230, the extent of embedding of additives in the host material 230 or the inclusion of different types of additives can be implemented in a similar fashion as described above and subsequently below. Although the additives 232 and 234 are illustrated as partially embedded into the host material 230, it is contemplated that at least some of the additives 232 and 234 can be fully embedded into the host material 230. It is further contemplated that additives can be embedded into additional surfaces of the host material 230, such as any one or more of the edges or lateral surfaces of the host material 230.

The surface-embedded device component illustrated in FIG. 2F can be useful, for example, as an encapsulant layer of a solar device, where the additives 232 face incident sunlight and perform spectral shifting to match a bandgap energy of a photoactive layer of the solar device, and the additives 234 serve as an electrode or current collector and include electrically conductive materials, such as carbon, a metal, a metal oxide, carbon black, graphene, or a combination thereof, in the form of nanoparticles, microparticles, nanowires, microwires, nanotube, microtubes, or other forms or a combination of such forms. The surface-embedded device component illustrated in FIG. 2F also can be useful, for example, as an encapsulant layer or other device layer where it is desirable to space apart the additives 232 and 234, such as in the case of incompatible phosphors.

The surface-embedded device component illustrated in FIG. 2F can also be useful, for example, as a touch sensor panel, a touch sensor, or a touch display, where the additives 232 and 234 can interact to form a projected capacitive touch sensor, a capacitive touch sensor, a resistive touch sensor, or a combination thereof. In certain embodiments, the host material 230 is, for example, an optically clear adhesive (or OCA). In certain embodiments, the additives 232 and 234 can serve as transparent conducting electrodes that are patterned, unpatterned, or a combination thereof. Such implementations help to, inter alia, reduce the number of layers included in a touch sensor.

FIG. 2G is a schematic similar to FIG. 2C, but with surface-embedded additives 244 that are partially embedded into a host material 246, which corresponds to a device layer implemented as a coating disposed on top of another device layer 248, and where another device layer 250 implemented as a coating fills in at least one layer around the additives 244 and is electrically connected to the additives 244, either leaving them partially exposed or fully covering the additives 244 as illustrated in FIG. 2G. By fully covering the additives 244, the resulting surface of the device layer 250 is quite smooth (e.g., having a smoothness or a roughness substantially comparable to that of an inherent smoothness or roughness of the device layer 250 in the absence of the additives 244). The device layer 250 can have the same or a similar composition as the host material 246 (or other host materials described herein), or can have a different composition to provide additional or modified functionality, such as when implemented using an electrically conductive material or semiconductor (e.g., ITO, ZnO(i), ZnO:Al, ZnO:B, $SnO_2$:F, $Cd_2SnO_4$, CdS, ZnS, another doped metal oxide, an electrically conductive or semiconducting polymer, a fullerene-based coating, such as carbon nanotube-based coating, or another electrically conductive material that is transparent) to serve as a buffer layer to adjust a work function in the context of solar devices or to provide a conductive path for the flow of an electric current, in place of, or in combination with, a conductive path provided by the surface-embedded additives 244. In the case of ITO, for example, the presence of the surface-embedded additives 244 can provide cost savings by allowing a reduced amount of ITO to be used and, therefore, a reduced thickness of the device layer 250 (relative to the absence of the additives 244), such as a thickness less than about 100 nm, no greater than about 75 nm, no greater than about 50 nm, no greater than about 40 nm, no greater than about 30 nm, no greater than about 20 nm, or no greater than about 10 nm, and down to about 5 nm or less. Additionally, the presence of the surface-embedded additives 244 can allow for solution deposition of ITO (instead of sputtering) with a low temperature cure. The resulting, relatively low conductivity ITO layer can still satisfy work function matching, while the additives 244 can mitigate the reduced conductivity exhibited by solution-deposited ITO without high temperature cure. It is contemplated that the additives 244 can be arranged in a pattern (e.g., a grid pattern or any other pattern such as noted above for FIG. 1H), and the device layer 250 can be formed with a substantially matching pattern (e.g., a matching grid pattern or any other matching pattern such as noted above for FIG. 1H) so as to either fully cover the additives 244 or leaving them partially exposed. Alternatively, or in conjunction, a network of the additives 244 can be supplemented by a regular conductive grid that is deposited or otherwise applied.

FIG. 2H is a schematic similar to FIG. 2F, with additives 260 that are at least partially embedded into a top, embedding surface 264 of a host material 262 and localized adjacent to the top, embedding surface 264 and within an embedding region 266 of the host material 262, and with additives 272 that are at least partially embedded into a bottom, embedding surface 268 of the host material 262 and localized adjacent to the bottom, embedding surface 268 and within an embedding region 270 of the host material 262. Although the additives 260 and 272 are illustrated as fully embedded into the host material 262, it is contemplated that at least some of the additives 260 and 272 can be partially embedded and surface-exposed. In the illustrated embodiment, the host material 262 is also embedded with additives 274 disposed between the additives 260 and 272 and localized within an embedding region 276 of an interior of the host material 262. The surface-embedded device component illustrated in FIG. 2H can be useful, for example, for a smart window, where the additives 260 and 272 serve as a pair of electrodes, and the additives 274 provide a color or shade change functionality.

One aspect of certain surface-embedded device components described herein is the provision of a vertical additive concentration gradient in a host material, namely a gradient along a thickness direction of the host material. Bulk incorporation (e.g., as illustrated in FIG. 1A) aims to provide an uniform vertical additive concentration gradient throughout a host material, although agglomeration and other effects may prevent such uniform gradient to be achieved in practice. For a conventional coating implementation (e.g., as illustrated in FIG. 1B), a vertical additive concentration gradient can exist as between a coating and an underlying substrate; however, and similar to bulk incorporation, a conventional coating implementation aims to provide an uniform vertical additive concentration gradient throughout the coating. In contrast, the surface-embedded device components described herein allow for variable, controllable vertical additive concentration gradient, in accordance with a localization of additives within an embedding region of a host material. For certain implementations, the extent of localization of additives within an embedding region is such that at least a majority (by weight, volume, or number density) of the additives are included within the embedding region, such as at least about 60% (by weight, volume, or number density) of the additives are so included, at least about 70% (by weight, volume, or number density) of the additives are so included, at least about 80% (by weight, volume, or number density) of the additives are so included, at least about 90% (by weight, volume, or number density) of the additives are so included, or at least about 95% (by weight, volume, or number density) of the additives are so included. For example, substantially all of the additives can be localized within the embedding region, such that a remainder of the host material is substantially devoid of the additives. For certain applications and certain device components, it is also contemplated that bulk incorporation or a conventional coating implementation can be used in place of, or in combination with, localization of additives within an embedding region.

In general, additives can include an electrically conductive material, a semiconductor, a phosphor, a multichromic material, another type of material, or a combination thereof, which can be in the form of nano-sized additives, micron-sized additives, as well as additives sized in the sub-nm range. Additives also can be in the form of colloids and atomic or molecular species, such as dissolved atomic or molecular species. For example, at least one additive can have a cross-sectional dimension (or a population of additives can have an average cross-sectional dimension) in the range of about 0.1 nm to about 1 mm. In some embodiments, the cross-sectional dimension (or the average cross-sectional dimension) is in the range of about 1 nm to about 100 nm, about 1 nm to about 20 nm, about 20 nm to about 100 nm, about 1 nm to about 50 microns, about 100 nm to about 1 micron, about 1 nm to about 100 microns, or about 500 nm to about 50 microns. In some embodiments, substantially all additives have a cross-sectional dimension in the range of about 0.1 nm to about 1 mm or about 0.1 nm to about 100 microns.

In cases where it is desirable to impart electrical conductivity, additives can include an electrically conductive material, a semiconductor, or a combination thereof. Examples of electrically conductive materials include metals (e.g., silver, copper, and gold), metal alloys, silver nanowires, copper nanowires, gold nanowires, carbon-based conductors (e.g., carbon nanotubes, graphene, and buckyballs), metal oxides and chalcogenides that are optionally doped (e.g., ITO, ZnO(i), ZnO:Al, ZnO:B, $SnO_2$:F, $Cd_2SnO_4$, CdS, ZnS, and other doped metal oxides), electrically conductive polymers, and any combination thereof. Examples of semiconductor materials include semiconducting polymers, Group IVB elements (e.g., carbon (or C), silicon (or Si), and germanium (or Ge)), Group IVB-IVB binary alloys (e.g., silicon carbide (or SiC) and silicon germanium (or SiGe)), Group IIB-VIB binary alloys (e.g., cadmium selenide (or CdSe), cadmium sulfide (or CdS), cadmium telluride (or CdTe), zinc oxide (or ZnO), zinc selenide (or ZnSe), zinc telluride (or ZnTe), and zinc sulfide (or ZnS)), Group IIB-VIB ternary alloys (e.g., cadmium zinc telluride (or CdZnTe), mercury cadmium telluride (or HgCdTe), mercury zinc telluride (or HgZnTe), and mercury zinc selenide (or HgZnSe)), Group IIIB-VB binary alloys (e.g., aluminum antimonide (or AlSb), aluminum arsenide (or AlAs), aluminium nitride (or AlN), aluminium phosphide (or AlP), boron nitride (or BN), boron phosphide (or BP), boron arsenide (or BAs), gallium antimonide (or GaSb), gallium arsenide (or GaAs), gallium nitride (or GaN), gallium phosphide (or GaP), indium antimonide (or InSb), indium arsenide (or InAs), indium nitride (or InN), and indium phosphide (or InP)), Group IIIB-VB ternary alloys (e.g., aluminium gallium arsenide (or AlGaAs or $Al_xGa_{1-x}As$), indium gallium arsenide (or InGaAs or $In_xGa_{1-x}As$), indium gallium phosphide (or InGaP), aluminium indium arsenide (or AlInAs), aluminium indium antimonide (or AlInSb), gallium arsenide nitride (or GaAsN), gallium arsenide phosphide (or GaAsP), aluminium gallium nitride (or AlGaN), aluminium gallium phosphide (or AlGaP), indium gallium nitride (or InGaN), indium arsenide antimonide (or InAsSb), and indium gallium antimonide (or InGaSb)), Group IIIB-VB quaternary alloys (e.g., aluminium gallium indium phosphide (or AlGaInP), aluminium gallium arsenide phosphide (or AlGaAsP), indium gallium arsenide phosphide (or InGaAsP), aluminium indium arsenide phosphide (or AlInAsP), aluminium gallium arsenide nitride (or AlGaAsN), indium gallium arsenide nitride (or InGaAsN), indium aluminium arsenide nitride (or InAlAsN), and gallium arsenide antimonide nitride (or GaAsSbN)), and Group IIIB-VB quinary alloys (e.g., gallium indium nitride arsenide antimonide (or GaInNAsSb) and gallium indium arsenide antimonide phosphide (or GaInAsSbP)), Group IB-VIIB binary alloys (e.g., cupruous chloride (or CuCl)), Group IVB-VIB binary alloys (e.g., lead selenide (or PbSe), lead sulfide (or PbS), lead telluride (or PbTe), tin sulfide (or SnS), and tin telluride (or SnTe)), Group IVB-VIB ternary alloys (e.g., lead tin telluride (or PbSnTe), thallium tin telluride (or $Tl_2SnTe_5$), and thallium germanium telluride (or $Tl_2GeTe_5$)), Group VB-VIB binary alloys (e.g., bismith telluride (or $Bi_2Te_3$)), Group IIB-VB binary alloys (e.g., cadmium phosphide (or $Cd_3P_2$), cadmium arsenide (or $Cd_3As_2$), cadmium antimonide (or $Cd_3Sb_2$), zinc phosphide (or $Zn_3P_2$), zinc arsenide (or $Zn_3As_2$), and zinc antimonide (or $Zn_3Sb_2$)), and other binary, ternary, quaternary, or higher order alloys of Group IB (or Group 11) elements, Group IIB (or Group 12) elements, Group IIIB (or Group 13) elements, Group IVB (or Group 14) elements, Group VB (or Group 15) elements, Group VIB (or Group 16) elements, and Group VIIB (or Group 17) elements, such as copper indium gallium selenide (or CIGS), as well as any combination thereof.

Additives can include, for example, nanoparticles, nanowires, nanotubes (e.g., multi-walled nanotubes ("MWNT5"), single-walled nanotubes ("SWNTs"), double-walled nanotubes ("DWNT5"), graphitized or modified nanotubes), fullerenes, buckyballs, graphene, microparticles, microwires, microtubes, core-shell nanoparticles or microparticles, core-multishell nanoparticles or microparticles, core-shell nanowires, and other additives having shapes that are substantially tubular, cubic, spherical, or pyramidal, and characterized as amorphous, crystalline, tetragonal, hexagonal, trigonal, orthorhombic, monoclinic, or triclinic, or any combination thereof.

Examples of core-shell nanoparticles and core-shell nanowires include those with a ferromagnetic core (e.g., iron, cobalt, nickel, manganese, as well as their oxides and alloys formed with one or more of these elements), with a shell formed of a metal, a metal alloy, a metal oxide, carbon, or any combination thereof (e.g., silver, copper, gold, platinum, ZnO, ZnO(i), ZnO:Al, ZnO:B, $SnO_2$:F, $Cd_2SnO_4$, CdS, ZnS, $TiO_2$, ITO, graphene, and other materials listed as suitable additives herein). A particular example of a core-shell nanowire is one with a silver core and an Au shell (or a platinum shell or another type of shell) surrounding the silver core to reduce or prevent oxidation of the silver core. Another example of a core-shell nanowire is one with a silver core (or a core formed of another metal or other electrically conductive material), with a shell or other coating formed of one or more of the following: (a) conducting polymers, such as poly(3,4-ethylenedioxythiophene) (or PEDOT) and polyaniline (or PANI); (b) conducting oxides, chalcogenides, and ceramics (e.g., deposited by sol-gel, chemical vapor deposition, physical vapor deposition, plasma-enhanced chemical vapor deposition, or chemical bath deposition), such as ITO, ZnO:Al, ZnO:In, SnO:F, SnO:Sb, and CdSn; (c) insulators in the form of ultra-thin layers, such as polymers, $SiO_2$, BaTiO, and $TiO_2$; and (d) thin layers of metals, such as Au, Cu, Ni, Cr, Mo, and W. Such coated or core-shell form of nanowires can be desirable to impart electrical conductivity, while avoiding or reducing adverse interactions with a host material, such as potential yellowing or other discoloration of ethylene vinyl acetate or another polymer in the presence of a metal such as Ag.

In cases where it is desirable to impart spectral shifting functionality, additives can include a phosphor or another luminescent material, which can emit light in response to an energy excitation. Current solar devices can suffer technical limitations on the ability to efficiently convert incident sunlight to useful electrical energy. One significant loss mechanism typically derives from a mismatch between an incident solar spectrum and an absorption spectrum of a photoactive layer. In particular, photons with energy greater than a bandgap energy of the photoactive layer can lead to the production of photo-excited charge carriers with excess energy. Such excess energy is typically not converted into electrical energy but is rather typically lost as heat. In addition, this heat can raise the temperature of a solar device and reduce the efficiency of the solar device. In conjunction with these thermalization losses, photons with energy less than the bandgap energy of the photoactive layer are typically not absorbed and, thus, typically do not contribute to the conversion into electrical energy. As a result, a small range of the incident solar spectrum around the bandgap energy can be efficiently converted into useful electrical energy. Surface embedding of spectral shifting additives allows the alteration of an incident solar spectrum to address this spectral mismatch and to improve solar power conversion efficiencies. A phosphor can be designed to at least one of wave guide, redirect, scatter, reflect, and plasmon channel radiation.

Luminescence of a phosphor can occur based on relaxation from excited electronic states of atoms or molecules and can include, for example, chemiluminescence, electroluminescence, photoluminescence, thermoluminescence, triboluminescence, and combinations thereof. For example, in the case of photoluminescence, which can include fluorescence and phosphorescence, luminescence can be based on a light excitation, such as absorption of sunlight. Phosphors include down-shifting materials, namely those that emit light at a lower energy (or higher wavelength) relative to an energy excitation, and up-shifting materials, namely those that emit light at a higher energy (or shorter wavelength) relative to an energy excitation. Desirable down-shifting phosphors include those that absorb photons over a certain range of energies and emit photons with energies slightly greater than about $E_g$, where $E_g$ denotes a bandgap energy of a photoactive layer. Desirable up-shifting phosphors include those that absorb photons over a certain range of energies and emit photons with energies slightly greater than about $E_g$, where $E_g$ again denotes a bandgap energy of a photoactive layer. For certain applications, multiple photon generation can yield higher solar power conversion efficiencies, and, in general, can involve a conversion of $n_i$ photons to $n_j$ photons, where $n_i$ and $n_j$ are integers, and $n_j > n_i$. For example, a quantum cutting material can exhibit down-shifting by absorbing one shorter wavelength photon and emitting two or more longer wavelength photons, while a down-conversion material can exhibit down-shifting by absorbing one shorter wavelength photon and emitting one longer wavelength photon. As another example, an up-conversion material can exhibit up-shifting by a process where two photons are absorbed and one photon is emitted at a higher energy.

Suitable phosphors include those that exhibit photoluminescence with a relatively high quantum efficiency, which can refer to a ratio of the number of output photons to the number of input photons. Quantum efficiency (or quantum yield) of a phosphor can be characterized with respect to its "internal" quantum efficiency, which can refer to a ratio of the number of photons emitted by the phosphor to the number of photons absorbed by the phosphor. Desirable phosphors can exhibit photoluminescence with a high internal quantum efficiency that is at least about 10%, such as at least about 20%, at least about 30%, at least about 40%, at least about 50%, at least about 60%, at least about 70%, or at least about 80%, and up to about 90%, up to about 95%, or more. Quantum efficiency also can refer to a characteristic of a photoactive material, namely a ratio of the number of charge carriers produced by the photoactive material to the number of photons incident upon, or absorbed by, the photoactive material. Desirable phosphors include those that absorb a range of wavelengths where a photoactive material has a low quantum efficiency (e.g., less than about 50%) and emit another range of wavelengths where the photoactive material has a high quantum efficiency (e.g., at least about 50%, such as at least about 80%). In the case of silicon, for example, desirable phosphors include those with a broad band absorption from about 300 nm to about 450 nm and with an emission from about 600 nm to about 800 nm.

Phosphors can be included as nanoparticles (e.g., quantum dots and nanocrystals), dissolved molecular species, suspensions of nano-sized or micron-sized particles (e.g., crystalline particles or amorphous particles), or combinations thereof. Phosphors can be provided as metal-organic compounds (e.g., organolanthanide complexes), organometallic compounds (e.g., a phosphorescent organometallic iridium complex such as Ir(bpy)$_3$, where bpy stands for bipryidine, and Os and Pt complexes of similar structure), semiconductor nanocrystals or quantum dots, organic molecules (e.g., organic dyes), and inorganic crystals or other materials (e.g., rare earth doped ceramics).

Figure 3:
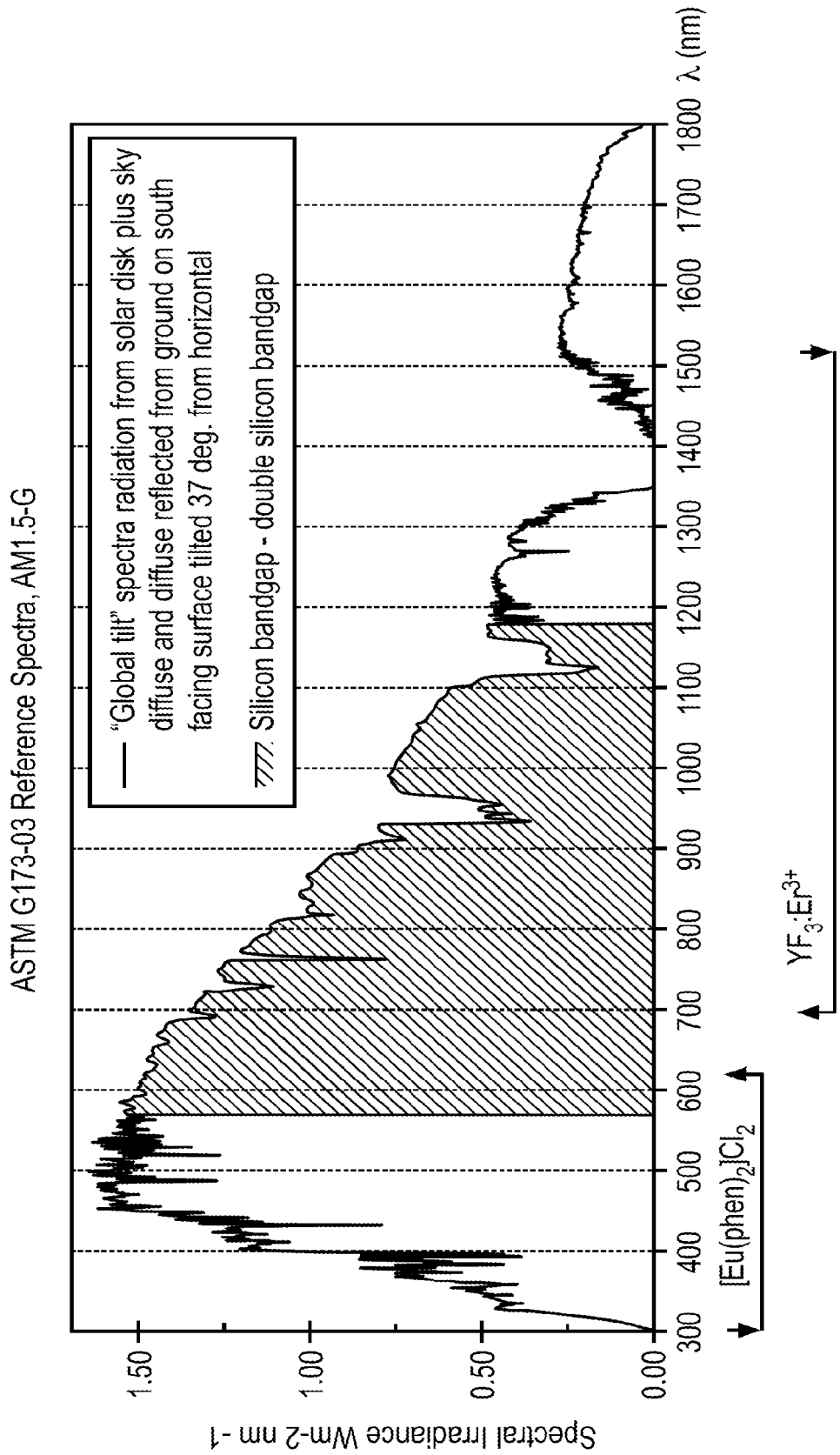
FIG. 3 illustrates the AM1.5-G solar spectrum at sea level as a function of wavelength, according to an embodiment of the invention.

FIG. 3 illustrates the AM1.5-G solar spectrum at sea level as a function of wavelength. The area under the curve that is blacked out represents the spectrum range captured by a 1.12 eV bandgap silicon photoactive layer until the double bandgap energy, at which point incident light can produce excessively thermalized carriers in a solar device. Below the chart are arrows representing absorption and emission spectra peaks of one up-shifting phosphor (Er$^{3+}$-based ceramic) and one down-shifting phosphor (Eu$^{3+}$-based phosphor).

Embodiments described herein can address engineering challenges that have impeded the adoption of phosphors in solar devices, such as:

1) In some instances, phosphors can have less than ideal stability. Oxidation (e.g., from Eu$^{2+}$ to Eu$^{3+}$) can occur during a baking process. Phosphors should be stable and compatible with baking temperatures of typically 400° C.
2) In some instances, rare-earth metals and the purification processes for lanthanides can be expensive. In fluorescent lamps, for instance, the rare-earth metals can contribute to the cost of a final fluorescent lamp by about 20-40%.
3) In some instances, rare-earth ions can have low absorption coefficients (e.g., where 4f-4f transitions of lanthanide ions are forbidden or weak). Phosphor hosts can be desirable to minimize reflection and maximize absorption and coupling efficiency of light into excited carriers. Semiconductor hosts with band gaps greater than 2.7 eV (e.g., ZnSe 2.7 eV, 6H—SiC 3.0 eV, TiO$_2$ 3.0-3.2 eV) are desirable for high efficiency energy transfer from the host conduction band to the excited level of the rare-earth ion. Sensitizers are desirable to absorb strongly in the region 300-500 nm and transfer efficiently to the donor.
4) In some instances, parasitic absorption from a host material is a loss mechanism affecting phosphors incorporated in the host material, the extent of which varies with layer thickness and host and luminescent species type.
5) In some instances, phosphors can present environmental and safety concerns, can be incompatible with water or moisture during synthesis, and can degrade under UV radiation.
6) In some instances, concentration quenching for high Yb$^{3+}$ concentrations should be minimized. Inducing clustering by charge compensation and reducing quenching centers reached through energy migration over the Yb$^{3+}$ sub-lattice may ameliorate concentration quenching issues.
7) In some instances, the emission wavelength (e.g., 980 nm) of Yb$^{3+}$, while above the band gap of crystalline-Si, can suffer from weak absorption by crystalline-Si at this wavelength, leading to thicker crystalline-Si layers.
8) In some instances, phosphors should be incorporated into transparent layers above the solar cell where refractive indices of the phosphor layer, trapping techniques, and ARCs may be designed to minimize loss.
9) In some instances, light absorbed and re-emitted by the luminescent species may not be transmitted to the solar cell due to reflection, where the light lies within the top escape cone or through the side of the phoshor layer.
10) In some instances, organic dyes, while exhibiting relatively high absorption coefficients, close to unity quantum efficiency, and easy processability, can have narrow absorption bands, small Stokes-shift, questionable photostability, and significant re-absorption losses. In some instances, rare-earth ions can exhibit low absorption coefficients, and can be expensive and environmentally hazardous. Quantum dots can be expensive to produce, can exhibit high re-absorption losses due to the large overlap between absorption and emission bands, and can exhibit poor quantum efficiencies.
11) In some instances, defects and surface states in inorganic crystals can serve as electron traps and centers of nonradiative recombination. Surface excitation, coulombic damage, thermal quenching, surface oxidation, and other external electronic reactions can degrade luminescent species.

Table 1 below sets forth additional examples of phosphors that can be included as additives in surface-embedded device components.

TABLE 1

| Mechanism | Species |
| --- | --- |
| down-shifting | Cr$^{3+}$: Al$_2$O$_3$ |
| down-shifting | Eu$^{3+}$ |
| down-shifting | Rhodamine 6G |
| down-shifting | Perylene or Naphtalimide dies (e.g., Lumogen-F 241) |
| down-shifting | Perylene or Naphtalimide dies (e.g., Lumogen-F 339) |
| down-shifting | Uvitex OB (2,5-thiophenediylbis(5-tert-butyl-1,3-benzoxazole)) |

TABLE 1-continued

| Mechanism | Species |
|---|---|
| down-shifting | Hostasol 8G |
| down-shifting | Si nanoparticles or other nano-sized structures |
| down-shifting | Ag: phosphate glass |
| down-shifting | Alq3 |
| down-shifting | TPD (N,N'-diphenyl-N,N'-bis(3-methylphenyl)-[1,1'-biphenyl]-4,4'-diamine) |
| down-shifting | Gaq2Cl |
| down-shifting | MPI |
| down-shifting | Acrylite SG715, Sumipex 652 |
| down-shifting | Bis-MSB, Stilben189, Lumogen-F(570, 650, 083, 170 and 300), Coumarin 307, Fluorescence Yellow CRS040 |
| down-shifting | CdSe nanoparticles or other nano-sized structures |
| down-shifting | CdS nanoparticles or other nano-sized structures |
| down-shifting | ZnSe |
| down-shifting | $Sm^{3+}$: $KMgF_3$ |
| down-shifting | $Tb^{3+}$ |
| down-shifting | $Dy^{3+}$ |
| down-shifting | Coumarin |
| down-shifting | CRS 040 |
| down-shifting | $SrAlF_5$: $Pr^{3+}$ |
| down-shifting | $YF_3$: $Pr^{3+}$ |
| down-shifting | $NaYF_4$: $Pr^{3+}$ |
| down-shifting | $CaAlF_5$: $Pr^{3+}$ |
| down-shifting | $NaMgF_3$: $Pr^{3+}$ |
| down-shifting | $KMgF_3$: $Pr^{3+}$ |
| down-shifting | $LaZrF_7$: $Pr^{3+}$ |
| down-shifting | $SrAl_{12}O_{19}$: $Pr^{3+}$ |
| down-shifting | $LiYF_4$: $Gd^{3+}$ |
| down-shifting | $LiGdF_4$: $Eu^{3+}$ |
| down-shifting | $GdF_3$: $Eu^{3+}$ |
| down-shifting | $BaF_2$: $Gd^{3+}$, $Eu^{3+}$ |
| down-shifting | $LiGdF_4$: $Er^{3+}$, $Tb^{3+}$ |
| down-shifting | ZnS: Ag, Cu, Al, Zn |
| down-shifting | $YVO_4$: Eu |
| down-shifting | $Y_2O_3$: Eu |
| down-shifting | $Cd_3(PO_4)_2$: Mn |
| down-shifting | $BaCl_2$: $Er^{3+}$ |
| Up-shifting | $Er^{3+}$: Si |
| Up-shifting | $Tb^{3+}$: $LaF_3$ |
| Up-shifting | $Er^{3+}$: $YAlO_3$ |
| Up-shifting | $Er^{3+}$: $Y_2O_3$ |
| Up-shifting | $Er^{3+}$: $LaF_3$ |
| Up-shifting | $Er^{3+}$: $LaCl_3$ |
| Up-shifting | $Er^{3+}$: $LaBr_3$ |
| Up-shifting | $Er^{3+}$: $NaYF_4$ |
| Up-shifting | $Ti^{2+}$: $MgCl_2$ |
| Up-shifting | $Ti^{2+}$: NaCl |
| Up-shifting | $Er^{3+}$: $ZrO_2$ |
| Up-shifting | Rhodamine B |
| Up-shifting | Rhodamine 6G |
| Up-shifting | PYC |
| Up-shifting | APSS |

Further examples of phosphors include $Er^{3+}$-based down-shifting phosphors; lanthanide-containing compounds that are up-shifting or down-shifting; down-shifting phosphors used in fluorescent lamps (e.g., $Eu^{3+}$ ions for blue and red emission and $Tb^{3+}$ for green emission, with quantum efficiencies in the range of about 90% to about 93%); $CaAl_2O_4$: $Yb^{2+}$ and $Yb^{3+}$ co-activated luminescent materials; $NaYF_4$: $Er^{3+}$ (about 20% $Er^{3+}$); Si nanocrystals embedded in a $SiO_2$ matrix with $Er^{3+}$ ion receptors adjacent to the Si nanocrystals; fluorescent dyes; lanthanide ions; lanthanide complexes; nanoantennas; organic antennas; $Eu^{3+}$ phenanthroline (or phen) complexes; $[Eu(phen)_2]Cl_3$; $Tb^{3+}$ bipyridine (or bpy) complexes; $[Tb(bpy)_2]Cl_3$; $Ca_2BO_3Cl:Ce^{3+}$; $Tb^{3+}$-based phosphors; $Yb^{3+}$-based phosphors; $Er^{3+}$-$Dy^{3+}$; ORMOSIL:$Eu^{3+}$; Ag; laser dyes; Er; TPD; $Y_2O_3$:Eu; $Eu^{3+}$; $Eu^{2+}$; $Cs_3Y_2Br_9$:$Eu^{3+}$-$Yb^{3+}$; Tb—Yb; Pr—Yb; Er—Yb; acrylate-based phosphors; PbSe; PbS; $Sm^{3+}$; $SrF_2$:$Pr^{3+}$-$Yb^{3+}$; ZnS-based phosphors, ZnS:Mn, $BaMgAl_{10}O_{17}$:$Eu^{2+}$ (or BAM) display phosphors; Cu-activated ZnS; Ag-activated ZnS; phosphors with oxide host, nitride host, oxynitride host, sulfide host, selenide host, halide host, silicate host, and rare-earth metal host; resonant energy transfer particles; or any combination thereof.

Additives can also include, for example, functional agents such as metamaterials, in place or, in combination with, electrically conductive materials, semiconductors, and phosphors. Metamaterials and related artificial composite structures with particular electromagnetic properties can include, for example, split ring resonators, ring resonators, cloaking devices, nanostructured antireflection layers, high absorbance layers, perfect lenses, concentrators, microconcentrators, focusers of electromagnetic energy, couplers, and the like. Additives can also include, for example, materials that reflect, absorb, or scatter electromagnetic radiation, such as any one or more of infrared radiation, ultraviolet radiation, and X-ray radiation. Such materials include, for example, Ag, Au, Ge, $TiO_2$, Si, $Al_2O_3$, $CaF_2$, ZnS, GaAs, ZnSe, KCl, ITO, tin oxide, ZnO, MgO, $CaCO_3$, benzophenones, benzotriazole, hindered amine light stabilizers, cyanoacrylate, salicyl-type compounds, Ni, Pb, Pd, Bi, Ba, $BaSO_4$, steel, U, Hg, metal oxides, or any combination thereof. Additional examples of materials for additives include $PbSO_4$, $SnO_2$, Ru, As, Te, In, Pt, Se, Cd, S, Sn, Zn, copper indium diselenide ("CIS"), Cr, Ir, Nd, Y, ceramics (e.g., a glass), silica, or any combination thereof.

Additives can also include, for example, polymer-containing nanotubes, polymer-containing nanoparticles, polymer-containing nanowires, semiconducting nanotubes, insulated nanotubes, nanoantennas, additives formed of ferromagnetic materials, additives formed of a ferromagnetic core and a highly conducting shell, organometallic nanotubes, metallic nanoparticles or microparticles, additives formed of piezoelectric materials, additives formed of quantum dots, additives with dopants, optical concentrating and trapping structures, optical rectennas, nano-sized flakes, nano-coaxial structures, waveguiding structures, metallic nanocrystals, semiconducting nanocrystals, as well as additives formed of multichromic agents, oxides, chemicochromic agents, alloys, piezochromic agents, thermochromic agents, photochromic agents, radiochromic agents, electrochromic agents, metamaterials, silver nitrate, magnetochromic agents, toxin neutralizing agents, aromatic substances, catalysts, wetting agents, salts, gases, liquids, colloids, suspensions, emulsions, plasticizers, UV-resistance agents, luminescent agents, antibacterial agents, antistatic agents, behentrimonium chloride, cocamidopropyl betaine, phosphoric acid esters, phylethylene glycol ester, polyols, dinonylnaphthylsulfonic acid, ruthenium metalorganic dye, titanium oxide, scratch resistant agents, graphene, copper phthalocyanine, anti-fingerprint agents, anti-fog agents, tinting agents, anti-reflective agents, infrared-resistant agents, high reflectivity agents, optical filtration agents, fragrance, de-odorizing agents, resins, lubricants, solubilizing agents, stabilizing agents, surfactants, fluorescent agents, activated charcoal, toner agents, circuit elements, insulators, conductors, conductive fluids, magnetic additives, electronic additives, plasmonic additives, dielectric additives, resonant additives, luminescent molecules, fluorescent molecules, cavities, lenses, cold cathodes, electrodes, nanopyramids, resonators, sensors, actuators, transducers, transistors, lasers, oscillators, photodetectors, photonic crystals, conjugated polymers, nonlinear elements, composites, multilayers, chemically inert agents, refractive index modifiers, phase-shifting structures, amplifiers, modulators, switches, photovoltaic cells, light-emitting diodes, couplers, antiblock and antislip agents (e.g., diatomaceous earth, talc, calcium carbonate, silica, and silicates); slip agents and lubricants (e.g., fatty acid amides, erucamide, oleamide, fatty acid esters, metallic stearates, waxes, and amide blends), antioxidants (e.g., amines, phenolics, organophosphates, thioesters, butylated hydroxytoluene (or BHT), and deactivators), antistatic agents (e.g., cationic antistats, quaternary ammonium salts and compounds, phosphonium, sulfonium, anionic counterstats, electrically conductive polymers, amines, and fatty acid esters), biocides (e.g., 10,10'-oxybisphenoxarsine (or OBPA), amine-neutralized phosphate, zinc 2-pyridinethianol-1-oxide (or zinc-OMADINE), 2-n-octyl-4-isothiazolin-3-one, DCOIT, TRICLOSAN, CAPTAN, and FOLPET), light stabilizers (e.g., ultraviolet absorbers, benzophenone, benzotriazole, benzoates, salicylates, nickel organic complexes, hindered amine light stabilizers (or HALS), and nickel-containing compounds), electrically conducting polymer (e.g., polyaniline, poly(acetylene), poly(pyrrole), poly(thiophene), poly(p-phenylene sulfide), poly(p-phenylene vinylene) (or PPV), poly(3-alkylthiophene), olyindole, polypyrene, polycarbazole, polyazulene, polyazepine, poly(fluorene), polynaphthalene, melanins, poly(3,4-ethylenedioxythiophene) (or PEDOT), poly(styrenesulfonate) (or PSS), PEDOT-PSS, PEDOT-polymethacrylic acid (or PEDOT-PMA), poly(3-hexylthiophene) (or P3HT), poly(3-octylthiophene) (or P3OT), poly(C-61-butyric acid-methyl ester) (or PCBM), and poly[2-methoxy-5-(2'-ethyl-hexyloxy)-1,4-phenylene vinylene] (or MEH-PPV)), any material listed as a suitable host material herein, or any combination thereof.

For certain implementations, high aspect ratio additives are desirable, such as in the form of nanowires, nanotubes, and combinations thereof. For example, desirable additives include nanotubes formed of carbon or other materials (e.g., MWNTs, SWNTs, graphitized MWNTs, graphitized SWNTs, modified MWNTs, modified SWNTs, and polymer-containing nanotubes), nanowires formed of a metal, a metal oxide, a metal alloy, or other materials (e.g., Ag nanowires, Cu nanowires, zinc oxide nanowires (undoped or doped by, for example, aluminum, boron, fluorine, and others), tin oxide nanowires (undoped or doped by, for example, fluorine), cadmium tin oxide nanowires, ITO nanowires, polymer-containing nanowires, and Au nanowires), as well as other materials that are electrically conductive or semiconducting and having a variety of shapes, whether cylindrical, spherical, pyramidal, or otherwise. Additional examples of additives include those formed of activated carbon, graphene, carbon black, ketjen black, and nanoparticles formed of a metal, a metal oxide, a metal alloy, or other materials (e.g., Ag nanoparticles, Cu nanoparticles, zinc oxide nanoparticles, ITO nanoparticles, and Au nanoparticles).

In general, a host material can have a variety of shapes and sizes, can be transparent, translucent, or opaque, can be flexible, bendable, foldable or rigid, can be electromagnetically opaque or electromagnetically transparent, and can be electrically conductive, semiconducting, or insulating. The host material can be in the form of a layer, a film, or a sheet serving as a substrate, or can be in the form of a coating or multiple coatings disposed on top of a substrate or another material. Examples of suitable host materials include organic materials, inorganic materials, and hybrid organic-inorganic materials. For example, a host material can include a thermoplastic polymer, a thermoset polymer, an elastomer, or a copolymer or other combination thereof, such as selected from polyolefin, polyethylene (or PE), polypropylene (or PP), ethylene vinyl acetate (or EVA), an ionomer, polyvinyl butyral (or PVB), polyacrylate, polyester, polysulphone, polyamide, polyimide, polyurethane, polyvinyl, fluoropolymer, polycarbonate (or PC), polysulfone, polylactic acid, polymer based on allyl diglycol carbonate, nitrile-based polymer, acrylonitrile butadiene styrene (or ABS), phenoxy-based polymer, phenylene ether/oxide, a plastisol, an organosol, a plastarch material, a polyacetal, aromatic polyamide, polyamide-imide, polyarylether, polyetherimide, polyarylsulfone, polybutylene, polyketone, polymethylpentene, polyphenylene, polystyrene, high impact polystyrene, polymer based on styrene maleic anhydride, polymer based on polyallyl diglycol carbonate monomer, bismaleimide-based polymer, polyallyl phthalate, thermoplastic polyurethane, high density polyethylene, low density polyethylene, copolyesters (e.g., available under the trademark Tritan™), polyvinyl chloride (or PVC), acrylic-based polymer, polyethylene terephthalate glycol (or PETG), polyethylene terephthalate (or PET), epoxy, epoxy-containing resin, melamine-based polymer, silicone and other silicon-containing polymers (e.g., polysilanes and polysilsesquioxanes), polymers based on acetates, poly(propylene fumarate), poly(vinylidene fluoride-trifluoroethylene), poly-3-hydroxybutyrate polyesters, polyamide, polycaprolactone, polyglycolic acid (or PGA), polyglycolide, polylactic acid (or PLA), polylactide acid plastics, polyphenylene vinylene, electrically conducting polymer (e.g., polyaniline, poly(acetylene), poly(pyrrole), poly(thiophene), poly(p-phenylene sulfide), poly(p-phenylene vinylene) (or PPV), poly(3-alkylthiophene), olyindole, polypyrene, polycarbazole, polyazulene, polyazepine, poly(fluorene), polynaphthalene, melanins, poly(3,4-ethylenedioxythiophene) (or PEDOT), poly(styrenesulfonate) (or PSS), PEDOT-PSS, PEDOT-polymethacrylic acid (or PEDOT-PMA), poly(3-hexylthiophene) (or P3HT), poly(3-octylthiophene) (or P3OT), poly(C-61-butyric acid-methyl ester) (or PCBM), and poly[2-methoxy-5-(2'-ethyl-hexyloxy)-1,4-phenylene vinylene] (or MEH-PPV)), polyolefins, liquid crystal polymers, polyurethane, polyester, copolyester, poly(methyl mechacrylate) copolymer, tetrafluoroethylene-based polymer, sulfonated tetrafluoroethylene copolymer, ionomers, fluorinated ionomers, polymer corresponding to, or included in, polymer electrolyte membranes, ethanesulfonyl fluoride-based polymer, polymer based on 2-[1-[difluoro-[(trifluoroethenyl)oxy]methyl]-1,2,2,2-tetrafluoroethoxy]-1,1,2,2,-tetrafluoro- (with tetrafluoro ethylene, tetrafluoroethylene-perfluoro-3,6-dioxa-4-methyl-7-octenesulfonic acid copolymer), polypropylene, polybutene, polyisobutene, polyisoprene, polystyrene, polylactic acid, polyglycolide, polyglycolic acid, polycaprolactone, polymer based on vinylidene fluoride, polymer based on trifluoroethylene, poly(vinylidene fluoride-trifluoroethylene), polyphenylene vinylene, polymer based on copper phthalocyanine, graphene, poly(propylene fumarate), cellophane, cuprammonium-based polymer, rayon, and biopolymers (e.g., cellulose acetate (or CA), cellulose acetate butyrate (or CAB), cellulose acetate propionate (or CAP), cellulose propionate (or CP), polymers based on urea, wood, collagen, keratin, elastin, nitrocellulose, plastarch, celluloid, bamboo, bio-derived polyethylene, carbodiimide, cartilage, cellulose nitrate, cellulose, chitin, chitosan, connective tissue, copper phthalocyanine, cotton cellulose, elastin, glycosaminoglycans, linen, hyaluronic acid, nitrocellulose, paper, parchment, plastarch, starch, starch-based plastics, vinylidene fluoride, and viscose), or any monomer, copolymer, blend, or other combination thereof. Additional examples of suitable host materials include ceramic (e.g., $SiO_2$-based glass; $SiO_x$-based glass; $TiO_x$-based glass; other titanium, cerium, magnesium analogues of $SiO_x$-based glass; spin-on glass; glass formed from sol-gel processing, silane precursor, siloxane precursor, silicate precursor, tetraethyl orthosilicate, silane, siloxane, phosphosilicates, spin-on glass, silicates, sodium silicate, potassium silicate, a glass precursor, a ceramic precursor, silsesquioxane, metallasilsesquioxanes, polyhedral oligomeric silsesquioxanes, halosilane, polyimide, PMMA photoresist, sol-gel, silicon-oxygen hydrides, silicones, stannoxanes, silathianes, silazanes, polysilazanes, metallocene, titanocene dichloride, vanadocene dichloride; and other types of glasses), ceramic precursor, polymer-ceramic composite, polymer-wood composite, polymer-carbon composite (e.g., formed of ketjen black, activated carbon, carbon black, graphene, and other forms of carbon), polymer-metal composite, polymer-oxide, or any combination thereof.

A host material can be, for example, n-doped, p-doped, or un-doped. Embedded additives can be, for example, n-doped, p-doped, or un-doped. If the host material is electrically conductive or semiconducting, additives that are n-doped, p-doped, or both, can be used to form p-n junctions for solar devices and other types of electronic and optoelectronic devices.

At least one difference between the configuration of FIG. 1A and certain surface-embedded device components described herein (e.g., as illustrated in FIG. 1D through FIG. 1I and FIG. 2A through FIG. 2H) is that, characteristic of bulk incorporation, the device layer 104 of FIG. 1A has the additives 102 distributed randomly and relatively uniformly throughout the device layer 104. In contrast, in the surface-embedded device components described herein, additives can be largely confined to a "planar" or "planar-like" embedding region of a host material, leading to decreased topological disorder of the additives and increased occurrence of junction formation between the additives for improved electrical conductivity. Although an embedding region is sometimes referred as "planar," it will be understood that such embedding region is typically not strictly two-dimensional, as the additives themselves are typically three-dimensional. Rather, "planar" can be used in a relative sense, with a relatively thin, slab-like (or layered) local concentration of the additives within a certain region of the host material, and with the additives largely absent from a remainder of the host material. It will also be understood that an embedding region can be referred as "planar," even though such an embedding region can have a thickness that is greater than (e.g., several times greater than) a characteristic dimension of additives, such as in FIG. 1F, FIG. 2A, and FIG. 2B. An embedding region can be located adjacent to one side of a host material, adjacent to a middle of the host material, or adjacent to any arbitrary location along a thickness direction of the host material, and multiple embedding regions can be located adjacent to one another or spaced apart from one another within the host material. Each embedding region can include one or more types of additives, and embedding regions (which are located in the same host material) can include different types of additives. By confining electrically conductive additives to a set of "planar" embedding regions of a host material (as opposed to randomly throughout the host material), a higher electrical conductivity can be achieved for a given amount of the additives per unit of area. Any additives not confined to an embedding region represent an excess amount of additives that can be omitted.

By confining spectral shifting additives to a set of "planar" embedding regions of a host material (as opposed to randomly throughout the host material), higher solar power conversion efficiencies can be achieved for a given amount of the additives per unit of area of a solar device, by reducing instances of self-absorption or quenching. For example, and because a luminescent species can be largely confined to an embedding region adjacent to a top surface of the host material, little or no further species are present below the top embedded species to re-absorb an emission spectra of the top embedded species. The drastically decreased re-absorption due to the confinement of luminescent species into a "planar" embedding region can effectively addresses the issue of high concentration quenching. Also, a down-shifting species embedded adjacent to a top surface of a device layer, such as an encapsulant layer of a solar device, can increase a UV-resistance of a polymer of the device layer, by converting UV radiation of incident sunlight to visible light. Conventional UV-stabilizers or absorbers can be eliminated, decreased in concentration, or included at the same concentration.

At least one difference between the configuration of FIG. 1B and certain surface-embedded structures described herein (e.g., as illustrated in FIG. 1D through FIG. 1I and FIG. 2A through FIG. 2H) is that, characteristic of a conventional coating, the device layer 110 of FIG. 1B has the additives 108 mixed throughout the device layer 110, which is disposed on top of the device layer 112. Referring to the device layer 110 itself, the layer 110 features a configuration similar to that shown in FIG. 1A for the case of bulk incorporation, with the additives 108 distributed randomly and relatively uniformly throughout the layer 110. In contrast, in certain surface-embedded device components described herein, additives are not located uniformly throughout a coating, but rather can be largely confined to a "planar" or "planar-like" embedding region of a device layer, without any coating or other secondary material needed for binding the additives to the device layer, while, in other surface-embedded structures (e.g., as illustrated in FIG. 1G and FIG. 2G), additives can be largely confined to a "planar" or "planar-like" embedding region of a coating, rather than located uniformly throughout the coating. Confining electrically conductive additives to a "planar" or "planar-like" embedding region leads to decreased topological disorder of the additives and increased occurrence of junction formation between the additives for improved electrical conductivity. Also, confining spectral shifting additives to a "planar" or "planar-like" embedding region allows reduced self-absorption and increased UV-resistance.

Moreover, the device layer 110 of FIG. 1B can be susceptible to damage, as an exposed material on top of the layer 110 can be readily removed with scotch tape, a sticky or abrasive force, or other force, and can have a tendency to migrate off the surface. The device layer 110 containing the additives 108 can also delaminate, crack, peel, bubble, or undergo other deformation, which can be overcome by certain surface-embedded device components described herein in which additives are directly embedded into a device layer, without any coating or other secondary material needed for the purposes of binding. For example, a potential issue encountered during the fabrication of electronic devices on polyimide layers is the adhesion of adjacent layers. Peeling and delamination can occur for thin films or other layers deposited on polyimide layers. Surface-embedded device components described herein provide improved mechanical durability and robustness of devices fabricated on polyimide layers. The advantages of surface embedding are applicable to polyimide substrates, as well as other polymer or polymer composite substrates. By directly and durably embedding active or functional additives into a polyimide layer (rather than depositing as a film on top of the polyimide layer), embodiments overcome the poor of adhesion of thin films to polyimide and obviate the use of tie-coats, primers, or other secondary or immediate layers to promote adhesion that can be detrimental to device performance and increase costs. Referring to FIG. 1B, the topological disorder of the additives 108 in which some of the additives 108 extend out from the surface of the layer 110 can result in roughness, cause electrical shorts, and prevent intimate contact with an adjacent device layer. This is in contrast to the surface-embedded device components described herein, which can feature durable, smooth surfaces. In the case where additives are substantially or fully embedded into a host material (e.g., as illustrated in FIG. 1E and FIG. 1F), an embedding surface of the resulting surface-embedded structure is quite smooth (e.g., having a smoothness or a roughness substantially comparable to that of the host material in the absence of the embedded additives), with none, no greater than about 1%, no greater than about 5%, no greater than about 10%, no greater than about 25%, or no greater than about 50% of a surface area of the embedding surface occupied by exposed additives (e.g., as measured by taking a top view of the embedding surface or other 2-dimensional representation of the embedding surface, and determining percentage surface area coverage arising from the exposed additives).

At least one difference between the configuration of FIG. 1C and certain surface-embedded device components described herein (e.g., as illustrated in FIG. 1D through FIG. 1I and FIG. 2A through FIG. 2H) is that, characteristic of surface deposition, the additives 116 are disposed on top of the device layer 118, without any embedding of the additives 116 into the layer 118. The surface-deposited structure 114 of FIG. 1C can be susceptible to damage, as the deposited material on top of the layer 118 can be readily removed with scotch tape, a sticky or abrasive force, or other force, and can have a tendency to migrate off the surface. Also, the surface of the surface-deposited structure 114 is quite porous (e.g., arising from gaps between the surface-deposited additives 116, from stacking of the additives 116 on top of one another, or both), which can create challenges in achieving adequate infiltration of another material coated or otherwise applied on top of the surface-deposited additives 116, thereby resulting in voids or other interfacial defects. Moreover, the surface of the surface-deposited structure 114 can be quite rough, which can cause electrical shorts and prevent intimate contact with an adjacent device layer. This is in contrast to the surface-embedded device components described herein, which can feature durable, relatively non-porous, smooth surfaces. In the case where additives are substantially or fully embedded into a host material (e.g., as illustrated in FIG. 1E and FIG. 1F), an embedding surface of the resulting surface-embedded structure is quite smooth (e.g., having a smoothness or a roughness substantially comparable to that of the host material in the absence of the embedded additives), with none, no greater than about 1%, no greater than about 5%, no greater than about 10%, no greater than about 25%, or no greater than about 50% of a surface area of the embedding surface occupied by exposed additives (e.g., as measured by taking a top view of the embedding surface or other 2-dimensional representation of the embedding surface, and determining percentage surface area coverage arising from the exposed additives). Moreover, the surface-deposited structure 114 can have a higher sheet resistance or lower conductivity than the surface-embedded device components described herein.

In some embodiments, surface-embedded device components can have additives embedded into a host material from about 10% (or less, such as from about 0.1%) by volume into an embedding surface and up to about 100% by volume into the embedding surface, and can have the additives exposed at varying surface area coverage, such as from about 0.1% (or less) surface area coverage up to about 99.9% (or more) surface area coverage. For example, in terms of a volume of an additive embedded below the embedding surface relative to a total volume of the additive, at least one additive can have an embedded volume percentage (or a population of the additives can have an average embedded volume percentage) in the range of about 10% to about 100%, such as from 10% to about 50%, or from about 50% to about 100%.

In some embodiments, surface-embedded device components can have an embedding region with a thickness greater than a characteristic dimension of additives used (e.g., for nanowires, greater than a diameter of an individual nanowire or an average diameter across the nanowires), with the additives largely confined to the embedding region with the thickness less than an overall thickness of the host material. For example, the thickness of the embedding region can be no greater than about 80% of the overall thickness of the host material, such as no greater than about 50%, no greater than about 40%, no greater than about 30%, no greater than about 20%, no greater than about 10%, or no greater than about 5% of the overall thickness.

In some embodiments, additives can be embedded into a host material by varying degrees relative to a characteristic dimension of the additives used (e.g., for nanowires, relative to a diameter of an individual nanowire or an average diameter across the nanowires). For example, in terms of a distance of a furthest embedded point on an additive below an embedding surface, at least one additive can be embedded to an extent of more than about 100% of the characteristic dimension, or can be embedded to an extent of not more than about 100% of the characteristic dimension, such as at least about 5% or about 10% and up to about 80%, up to about 50%, or up to about 25% of the characteristic dimension. As another example, a population of the additives, on average, can be embedded to an extent of more than about 100% of the characteristic dimension, or can be embedded to an extent of not more than about 100% of the characteristic dimension, such as at least about 5% or about 10% and up to about 80%, up to about 50%, or up to about 25% of the characteristic dimension. As will be understood, the extent at which additives are embedded into a host material can impact a roughness of an embedding surface, such as when measured as an extent of variation of heights across the embedding surface (e.g., a standard deviation relative to an average height). Comparing, for example, FIG. 1D versus FIG. 1C, a roughness of the surface-embedded structure 120 of FIG. 1D is less than a characteristic dimension of the partially embedded additives 130, while a roughness of the structure 114 of FIG. 1C is at least a characteristic dimension of the superficially deposited additives 116 and can be about 2 times (or more) the characteristic dimension (e.g., as a resulting of stacking of the additives 116 on top of one another).

In some embodiments, at least one additive can extend out from an embedding surface of a host material from about 0.1 nm to about 1 cm, such as from about 1 nm to about 50 nm, from about 50 nm to 100 nm, or from about 100 nm to about 100 microns. In other embodiments, a population of additives, on average, can extend out from an embedding surface of a host material from about 0.1 nm to about 1 cm, such as from about 1 nm to about 50 nm, from about 50 nm to 100 nm, or from about 100 nm to about 100 microns. In other embodiments, substantially all of a surface area of a host material (e.g., an area of an embedding surface) is occupied by additives. In other embodiments, up to about 100% or up to about 75% of the surface area is occupied by additives, such as up to about 50% of the surface area, up to about 25% of the surface area, up to about 10%, up to about 5%, up to about than 3% of the surface area, or up to about 1% of the surface area is occupied by additives. Additives need not extend out from an embedding surface of a host material, and can be localized entirely below the embedding surface. The degree of embedding and surface coverage of additives for a surface-embedded structure can be selected in accordance with a particular device component or application. For example, a device component operating based on spectral shifting of surface-embedded additives can specify a deeper degree of embedding and lower surface coverage of the additives, while a device component operating based on the flow of an electric current through or across a surface can specify a lesser degree of embedding and higher surface coverage of the additives.

In some embodiments, if nanowires are used as additives, characteristics that can influence electrical conductivity and other desirable characteristics include, for example, nanowire density or loading level, surface area coverage, nanowire length, nanowire diameter, uniformity of the nanowires, material type, and purity. There can be a preference for nanowires with a low junction resistance and a low bulk resistance in some embodiments. For attaining higher electrical conductivity while maintaining high transparency, thinner diameter, longer length nanowires can be used (e.g., with relatively large aspect ratios to facilitate nanowire junction formation and in the range of about 50 to about 2,000, such as from about 50 to about 1,000, or from about 100 to about 800), and metallic nanowires, such as Ag, Cu, and Au nanowires, can be used. Characteristics of nanowires also can be selected or adjusted to provide light scattering, such as when incorporated within a device layer serving as a back reflector of a solar device. Using nanowires as additives to form nanowire networks, such as Ag nanowire networks, can be desirable for some embodiments. Other metallic nanowires, non-metallic nanowires, such as ZnO, ZnO(i), ZnO:Al, ZnO:B, $SnO_2$:F, $Cd_2SnO_4$, CdS, ZnS, $TiO_2$, ITO, and other oxide nanowires, also can be used. Additives composed of semiconductors with bandgaps outside the visible optical spectrum energies (e.g., <1.8 eV and >3.1 eV) or approximately near this range, can be used to create device layers with high optical transparency in that visible light will typically not be absorbed by the bandgap energies or by interfacial traps therein. Various dopants can be used to tune the conductivity of these aforementioned semiconductors, taking into account the shifted Fermi levels and bandgap edges via the Moss-Burstein effect. The nanowires can be largely uniform or monodisperse in terms of dimensions (e.g., diameter and length), such as the same within about 5% (e.g., a standard deviation relative to an average diameter or length), the same within about 10%, the same within about 15%, or the same within about 20%. Purity can be, for example, at least about 50%, at least about 75%, at least about 85%, at least about 90%, at least about 95%, at least about 99%, at least about 99.9%, or at least about 99.99%. Surface area coverage of nanowires can be, for example, up to about 100%, less than about 100%, up to about 75%, up to about 50%, up to about 25%, up to about 10%, up to about 5%, up to about 3%, or up to about 1%. Ag nanowires can be particularly desirable for certain embodiments, since silver oxide, which can form (or can be formed) on surfaces of Ag nanowires as a result of oxidation, is electrically conductive. Also, core-shell nanowires (e.g., silver core with Au or platinum shell) also can decrease junction resistance.

In some embodiments, if nanotubes are used as additives (whether formed of carbon, a metal, a metal alloy, a metal oxide, or another material), characteristics that can influence electrical conductivity and other desirable characteristics include, for example, nanotube density or loading level, surface area coverage, nanotube length, nanotube inner diameter, nanotube outer diameter, whether single-walled or multi-walled nanotubes are used, uniformity of the nanotubes, material type, and purity. There can be a preference for nanotubes with a low junction resistance in some embodiments. For reduced scattering in the context of certain devices such as displays, nanotubes, such as carbon nanotubes, can be used to form nanotube networks. Alternatively, or in combination, smaller diameter nanowires can be used to achieve a similar reduction in scattering relative to the use of nanotubes. Characteristics of nanotubes also can be selected or adjusted to provide light scattering, such as when incorporated within a device layer serving as a back reflector of a solar device. Nanotubes can be largely uniform or monodisperse in terms of dimensions (e.g., outer diameter, inner diameter, and length), such as the same within about 5% (e.g., a standard deviation relative to an average outer/inner diameter or length), the same within about 10%, the same within about 15%, or the same within about 20%. Purity can be, for example, at least about 50%, at least about 75%, at least about 85%, at least about 90%, at least about 95%, at least about 99%, at least about 99.9%, or at least about 99.99%. Surface area coverage of nanotubes can be, for example, up to about 100%, less than about 100%, up to about 75%, up to about 50%, up to about 25%, up to about 10%, up to about 5%, up to about 3%, or up to about 1%.

It should be understood that the number of additive types can be varied for a given device component or application. For example, any, or a combination, of Ag nanowires, Cu nanowires, and Au nanowires can be used along with ITO nanoparticles to yield high optical transparency and high electrical conductivity. Similar combinations include, for example, any, or a combination, of Ag nanowires, Cu nanowires, and Au nanowires along with any one or more of ITO nanowires, ZnO nanowires, ZnO nanoparticles, Ag nanoparticles, Au nanoparticles, SWNTs, MWNTs, fullerene-based materials (e.g., carbon nanotubes and buckyballs), ITO nanoparticles, and phosphors. The use of ITO nanoparticles or nanowires can provide additional functionality, such as by serving as a buffer layer to adjust a work function in the context of solar devices or to provide a conductive path for the flow of an electric current, in place of, or in combination with, a conductive path provided by other additives. Virtually any number of different types of additives can be embedded in a host material.

In some embodiments, additives are initially provided as discrete objects. Upon embedding into a host material, the host material can envelop or surround the additives such that the additives become aligned or otherwise arranged within a "planar" or "planar-like" embedding region. In some embodiments for the case of additives such as nanowires, nanotubes, microwires, microtubes, or other additives with an aspect ratio greater than 1, the additives become aligned such that their lengthwise or longitudinal axes are largely confined to within a range of angles relative to a horizontal plane, or another plane corresponding, or parallel, to a plane of an embedding surface. For example, the additives can be aligned such that their lengthwise or longest-dimension axes, on average, are confined to a range from about −45° to about +45° relative to the horizontal plane, such as from about −35° to about +35°, from about −25° to about +25°, from about −15° to about +15°, from about −5° to about +5°, or from about −1° to about +1°. In this example, little or substantially none of the additives can have their lengthwise or longitudinal axes oriented outside of the range from about −45° to about +45° relative to the horizontal plane. Within the embedding region, neighboring additives can contact one another in some embodiments. Such contact can be improved using longer aspect ratio additives, while maintaining a relatively low surface area coverage for desired transparency. In some embodiments, contact between additives, such as nanowires, nanoparticles, microwires, and microparticles, can be increased through sintering or annealing, such as low temperature sintering at temperatures of about 50° C., about 125° C., about 150° C., about 175° C., or about 200° C., or in the range of about 50° C. to about 125° C., about 100° C. to about 125° C., about 125° C. to about 150° C., about 150° C. to about 175° C., or about 175° C. to about 200° C., flash sintering, sintering through the use of redox reactions to cause deposits onto additives to grow and fuse the additives together, or any combination thereof. For example, in the case of Ag or Au additives, Ag ions or Au ions can be deposited onto the additives to cause the additives to fuse with neighboring additives. High temperature sintering at temperatures at or above about 200° C. is also contemplated. It is also contemplated that little or no contact is needed for certain applications and devices, where charge tunneling or hopping provides sufficient electrical conductivity in the absence of actual contact, or where a host material or a coating on top of the host material may itself be electrically conductive. Such applications and devices can operate with a sheet resistance up to about $10^6$ Ω/sq or more. Individual additives can be separated by electrical and quantum barriers for electron transfer.

The following provides additional advantages of the surface-embedded device components described herein, relative to the configurations illustrated in FIG. 1A through FIG. 1C. Unlike the configuration of FIG. 1A, a uniform distribution of additives throughout an entire bulk of a host material is not required to attain desired characteristics. Indeed, there is a preference in at least some embodiments that additives are largely confined to a "planar" or "planar-like" embedding region of a host material. In practice, it can be difficult to actually attain an uniform distribution as depicted in FIG. 1A, arising from non-uniform mixing and agglomeration and aggregation of additives. Unlike the configuration of FIG. 1B, additives can be embedded into a host material, rather than mixed throughout a coating and applied on top of the host material. In embedding the additives in such manner, the resulting surface-embedded device component can have a higher durability, better adhesion, and superior mechanical integrity. Also, similar to issues associated with bulk incorporation, conventional coatings can be susceptible to non-uniform mixing and agglomeration, which can be avoided or reduced with the surface-embedded device components described herein. By providing a high uniformity of additive distribution within an embedding region, the disclosed embodiments allow improved reliability across devices, as well as thinner composite layers due to surface embedding compared to discrete coatings or bulk incorporation. This high uniformity within an embedding region is attained at least in part due to the surface embedding methods disclosed in the following, which can embed additives into an embedding surface and reduce or prevent subsequent additive migration or agglomeration. Furthermore, the topological disorder of additives in the z-direction of conventional coatings can result in roughness, particularly on the nanometer and micron level. In contrast, and arising, for example, from embedding of additives and alignment of the additives within a host material, the surface-embedded device components can have a decreased roughness compared to conventional coatings, thereby serving to avoid or reduce instances of device failure (e.g., shunting from nanowire penetration of a device). Unlike the configuration of FIG. 1C, additives are partially or fully embedded into a host material, rather than superficially disposed on top of a surface, resulting in a decreased roughness compared to superficially deposited additives and higher durability and conductivity. In some embodiments, when embedding nanowires, polymer chains of a host material can hold the nanowires together, pulling them closer and increasing conductivity. Heating a device layer also can result in the polymer chains moving the nanowires even closer together.

The surface-embedded device components can be quite durable. In some embodiments, such durability is in combination with rigidity and robustness, and, in other embodiments, such durability is in combination with the ability to be flexed, rolled, bent, and folded, amongst other physical actions, with, for example, no greater than about 50%, no greater than about 20%, no greater than about 15%, no greater than about 10%, no greater than about 5%, no greater than about 3%, or substantially no decrease in transmittance, no greater than about 50%, no greater than about 20%, no greater than about 15%, no greater than about 10%, no greater than about 5%, no greater than about 3%, or substantially no increase in resistance, and no greater than about 50%, no greater than about 20%, no greater than about 15%, no greater than about 10%, no greater than about 5%, no greater than about 3%, or substantially no decrease in quantum efficiency. In some embodiments, the surface-embedded device components are largely immune to durability issues of conventional coatings, and can survive a standard Scotch Tape Test used in the coatings industry and yield substantially no decrease, or no greater than about 5% decrease, no greater than about 10% decrease, no greater than about 15% decrease, or no greater than about 50% decrease in observed transmittance, yield substantially no increase, or no greater than about 5% increase, no greater than about 10% increase, no greater than about 15% increase, or no greater than about 50% increase in observed resistance, and yield substantially no decrease, or no greater than about 5% decrease, no greater than about 10% decrease, no greater than about 15% decrease, or no greater than about 50% decrease in observed quantum efficiency. In some embodiments, the surface-embedded device components can also survive rubbing, scratching, flexing, physical abrasion, thermal cycling, chemical exposure, and humidity cycling with substantially no decrease, no greater than about 50% decrease, no greater than about 20% decrease, no greater than about 15% decrease, no greater than about 10% decrease, no greater than about 5% decrease, or no greater than about 3% decrease in observed transmittance or quantum efficiency, and with substantially no increase, no greater than about 50% increase, no greater than about 20% increase, no greater than about 15% increase, no greater than about 10% increase, no greater than about 5% increase, or no greater than about 3% increase in observed resistance. This enhanced durability can result from embedding of additives within a host material, such that the additives are physically or chemically held inside the host material by molecular chains or other components of the host material. In some cases, flexing or pressing can be observed to increase conductivity.

Figure 4:
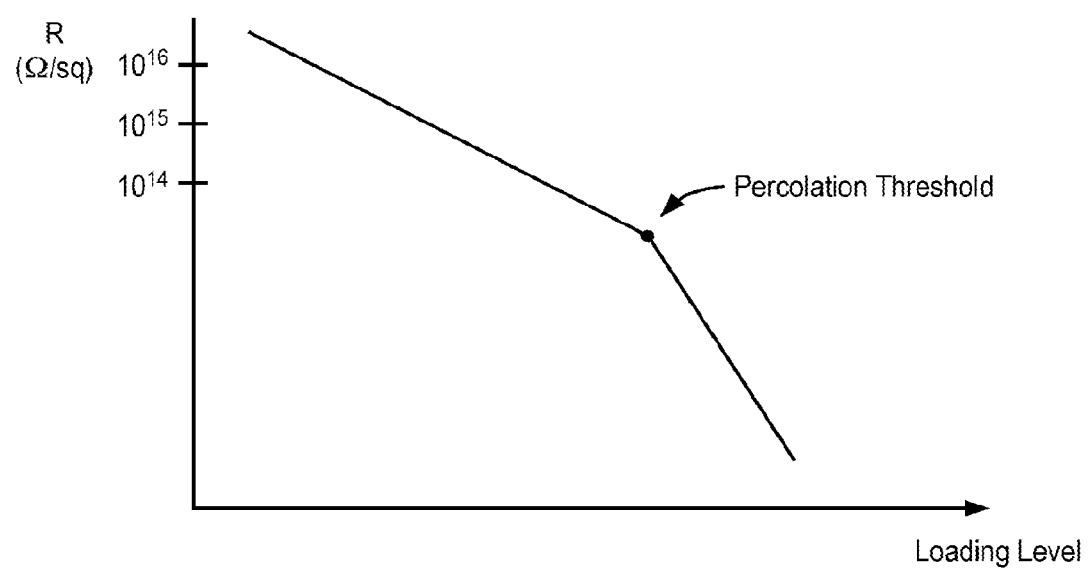
FIG. 4 is a logarithmic plot of resistance versus loading level of additives, according to an embodiment of the invention.

Another advantage of some embodiments of the surface-embedded device components is that an electrical percolation threshold can be attained using a lesser amount of additives. Stated in another way, electrical conductivity can be attained using less additive material, thereby saving additive material and associated cost and increasing transparency. As will be understood, an electrical percolation threshold is typically reached when a sufficient amount of additives is present to allow percolation of electrical charge from one additive to another additive, thereby providing a conductive path across at least portion of a network of additives. In some embodiments, an electrical percolation threshold can be observed via a change in slope of a logarithmic plot of resistance versus loading level of additives as illustrated in the schematic of FIG. 4. A lesser amount of additive material can be used since additives are largely confined to a "planar" or "planar-like" embedding region, thereby greatly reducing topological disorder and resulting in a higher probability of inter-additive (e.g., inter-nanowire or inter-nanotube) junction formation compared to the configurations of FIG. 1A through FIG. 1C. In other words, because the additives are confined to a thin embedding region in the host material, as opposed to dispersed throughout the thickness of the host material, the probability that the additives will interconnect and form junctions can be greatly increased. In some embodiments, an electrical percolation threshold can be attained at a loading level of additives in the range of about 0.001 µg/cm² to about 100 µg/cm² (or higher), such as from about 0.01 µg/cm² to about 100 µg/cm², from about 10 µg/cm² to about 100 µg/cm², from 0.01 µg/cm² to about 0.4 µg/cm², from about 0.5 µg/cm² to about 5 µg/cm², or from about 0.8 µg/cm² to about 3 µg/cm² for certain additives such as silver nanowires. These loading levels can be varied according to dimensions, material type, spatial dispersion, and other characteristics of additives.

In addition, a lesser amount of additives can be used (e.g., as evidenced by a thickness of an embedding region) to achieve a network-to-bulk transition, which is a parameter representing a transition of a thin layer from exhibiting effective material properties of a sparse two-dimensional conducting network to one exhibiting effective properties of a three-dimensional conducting bulk material. By confining additives (e.g., Ag nanowires, Cu nanowires, multi-walled carbon nanotubes ("MWCNTs"), singled-walled carbon nanotubes ("SWCNTs"), or any combination thereof) to a "planar" or "planar-like" embedding region, a lower sheet resistance can be attained at specific levels of solar flux-weighted transmittance. Furthermore, in some embodiments, carrier recombination can be reduced with the surface-embedded device components due to the reduction or elimination of interfacial defects associated with a separate coating or other secondary material into which additives are mixed.

To expound further on these advantages, a network of additives can be characterized by a topological disorder and by contact resistance. Topologically, above a critical density of additives and above a critical density of additive-additive (e.g., nanowire-nanowire, nanotube-nanotube, or nanotube-nanowire) junctions, electrical current can readily flow from a source to a drain. A "planar" or "planar-like" network of additives can reach a network-to-bulk transition with a reduced thickness, represented in terms of a characteristic dimension of the additives (e.g., for nanowires, relative to a diameter of an individual nanowire or an average diameter across the nanowires). For example, an embedding region can have a thickness up to about 5 times (or more) the characteristic dimension, such as up to about 4 times, up to about 3 times, or up to about 2 times the characteristic dimension, and down to about 0.05 or about 0.1 times the characteristic dimension, allowing devices to be thinner while increasing optical transparency and electrical conductivity. Accordingly, the surface-embedded device components described herein provide, in some embodiments, an embedding region with a thickness up to about n×d (in terms of nm) within which are localized additives having a characteristic dimension of d (in terms of nm), where n=2, 3, 4, 5, or higher.

Another advantage of some embodiments of the surface-embedded device components is that, for a given level of electrical conductivity, the components can yield higher transparency. This is because less additive material can be used to attain that level of electrical conductivity, in view of the efficient formation of additive-additive junctions for a given loading level of additives. As will be understood, a transmittance of a thin conducting material (e.g., in the form of a film) can be expressed as a function of its sheet resistance R and an optical wavelength, as given by the following approximate relation for a thin film:

$$T(\lambda) = \left(1 + \frac{188.5}{R_\square} \frac{\sigma_{Op}(\lambda)}{\sigma_{DC}}\right)^{-2} \quad (1)$$

where $\sigma_{Op}$ and $\sigma_{DC}$ are the optical and DC conductivities of the material, respectively. In some embodiments, Ag nanowire networks surface-embedded into flexible transparent substrates can have sheet resistances as low as about 3.2 Ω/sq or about 0.2 Ω/sq, or even lower. In other embodiments, transparent surface-embedded device components suitable for solar devices can reach up to about 85% (or more) for solar flux-weighted transmittance $T_{solar}$ and a sheet resistances as low as about 20 Ω/sq (or below). In still other embodiments, a sheet resistance of ≤10 Ω/sq at ≥85% (e.g., at least about 85%, at least about 90%, or at least about 95%, and up to about 97%, about 98%, or more) solar flux-weighted transmittance can be obtained with the surface-embedded structures. It will be understood that transmittance can be measured relative to other ranges of optical wavelength, such as transmittance at a given wavelength of 550 nm, a human vision or photometric-weighted transmittance (e.g., from about 350 nm to about 700 nm), solar-flux weighted transmittance, transmittance at a given wavelength or range of wavelengths in the infrared range, and transmittance at a given wavelength or range of wavelengths in the ultraviolet range. It will also be understood that transmittance can be measured relative to a substrate (if present) (e.g., accounting for an underlying substrate that is below a host material with surface-embedded additives), or can be measured relative to air (e.g., without accounting for the underlying substrate). Unless otherwise specified herein, transmittance values are designated relative to a substrate (if present), although similar transmittance values (albeit with somewhat higher values) are also contemplated when measured relative to air. For some embodiments, a DC-to-optical conductivity ratio of surface-embedded structures can be at least about 100, at least about 115, at least about 300, at least about 400, or at least about 500, and up to about 600, up to about 800, or more.

Certain surface-embedded device components can include additives of Ag nanowires of average diameter in the range of about 1 nm to about 100 nm, about 10 nm to about 80 nm, about 20 nm to about 80 nm, or about 40 nm to about 60 nm, and an average length in the range of about 50 nm to about 1,000 µm, about 50 nm to about 500 µm, about 100 nm to about 100 µm, about 500 nm to 50 µm, about 5 µm to about 50 µm, about 20 µm to about 150 µm, about 5 µm to about 35 µm, about 25 µm to about 80 µm, about 25 µm to about 50 µm, or about 25 µm to about 40 µm. A top of an embedding region can be located about 0.0001 nm to about 100 µm below a top, embedding surface of a host material, such as about 0.01 nm to about 100 µm below the embedding surface, about 0.1 nm to 100 µm below the embedding surface, about 0.1 nm to about 5 µm below the embedding surface, about 0.1 nm to about 3 µm below the embedding surface, about 0.1 nm to about 1 µm below the embedding surface, or about 0.1 nm to about 500 nm below the embedding surface. Nanowires embedded into a host material can protrude from an embedding surface from about 0% by volume and up to about 90%, up to about 95%, or up to about 99% by volume. For example, in terms of a volume of a nanowire exposed above the embedding surface relative to a total volume of the nanowire, at least one nanowire can have an exposed volume percentage (or a population of the nanowires can have an average exposed volume percentage) of up to about 1%, up to about 5%, up to about 20%, up to about 50%, or up to about 75% or about 95%. At a transmittance of about 85% or greater (e.g., solar flux-weighted transmittance or one measured at another range of optical wavelengths), a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 15 Ω/sq, no greater than about 10 Ω/sq, and down to about 1 Ω/sq or about 0.1 Ω/sq, or less. At a transmittance of about 90% or greater, a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 15 Ω/sq, no greater than about 10 Ω/sq, and down to about 1 Ω/sq or less. In some embodiments, a host material corresponds to a substrate with surface-embedded nanowires, and the host material can be transparent or opaque, can be flexible or rigid, and can be composed of, for example, a polymer, an ionomer, EVA, TPO, TPU, PVB, PE, PET, PETG, polycarbonate, PVC, PP, acrylic-based polymer, ABS, ceramic, glass, or any combination thereof. In other embodiments, a substrate can be transparent or opaque, can be flexible or rigid, and can be composed of, for example, a polymer, an ionomer, EVA, TPO, TPU, PVB, PE, PET, PETG, polycarbonate, PVC, PP, acrylic-based polymer, ABS, ceramic, glass, or any combination thereof, where the substrate is coated with an electrically conductive material, insulator, or semiconductor (e.g., a doped metal oxide or an electrically conductive polymer listed above) and with nanowires embedded into the coating.

Certain surface-embedded device components can include additives of either, or both, MWCNT and SWCNT of average outer diameter in the range of about 1 nm to about 100 nm, about 1 nm to about 10 nm, about 10 nm to about 50 nm, about 10 nm to about 80 nm, about 20 nm to about 80 nm, or about 40 nm to about 60 nm, and an average length in the range of about 50 nm to about 100 µm, about 100 nm to about 100 µm, about 500 nm to 50 µm, about 5 µm to about 50 µm, about 5 µm to about 35 µm, about 25 µm to about 80 µm, about 25 µm to about 50 µm, or about 25 µm to about 40 µm. A top of an embedding region can be located about 0.01 nm to about 100 µm below a top, embedding surface of a host material, such as about 0.1 nm to 100 µm below the embedding surface, about 0.1 nm to about 5 µm below the embedding surface, about 0.1 nm to about 3 µm below the embedding surface, about 0.1 nm to about 1 µm below the embedding surface, or about 0.1 nm to about 500 nm below the embedding surface. Nanotubes embedded into a host material can protrude from an embedding surface from about 0% by volume and up to about 90%, up to about 95%, or up to about 99% by volume. For example, in terms of a volume of a nanotube exposed above the embedding surface relative to a total volume of the nanotube (e.g., as defined relative to an outer diameter of a nanotube), at least one nanotube can have an exposed volume percentage (or a population of the nanotubes can have an average exposed volume percentage) of up to about 1%, up to about 5%, up to about 20%, up to about 50%, or up to about 75% or about 95%. At a transmittance of about 85% or greater (e.g., solar flux-weighted transmittance or one measured at another range of optical wavelengths), a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 15 Ω/sq, no greater than about 10 Ω/sq, and down to about 1 Ω/sq or less. At a transmittance of about 90% or greater, a sheet resistance can be no greater than about 500 Ω/sq, no greater than about 400 Ω/sq, no greater than about 350 Ω/sq, no greater than about 300 Ω/sq, no greater than about 200 Ω/sq, no greater than about 100 Ω/sq, no greater than about 75 Ω/sq, no greater than about 50 Ω/sq, no greater than about 25 Ω/sq, no greater than about 15 Ω/sq, no greater than about 10 Ω/sq, and down to about 1 Ω/sq or about 0.1 Ω/sq, or less. In some embodiments, a host material corresponds to a substrate with surface-embedded nanotubes, and the host material can be transparent or opaque, can be flexible or rigid, and can be composed of, for example, a polymer, an ionomer, EVA, TPO, TPU, PVB, PE, PET, PETG, polycarbonate, PVC, PP, PMMA, glass, polyimide, epoxy, acrylic-based polymer, ABS, ceramic, glass, or any combination thereof. In other embodiments, a substrate can be transparent or opaque, can be flexible or rigid, and can be composed of, for example, a polymer, an ionomer, EVA, TPO, TPU, PVB, PE, PET, PETG, polycarbonate, PVC, PP, acrylic-based polymer, ABS, ceramic, glass, or any combination thereof, where the substrate is coated with an electrically conductive material, insulator, or semiconductor (e.g., a doped metal oxide or an electrically conductive polymer listed above) and with nanotubes embedded into the coating.

Data obtained for surface-embedded device components reveals unexpected findings. For example, it was previously speculated that additives superficially deposited on top of a surface can yield greater electrically conductivity than additives physically embedded into a host material, since the host material (which is an insulator) was speculated to inhibit conducting ability of the additives. However, and unexpectedly, improved electrical conductivity was observed for surface-embedded structures, supporting the notion of favorable junction formation and network-to-bulk transition imposed by embedding the additives within a host material.

Devices Including Surface-Embedded Additives

The surface-embedded device components described herein can be incorporated in a variety of devices, including solar devices, solar glass, low iron glasses, smart windows, displays, organic light-emitting diodes (or OLEDs), architectural glasses, aircraft windshields, electrochromic devices, multichromic devices, as well as other electronic and optoelectronic devices.

In some embodiments, the surface-embedded device components can be incorporated in solar devices. During operation of a solar device, sunlight is absorbed by a photoactive material to produce charge carriers in the form of electron-hole pairs. Electrons exit the photoactive material through one electrode, while holes exit the photoactive material through another electrode. The net effect is a flow of an electric current through the solar device driven by incident sunlight, which electric current can be delivered to an external load to perform useful work. Solar devices include single junction solar cells, multi junction or tandem solar cells, thin-film solar cells, dye-sensitized solar cells, excitonic solar cells, quantum dot solar cells, and bulk heterojunction solar cells. Photoactive materials used in these solar devices can be organic, inorganic, composite, hybrid, or a combination thereof. Examples of solar cells include those based on monocrystalline silicon; polycrystalline silicon; microcrystalline silicon; nanocrystalline silicon; amorphous silicon; thin-film silicon; monocrystalline, polycrystalline, microcrystalline, nanocrystalline, and thin-film forms of other semiconductor materials such as germanium, gallium arsenide, copper indium gallium selenide (or CIGS), copper indium selenide, cadium telluride (or CdTe), and gallium indium phosphide; polymers (e.g., electrically conductive or semiconducting polymers); bicontinuous polymer-fullerene composites; thin-film photoactive materials, and combinations thereof.

Figure 6:
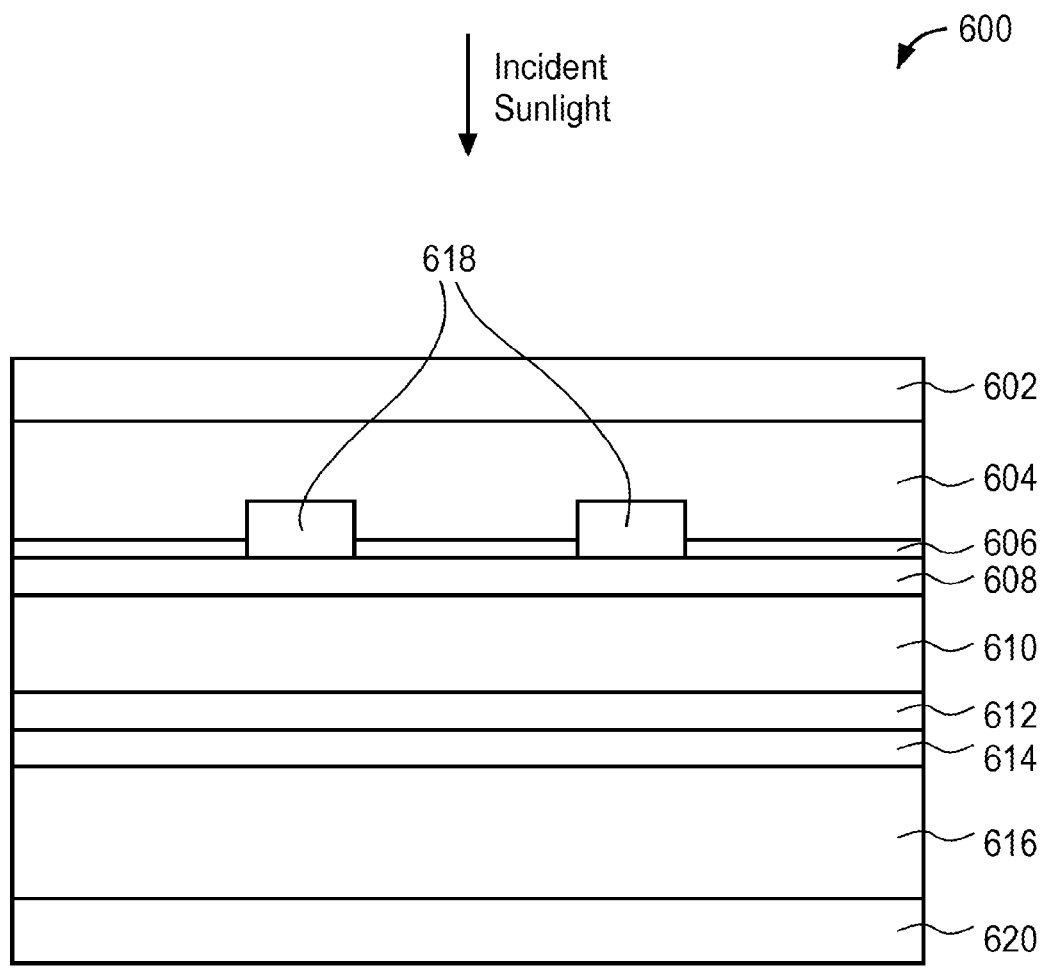
FIG. 6, FIG. 7, and FIG. 8 illustrate solar devices according to various embodiments of the invention.

FIG. 6 illustrates a solar device 600 according to an embodiment of the invention. The solar device 600 includes a photoactive layer 610 formed of a set of photoactive materials and disposed between a set of front device layers and a set of back device layers. In certain cases, various layers are built up from a front sheet (glass), in which case the front sheet can be described as a superstrate. Although various device layers are illustrated and explained as follows, it should be understood that certain of these device layers can be omitted, combined, further sub-divided, or reordered, and additional device layers can be included in accordance with other embodiments.

Referring to FIG. 6, the front device layers include: (1) a front cover 602 formed of a glass (or another ceramic), a fluoropolymer (e.g., polytetrafluoroethylene (or PTFE), polyvinylidene fluoride (or PVDF), fluorinated ethylene propylene (or FEP), or ethylene tetrafluoroethylene (or ETFE)), another suitable material that is substantially transparent to incident sunlight, or any combination thereof (2) an encapsulant layer 604 adjacent to the front cover 602 and implemented as a barrier film formed of ethylene vinyl acetate (or EVA) (e.g., available as DuPont™ Elvax®), polyvinyl butaryl (or PVB) (e.g., available as DuPont™ Butacite®), polyvinyl alcohol (or PVA), silicone, polysiloxane, an ionomer (e.g., available as SentryGlas®), acrylic-based polymer, polymethyl methacrylate (or PMMA), TPU, TPO, another suitable encapsulant material, or any combination thereof (3) a set of bus bars or metallizations 618 at least partially covered by and extending through the encapsulant layer 604 and formed of a metal (e.g., n-type Ag, Ag ink, or Ag paste), a metal alloy, another suitable electrically conductive material, or any combination thereof (4) an anti-reflection coating 606 (or ARC) adjacent to the encapsulant layer 604; and (5) a front electrode 608 disposed between the anti-reflection coating 606 and the photoactive layer 610 and formed of a doped metal oxide (e.g., indium tin oxide), another suitable electrically conductive material that is substantially transparent to incident sunlight, or any combination thereof.

The back device layers include: (1) a substrate 614 formed of silicon, polyimide, (e.g., poly(4,4'-oxydiphenylene-pyromellitimide) available as DuPont® Kapton®), polyethylene naphthalate (or PEN) (e.g., available as Teonex®), polyester (e.g., available as Melinex® ST polyester), glass, aluminum, stainless steel, another suitable substrate material, or any combination thereof; (2) a back electrode 612 disposed between the photoactive layer 610 and the substrate 614 and formed of a metal, a metal alloy, another suitable electrically conductive material, or any combination thereof (3) an encapsulant layer 616 adjacent to the substrate 614 and implemented as a barrier film formed of ethylene vinyl acetate (or EVA) (e.g., available as DuPont™ Elvax®), polyvinyl butaryl (or PVB) (e.g., available as DuPont™ Butacite®), polyvinyl alcohol (or PVA), silicone, polysiloxane, an ionomer (e.g., available as SentryGlas®), acrylic-based polymer, polymethyl methacrylate (PMMA), TPO, TPU, another suitable encapsulant material, or any combination thereof; and (4) a back cover 620 formed of a glass (or another ceramic), a fluoropolymer (e.g., polyvinyl fluoride (or PVF)), a polyester (e.g., biaxially-oriented polyethylene terephthalate (or PET) available as Mylar®, Melinex®, and Teijin® Tetoron®), another suitable material, or any combination thereof. Various other combinations and ordering of the front and back device layers are contemplated. In some embodiments, for example, the back cover 620 can serve as a substrate on top of which other device layers are disposed, such as a set of bus bars or other metallization and an encapsulant layer.

In general, any one or more of the device layers of the solar device 600 can be implemented as the surface-embedded device components described herein, such as those illustrated in FIG. 1D through FIG. 1I and FIG. 2A through FIG. 2H.

The purpose of the encapsulant layers 604 and 616 is to provide the solar device 600 with structural support, electrical isolation, physical isolation, thermal conduction, and barrier properties. In some embodiments, either, or both, of the encapsulant layers 604 and 616 can include surface-embedded additives to impart additional or enhanced functionality such as electrical conductivity, thermal conductivity, spectral shifting, and absorption enhancement. It is also contemplated that either, or both, of the encapsulant layers 604 and 616 can include additives that are incorporated in another suitable fashion, such as through bulk incorporation of additives to impart electrical conductivity or other desired functionality.

For example, the sun-facing, encapsulant layer 604 can be surface-embedded with a down-shifting phosphor, and the encapsulant layer 616 can be surface-embedded with an up-shifting phosphor, yielding the solar device 600 that tunes an incident radiation spectrum from both the infrared range to the visible range and from the ultraviolet range to the visible range. Instead of the visible range, the incident radiation spectrum can be tuned to another suitable range of wavelengths matched to a bandgap energy of the photoactive layer 610.

Alternatively, or in conjunction, either, or both, of the encapsulant layers 604 and 616 can be surface-embedded with electrically conductive additives. Such electrically conductive encapsulant layers 604 and 616 can operate in conjunction with the front electrode 608 and the back electrode 612, or can replace the front electrode 608 and the back electrode 612 altogether, such that separate or dedicated electrodes can be omitted from the solar device 600.

Electrically conductive additives (which are surface embedded in the encapsulant layers 604 and 616 or another set of device layers of the solar device 600) can be in electrical contact with, or otherwise electrically connected to, the photoactive layer 610. In some embodiments, the photoactive layer 610 can include a buffer layer, and electrically conductive additives can be in electrical contact with, or otherwise electrically connected to, the buffer layer of the photoactive layer 610. A buffer layer (which can also be referred as an anti-shunting layer or a shunting resistance layer) can serve to increase or otherwise modify a shunt resistance of solar devices, such as those with a shunt resistance below about 500 $\Omega \cdot cm^2$. Low shunt resistance sometimes can occur because of physical defects (e.g., omission of photoactive material), poorly grown material with areas of high conductivity, or a combination thereof. Low shunt resistance can sometimes lead to high dark current and, thus, low Fill Factor and low open circuit voltage. A buffer layer can be implemented as a thin insulating or resistive layer to inhibit leakage of current in an undesired direction. When a solar device is illuminated, a resulting voltage generated can be sufficient to tunnel charge carriers through the buffer layer, with little or moderate increase in series resistance. Examples of buffer layers include CdS layers in CIGS and CdTe solar devices, ZnO(i) layers placed between CdS and ZnO:Al layers in CIGS solar devices, and ZnO(i) or $SnO_2$ layers in CdTe solar devices. Other purposes of the ZnO(i) layers include resistance against sputtering damage during deposition of the ZnO:Al layers. Additional examples of buffer layers include $SiO_2$ or $Si_3N_4$ passivization layers in silicon solar cells that inhibit surface carrier recombination. In the case of physical defects, additives, such as in the form of nanowires, can bridge over those defects. The additives also can be in electrical contact with, or otherwise electrically connected to, a transparent metal oxide layer or another electrically conductive layer that provides work function matching. It is also contemplated that a buffer layer can be implemented as a separate layer with respect to the photoactive layer 610, and electrically conductive additives can be in electrical contact with, or otherwise electrically connected to, such separate buffer layer.

Alternatively, or in conjunction, either, or both, of the encapsulant layers 604 and 616 can be surface-embedded with additives to provide UV-resistance or otherwise provide protection against photodecomposition, thermal degradation, photochemical degradation, or photothermal degradation. Light of wavelengths below 380 nm can generate free radicals, such as hydroperoxides and peroxides, which in the presence of oxygen can lead to cross-linking or scission of polymer chains. Small molecules, double carbon-carbon bonds, discoloring, yellowing, browning, transmittance loss, generation of gases from photothermal degradation, delamination of an encapsulant material from a substrate, mismatching of neighboring solar cells in a solar module, and loss in system power output are possible results of the generation of free radicals. In some embodiments, either, or both, of the encapsulant layers 604 and 616 can be surface-embedded with UV absorbers (e.g., 2-hydroxy-4-n-octyloxybenzophenone available as Cyasorb UV 531™), UV light stabilizers (e.g., benzophenone and bis(2,2,6,6-tetramethyl-4-piperidinyl)sebacate available as Tinuvin 770), antioxidants (e.g., tris(mono-nonylphenyl)phosphite available as Naugard P), or any combination thereof. The localization of additives, such as UV stabilizers, within an embedding region adjacent to a sun-facing or top surface of the encapsulant layer 604 allows substantially complete UV stabilization before harmful UV radiation can be transmitted through a bulk of the encapsulant layer 604, providing enhanced UV stabilization to the encapsulant layer 604 as well as device layers below the encapsulant layer 604. In some embodiments, surface-embedding of a down-shifting phosphor can provide such UV stabilization function by converting radiation from the ultraviolet range to the visible range before transmission through various layers of the solar device 600.

Other types of additives can be surface-embedded into either, or both, of the encapsulant layers 604 and 616 (or a base copolymer or other precursor of the encapsulant layers 604 and 616), such as cross-linking promoters (e.g., organic peroxides), initiators, primers, and curing agents (e.g., OO-t-butyl-O-(2-ethylhexyl)monoperoxycarbonate available as Lupersol TBEC) to promote curing or other processing of the encapsulant layers 604 and 616. Desiccants can be surface-embedded to provide improved moisture barrier characteristics, and ceramics or other types of materials can be surface-embedded to provide improved oxygen barrier characteristics. Additives formed of an electrically conductive material or a semiconductor also can be surface-embedded to adjust a work function or to distribute heat more efficiently and evenly across the solar device 600. In addition, additives can be surface-embedded and localized within an embedding region adjacent to and facing the photoactive layer 610 to induce absorption of light of a desired wavelength range by the photoactive layer 610, such as by one or more of scattering, plasmonic, and polaritonic effects. Examples of suitable absorption-inducing additives include Ag nanoparticles, Ag nanoparticles encapsulated in a semiconductor (e.g., core-shell nanoparticles with a silver core and a silicon shell), Ag nanoparticles encapsulated in an insulator (e.g., core-shell nanoparticles with a silver core and an insulator shell), Ag nanowires, Ag nanowires encapsulated in a semiconductor (e.g., core-shell nanowires with a silver core and a silicon shell), Ag nanowires encapsulated in an insulator (e.g., core-shell nanowires with a silver core and an insulator shell), nanoparticles of other metals, nanowires of other metals, porous nanoparticles, porous nanowires, nanoporous materials, nanoporous glasses (or other ceramics), nanoporous semiconductors, and so forth.

Other device layers of the solar device 600 can be surface-embedded with additives in place of, or in combination with, the encapsulant layers 604 and 616, and the preceding discussion with respect to the encapsulant layers 604 and 616 is also applicable with respect to the other device layers. In some embodiments, either, or both, of the front cover 602 and the back cover 620 can include surface-embedded additives to impart additional or enhanced functionality such as electrical conductivity, thermal conductivity, spectral shifting, and absorption enhancement. For example, the front cover 602 can be surface-embedded with a down-shifting phosphor to tune an incident radiation spectrum or provide an UV stabilization function. As another example, the substrate 614 can be surface-embedded with electrically conductive additives, and can operate in conjunction with, or replace, the back electrode 612.

Through the incorporation of surface-embedded additives, the solar device 600 can operate with an improved solar power conversion efficiency, which can be expressed as $V_{oc} \times J_{sc} \times FF/P_{AM1.5}$, where $V_{oc}$ corresponds to an open circuit voltage, $J_{sc}$ corresponds to a short circuit current, FF is the fill factor, and $P_{AM1.5}$ is the incident power per unit area from the AM1.5 solar spectrum. By imparting improved electrical conductivity to one or more layers of the solar device 600, the solar power conversion efficiency can be increased by increasing the Fill Factor and $J_{sc}$. By imparting improved transparency to one or more layers of the solar device 600, the solar power conversion efficiency can be increased by increasing $J_{sc}$. By imparting improved absorption through the incorporation of absorption-inducing additives, the solar power conversion efficiency can be increased by increasing $J_{sc}$. And, by providing enhanced utilization of a solar spectrum through the incorporation of spectral shifting additives, the solar power conversion efficiency can be increased by increasing $J_{sc}$. Down-shifting can be useful for certain thin-film solar devices, such as CIGS and CdTe solar devices, which use a CdS buffer layer that can absorb blue light. In such devices, down-shifting can reduce or prevent the CdS layer from causing unwanted absorption, thereby directly leading to an increase in $J_{sc}$ as well as indirectly improving the Fill Factor and $V_{oc}$ by allowing thicker CdS layers that can increase shunt resistance. In some embodiments, the solar power conversion efficiency can be at least about 10%, such as at least about 12%, at least about 15%, at least about 18%, at least about 20%, or at least about 25%, and up to about 30%, up to about 40%, up to about 50%, or more.

Figure 7:
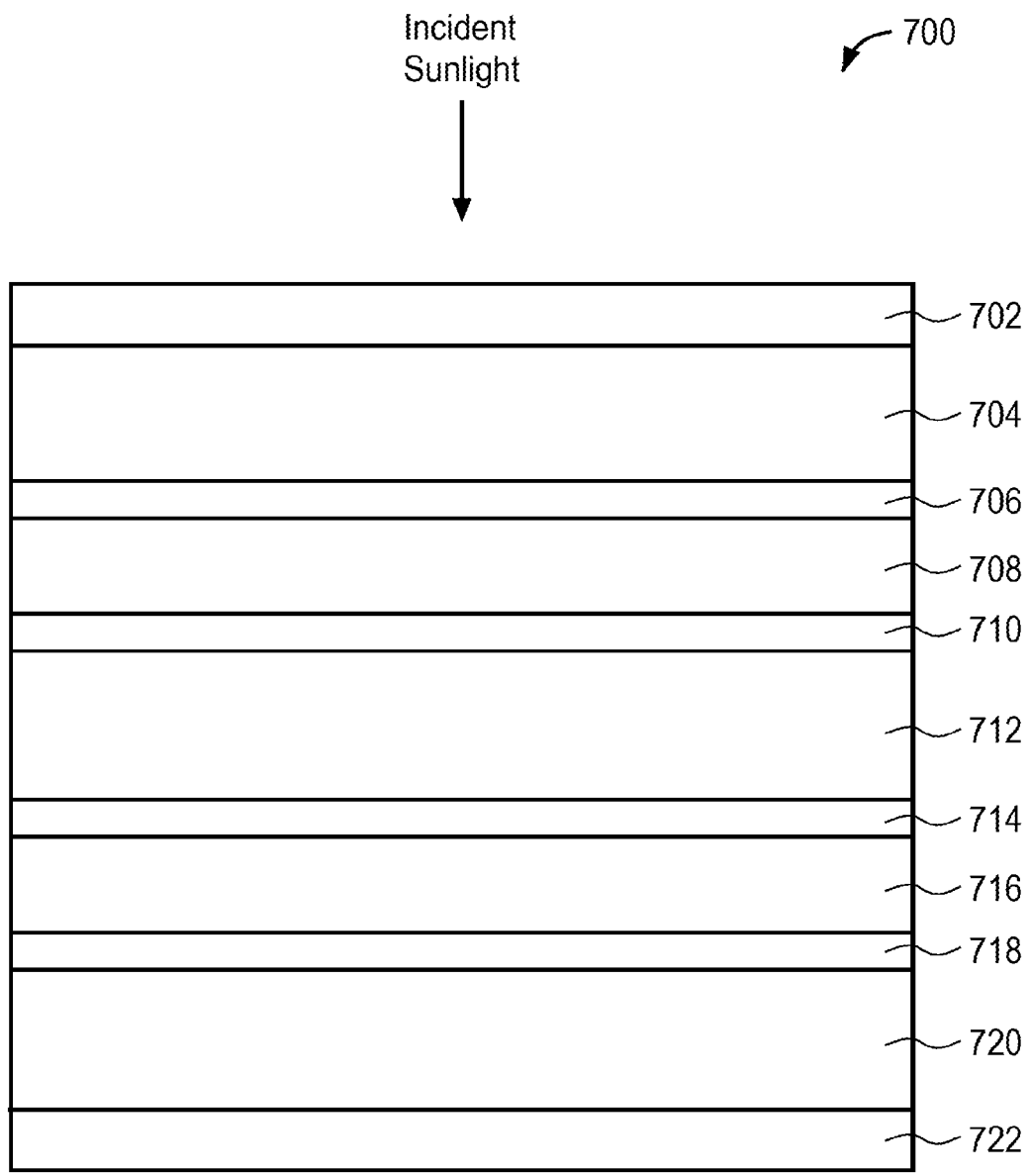

FIG. 7 illustrates a solar device 700 according to another embodiment of the invention. Certain aspects of the solar device 700 can be implemented in a similar fashion as explained above for the solar device 600, and those aspects need not be repeated below. Also, although various device layers are illustrated and explained as follows, it should be understood that certain of these device layers can be omitted, combined, further sub-divided, or reordered, and additional device layers can be included in accordance with other embodiments.

As illustrated in FIG. 7, the solar device 700 is a multi-junction solar cell, including multiple photoactive layers 708 and 716 having different bandgap energies, namely $E_{g1}$ and $E_{g2}$, respectively, and where $E_{g1} > E_{g2}$. While the two photoactive layers 708 and 716 are illustrated in FIG. 7, it is contemplated that three or more photoactive layers can be included in the solar device 700. The photoactive layer 708 is disposed between a pair of electrodes 706 and 710, and the photoactive layer 716 is disposed between a pair of electrodes 714 and 718. In the illustrated embodiment, the solar device 700 includes multiple encapsulant layers 704, 712, and 720, with the encapsulant layer 704 disposed between a front cover 702 and the electrode 706, the encapsulant layer 712 disposed between the electrodes 710 and 714, and the encapsulant layer 720 disposed between the electrode 718 and a back cover 722.

In general, any one or more of the device layers of the solar device 700 can be implemented as the surface-embedded device components described herein, such as those illustrated in FIG. 1D through FIG. 1I and FIG. 2A through FIG. 2H.

In some embodiments, one or more of the encapsulant layers 704, 712, and 720 can include surface-embedded additives to impart functionality such as electrical conductivity, thermal conductivity, spectral shifting, and absorption enhancement. It is also contemplated that additives can be incorporated in another suitable fashion, such as through bulk incorporation of additives to impart electrical conductivity or other desired functionality.

For example, the encapsulant layer 704 can be surface-embedded with a phosphor that performs down-shifting with respect to $E_{g1}$, the encapsulant layer 712 can be surface-embedded with another phosphor that performs down-shifting with respect to $E_{g2}$, and the encapsulant layer 720 can be surface-embedded with yet another phosphor that performs up-shifting with respect to $E_{g1}$ or $E_{g2}$. During operation of the solar device 700, incident solar radiation strikes the encapsulant layer 704, which performs down-shifting of higher energy radiation to match $E_{g1}$ of the photoactive layer 708. Solar radiation with energies lower than $E_{g1}$ passes through the photoactive layer 708 and strikes the encapsulant layer 712, which performs down-shifting of higher energy radiation to match $E_{g2}$ of the photoactive layer 716. Solar radiation with energies lower than $E_{g2}$ passes through the photoactive layer 716 and strikes the encapsulant layer 720, which performs up-shifting to match $E_{g1}$ or $E_{g2}$. By operating in such manner, the solar device 700 provides enhanced utilization of a solar spectrum, by allowing different energy bands within the solar spectrum to be efficiently collected and converted into electricity.

Figure 8:
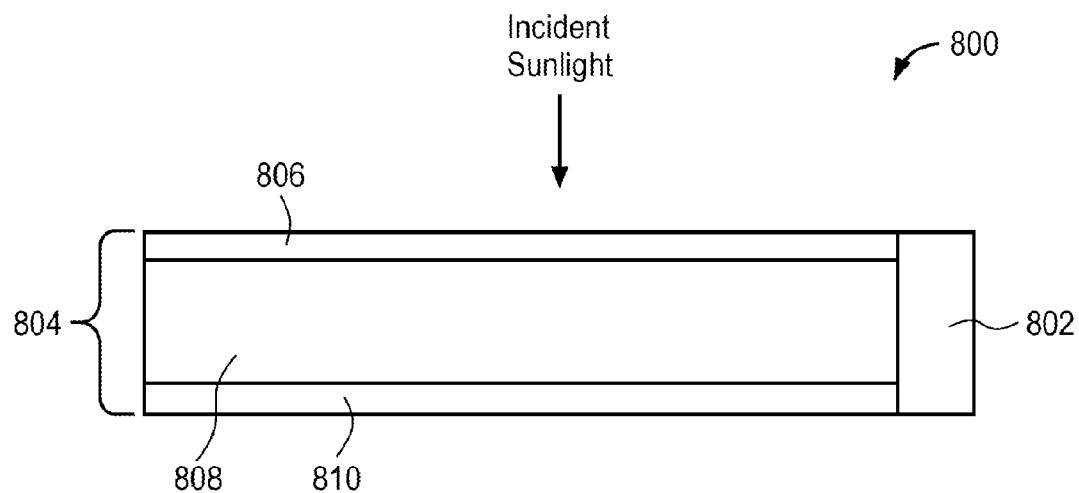

FIG. 8 illustrates a solar device 800 according to another embodiment of the invention. Certain aspects of the solar device 800 can be implemented in a similar fashion as explained above for the solar devices 600 and 700, and those aspects need not be repeated below. Also, although various device layers are illustrated and explained as follows, it should be understood that certain of these device layers can be omitted, combined, further sub-divided, or reordered, and additional device layers can be included in accordance with other embodiments.

As illustrated in FIG. 8, the solar device 800 includes a photovoltaic cell 802, which is a p-n junction device formed of crystalline silicon or another suitable photoactive material. The solar device 800 also includes a luminescent solar concentrator (or LSC) 804, which is formed as a waveguide slab that is adjacent and optically connected to the photovoltaic cell 802. Although the single photovoltaic cell 802 is illustrated in FIG. 8, it is contemplated that multiple photovoltaic cells can be included at various edges of the LSC 804. The LSC 804 includes an encapsulant layer 808 (or other interlayer) that is disposed between a front cover 806 and a back cover 810.

In general, any one or more of the device layers of the LSC 804 can be implemented as the surface-embedded device components described herein, such as those illustrated in FIG. 1D through FIG. 1I and FIG. 2A through FIG. 2H. In the illustrated embodiment, the encapsulant layer 808 is surface-embedded with a set of phosphors. In some embodiments, a phosphor can be surface-embedded and localized within an embedding region adjacent to a sun-facing or top surface of the encapsulant layer 808, although the localization of the phosphor can be varied for other embodiments. During operation of the solar device 800, the LSC 804 captures a solar spectrum across a wide range of angles of incidence with a surface-embedded phosphor, and the phosphor emits light within the encapsulant layer 808 at a different wavelength (or a different range of wavelengths) and, in combination with total internal reflection, concentrates the light that is guided towards the edges of the encapsulant layer 808. The energy difference between absorption and the emitted light reduces instances of self-absorption by the phosphor. In such fashion, the LSC 804 can achieve high optical concentrations without requiring solar tracking. The resulting emitted light intensity can concentrate sunlight by a factor of about 5 or more, such as by a factor of at least about 10, at least about 20, or at least about 30, and up to about 40 or more, and, when directed onto the photovoltaic cell 802, the LSC 804 can increase a solar power conversion efficiency by a factor in the range of about 2 to about 10 (or more).

Surface-embedding allows a phosphor to be controllably embedded into a surface of a polymer or another encapsulant material, with high uniformity and with little or no agglomeration that can otherwise lead to self-quenching of emission and hence reduced quantum efficiency. Also, surface-embedding addresses issues of delamination and inefficiencies and other losses resulting from light absorption. Embedded phosphor species buried directly into a surface of a polymer or another encapsulant material can convert incident light substantially immediately at an interface, forming a highly efficient configuration for a wavelength-conversion solar device.

Figure 9:
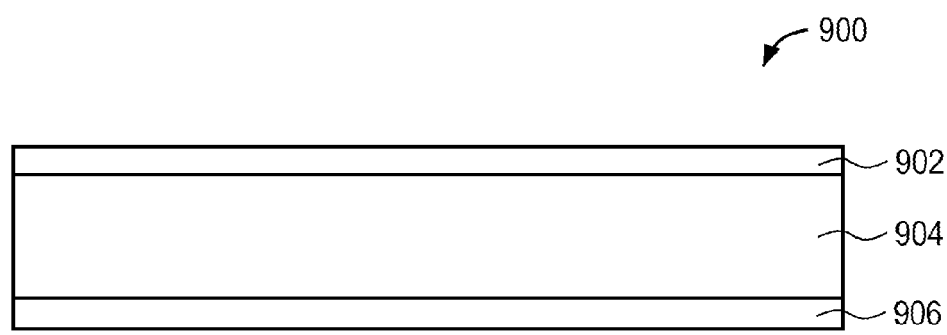
FIG. 9 illustrates a smart window according to an embodiment of the invention.

In other embodiments, the surface-embedded device components described herein can be incorporated in smart windows. FIG. 9 illustrates a smart window 900 according to an embodiment of the invention. Certain aspects of the smart window 900 can be implemented in a similar fashion as explained above for the solar devices 600, 700, and 800, and those aspects need not be repeated below. Also, although various device layers are illustrated and explained as follows, it should be understood that certain of these device layers can be omitted, combined, further sub-divided, or reordered, and additional device layers can be included in accordance with other embodiments.

As illustrated in FIG. 9, the smart window 900 includes a front cover 902 and a back cover 906, between which is an encapsulant layer 904 (or other interlayer) that controls passage of light through the smart window 900. In general, any one or more of the device layers of the smart window 900 can be implemented as the surface-embedded device components described herein, such as those illustrated in FIG. 1D through FIG. 1I and FIG. 2A through FIG. 2H. In the illustrated embodiment, the encapsulant layer 904 is surface-embedded with a set of additives, such as in the fashion illustrated in FIG. 2H, although the localization and type of additives can be varied for other embodiments. For example, the encapsulant layer 904 can be surface-embedded with electrochromic additives. When an electric field is applied, the electrochromic additives can respond by undergoing a color change or a change in shade. When the electrical field is absent, the electrochromic additives can revert back to its initial color or shade. In such manner, the smart window 900 can appear transparent or translucent. Other types of multichromic additives can be used in place of, or in combination with, electrochromic additives. Alternatively, or in conjunction, the encapsulant layer 904 can be surface-embedded with electrically conductive additives to serve as electrodes through which an electric field can be applied.

Figure 10:
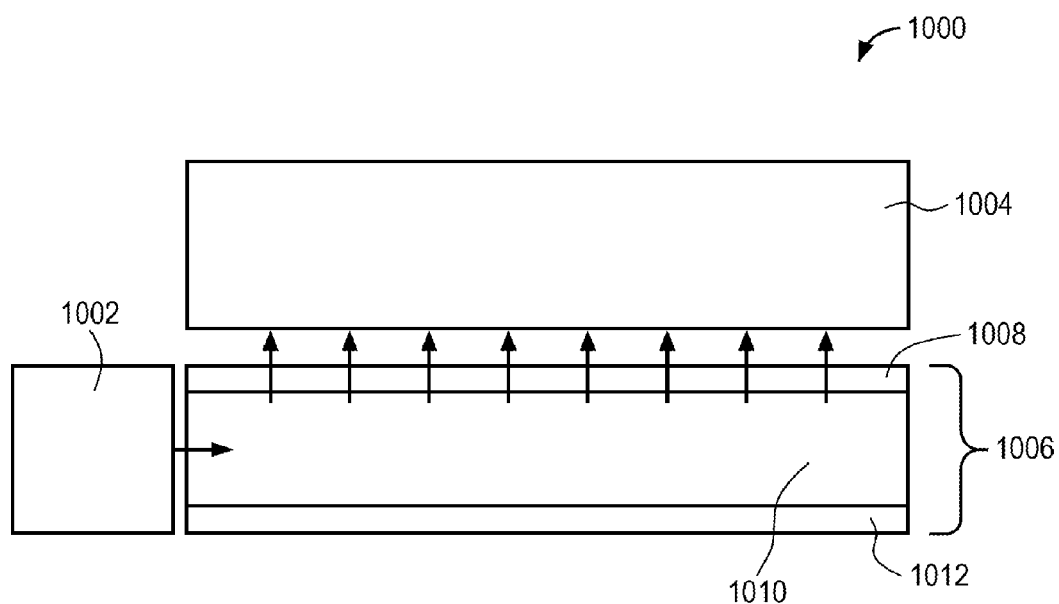
FIG. 10 illustrates a display device according to an embodiment of the invention.

In still other embodiments, the surface-embedded device components described herein can be incorporated in display devices, such as flat panel displays, liquid crystal displays ("LCDs"), plasma displays, OLED displays, electronic-paper, quantum dot displays, and flexible displays. FIG. 10 illustrates a LCD 1000 according to an embodiment of the invention. Certain aspects of the LCD 1000 can be implemented in a similar fashion as explained above for the solar devices 600, 700, and 800 and the smart window 900, and those aspects need not be repeated below. Also, although various device layers are illustrated and explained as follows, it should be understood that certain of these device layers can be omitted, combined, further sub-divided, or reordered, and additional device layers can be included in accordance with other embodiments.

As illustrated in FIG. 10, the LCD 1000 is a light-emitting diode ("LED")-backlight LCD and includes an array of LEDs 1002 (or another light source) that is adjacent and optically connected to a backlight module 1006, which, in turn, is adjacent and optically connected to a LCD module 1004. The backlight module 1006 includes a front cover 1008 and a back cover 1012, between which is an encapsulant layer 1010 (or other interlayer). In general, any one or more of the device layers of the backlight module 1006 can be implemented as the surface-embedded device components described herein, such as those illustrated in FIG. 1D through FIG. 1I and FIG. 2A through FIG. 2H. In the illustrated embodiment, the LEDs 1002 emit light of a particular color, such as blue light, and the backlight module 1006 includes a set of surface-embedded phosphors that absorb the blue light and emit light of different colors, such as red light and green light. In some embodiments, the phosphors can be surface-embedded and localized within an embedding region adjacent to an edge of the encapsulant layer 1010 facing the LEDs 1002, although the localization of the phosphors can be varied for other embodiments. A combination of the blue light emitted by the LEDs 1002 and the red light and green light emitted by the phosphors within the backlight module 1006 appear as "white" light, which is directed by the backlight module 1006 towards the LCD module 1004. In addition to the phosphors, a diffuser can be surface-embedded, bulk incorporated, or otherwise included within the encapsulant layer 1010 to spread out or otherwise scatter light towards the LCD module 1004. Alternatively, or in conjunction, such a diffuser can be surface-embedded, bulk incorporated, or otherwise included within either, or both, of the front cover 1008 and the back cover 1012. Examples of suitable diffusers include nano-sized or micron-sized particles formed of a ceramic (e.g., titania or silica), a metal (e.g., silver), or another suitable material.

FIG. 12 are schematics of a number of electronic device architectures representing different types of touch sensors and displays according to an embodiment of the invention. In these schematics, an ITO electrode (patterned and/or unpatterened) is deposited on a hardcoat, film, and/or glass. In all cases where there is an OCA adjacent to an ITO electrode, instead of using ITO (patterned and/or unpatterened) deposited on a hardcoat, film, and/or glass, an electrode can be surface-embedded into the OCA. Certain aspects of the devices of FIG. 12 can be implemented in a similar fashion as explained above, and those aspects need not be repeated. Also, although various device layers are illustrated, it should be understood that certain of these device layers can be omitted, combined, further sub-divided, or reordered, and additional device layers can be included in accordance with other embodiments.

Manufacturing Methods of Surface-Embedded
Device Components

Disclosed herein are manufacturing methods to form surface-embedded device components in a highly-scalable, rapid, and low-cost fashion, in which additives are durably and surface-embedded into a wide variety of host materials, securely burrowing the additives into the host materials.

Some embodiments of the manufacturing methods can be generally classified into two categories: (1) surface-embedding additives into a dry composition to yield a host material with the surface-embedded additives; and (2) surface-embedding additives into a wet composition to yield a host material with the surface-embedded additives. It will be understood that such classification is for ease of presentation, and that "dry" and "wet" can be viewed as relative terms (e.g., with varying degrees of dryness or wetness), and that the manufacturing methods can apply to a continuum spanned between fully "dry" and fully "wet." Accordingly, processing conditions and materials described with respect to one category (e.g., dry composition) can also apply with respect to another category (e.g., wet composition), and vice versa. It will also be understood that hybrids or combinations of the two categories are contemplated, such as where a wet composition is dried or otherwise converted into a dry composition, followed by surface-embedding of additives into the dry composition to yield a host material with the surface-embedded additives. It will further be understood that, although "dry" and "wet" sometimes may refer to a level of water content or a level of solvent content, "dry" and "wet" also may refer to another characteristic of a composition in other instances, such as a degree of cross-linking or polymerization.

Advantageously, some embodiments of the manufacturing methods can be carried out under moderate conditions of temperature and pressure (e.g., room temperature and pressure conditions) and can be implemented in a roll-to-roll fashion, thereby facilitating integration in a device manufacturing line. Also, some embodiments of the manufacturing methods can be applied to a polymer extrusion manufacturing setting. For example and by way of preview, silver nanowires (or another type of additive) can be suspended in an embedding fluid, and can be sprayed onto an extrudate, where the embedding fluid facilitates embedding of the silver nanowires into the extrudate. The extrudate can be hot, molten, soft, or otherwise in a state that allows embedding of the silver nanowires in the presence of the embedding fluid. The resulting nanowire-embedded extrudate can be combined with another extrudate (either with or without embedded additives) via co-extrusion, where two or more materials are extruded through a die with two or more orifices arranged such that the extrudates merge and weld together in a laminar structure before cooling. The materials can be fed to the die from separate extruders. Co-extrusion has benefits, for example, in the case of an encapsulant layer for a solar device that incorporates multiple layers with respective or different functionality, such as in terms of permeability to oxygen, carbon dioxide, and water vapor; electrical conductivity; thermal conductivity; spectral shifting; and so forth.

Figure 5A:
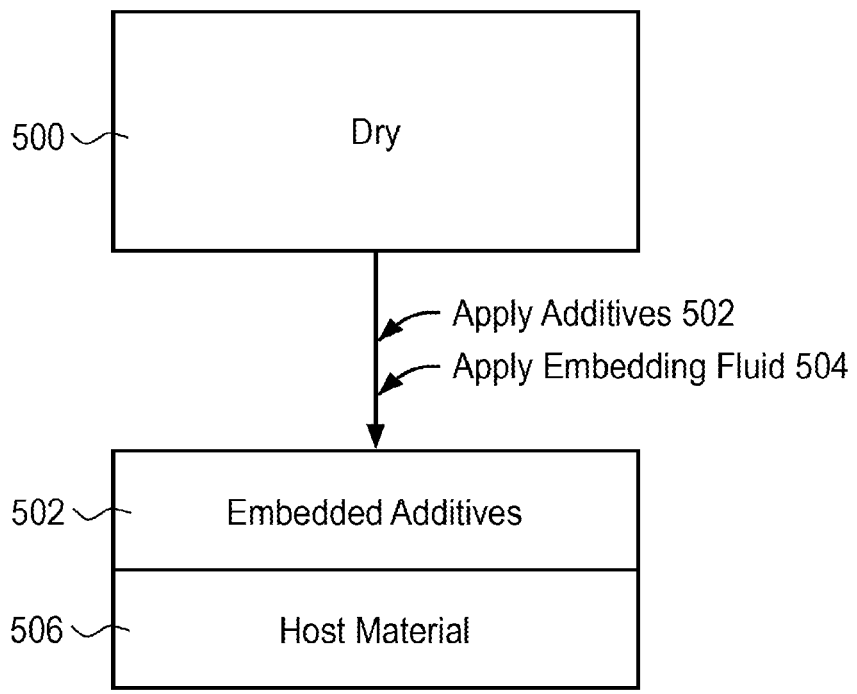
FIG. 5A, FIG. 5B, and FIG. 5C illustrate manufacturing methods to form surface-embedded device components, according to embodiments of the invention.
Figure 5B:
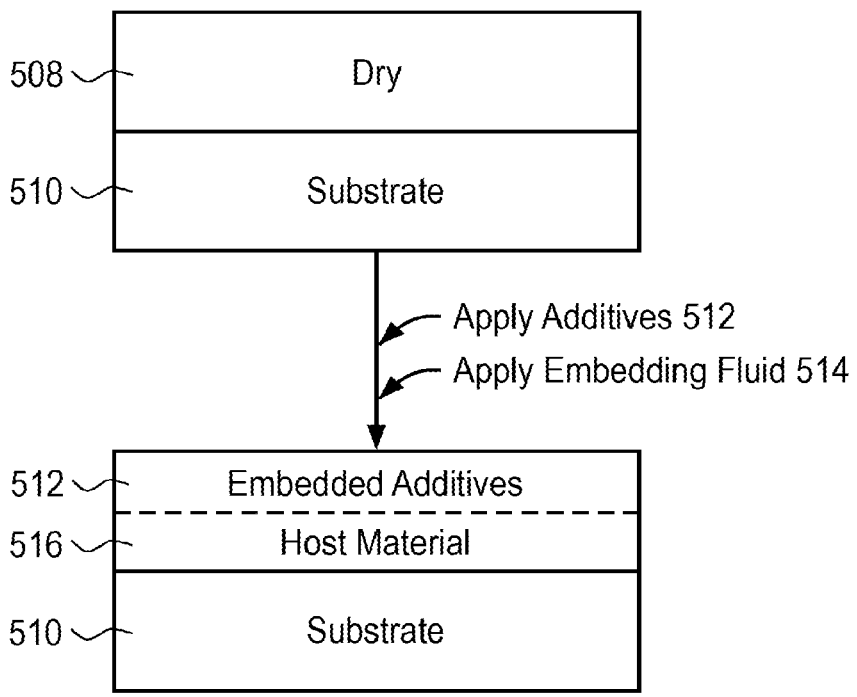

Attention first turns to FIG. 5A and FIG. 5B, which illustrate manufacturing methods for surface-embedding additives into dry compositions, according to embodiments of the invention.

By way of overview, the illustrated embodiments involve the application of an embedding fluid to allow additives to be embedded into a dry composition, such as one including a polymer, a ceramic, a ceramic precursor, or a combination thereof. In general, the embedding fluid serves to reversibly alter the state of the dry composition, such as by dissolving, reacting, softening, solvating, swelling, or any combination thereof, thereby facilitating embedding of the additives into the dry composition. For example, the embedding fluid can be specially formulated to act as an effective solvent for a polymer, while possibly also being modified with stabilizers (e.g., dispersants) to help suspend the additives in the embedding fluid. The embedding fluid also can be specially formulated to reduce or eliminate problems with solvent/polymer interaction, such as hazing, crazing, and blushing. The embedding fluid can include a solvent or a solvent mixture that is optimized to be low-cost, Volatile Organic Compound ("VOC")-free, VOC-exempt or low-VOC, Hazardous Air Pollutant ("HAP")-free, non-ozone depleting substances ("non-ODS"), low volatility or non-volatile, and low hazard or non-hazardous. As another example, the dry composition can include a ceramic or a ceramic precursor in the form of a gel or a semisolid, and application of the embedding fluid can cause the gel to be swollen by filling pores with the fluid, by elongation of partially uncondensed oligomeric or polymeric chains, or both. As a further example, the dry composition can include a ceramic or a ceramic precursor in the form of an ionic polymer, such as sodium silicate or another alkali metal silicate, and application of the embedding fluid can dissolve at least a portion of the ionic polymer to allow embedding of the additives. The embedding of the additives is then followed by hardening or other change in state of the softened or swelled composition, resulting in a host material having the additives embedded therein. For example, the softened or swelled composition can be hardened by exposure to ambient conditions, or by cooling the softened or swelled composition. In other embodiments, the softened or swelled composition is hardened by evaporating or otherwise removing at least a portion of the embedding fluid (or other liquid or liquid phase that is present), applying airflow, applying a vacuum, or any combination thereof. In the case of a ceramic precursor, curing can be carried out after embedding such that the ceramic precursor is converted into a glass. Curing can be omitted, depending on the particular application. Depending on the particular ceramic precursor (e.g., a silane), more or less heat can be involved to achieve various degrees of curing or conversion into a fully reacted or fully formed glass.

In some embodiments, the mechanism of action of surface-embedding can be broken down into stages, as an aid for conceptualization and for ease of presentation. However, these stages can be combined or can occur substantially simultaneously. These stages include: (a) the embedding fluid interacting with a surface (here, for example, a surface of a polymer), (b) the additives penetrating the surface, and (c) the embedding fluid leaving the surface. It should be understood that the mechanism of action can differ for other embodiments.

In stage (a) and as the embedding fluid impacts the surface, polymer chains of the dry composition disentangle and extend up and above the surface and occupy a larger volume due to a combination of swelling and solvation, which loosen the polymer chains. The zone of swollen polymer extends above and below the original surface of the dry composition. This effect occurs over the span of a few seconds or less, which is surprisingly quick given that typical solvent/polymer dissolution procedures are carried out in terms of hours and days. The surface of the polymer has a higher concentration of low molecular weight chains, chain ends, and high surface energy functionality compared to the bulk, which can increase the rate of swelling or solubilizing at the surface.

In stage (b) and once the polymer surface has been swollen, additives are applied into this zone between the polymer chains by the momentum of the embedding fluid and the additives (or by other application of velocity to the additives or the embedding fluid) and by diffusion/mixing processes as the embedding fluid impacts the surface. In some embodiments, embedding can be achieved without the momentum of the embedding fluid and the additives. Another factor that can affect this swelling/dispersion process is the impact energy—if the additives impact the surface, the momentum transfer in a highly localized area can impart energy input into the surface, which can heat the surface to increase solubility of the polymer, thereby facilitating the secure embedding, surface-impregnation, or partial sinking of the additives into the polymer.

In stage (c) and as the embedding fluid evaporates or is otherwise removed, the polymer chains re-form with one another and around the additives. The polymer chains that had extended above and beyond the original surface can capture and adsorb the additives, and pull them into the surface, rendering them securely and durably embedded therein. The structural perturbations due to the embedded additives can be relatively small, and the resulting host material and its embedded additives can substantially retain their original characteristics such as optical transparency and surface morphology.

Referring to FIG. 5A, a dry composition 500 is provided in the form of a sheet, a film, or other suitable form. The dry composition 500 can correspond to a host material and, in particular, can include any material previously listed as suitable host materials, such as a polymer, a ceramic, or any combination thereof. It is also contemplated that the dry composition 500 can correspond to a host material precursor, which can be converted into the host material by suitable processing, such as drying, curing, cross-linking, polymerizing, or any combination thereof. In some embodiments, the dry composition 500 can include a material with a solid phase as well as a liquid phase, or can include a material that is at least partially solid or has properties resembling those of a solid, such as a semisolid, a gel, and the like. Next, and referring to FIG. 5A, additives 502 and an embedding fluid 504 are applied to the dry composition 500. The additives 502 can be in solution or otherwise dispersed in the embedding fluid 504, and can be simultaneously applied to the dry composition 500 via one-step embedding. Alternatively, the additives 502 can be separately applied to the dry composition 500 before, during, or after the embedding fluid 504 treats the dry composition 500. The separate application of the additives 502 can be referred as two-step embedding. Subsequently, the resulting host material 506 has at least some of the additives 502 partially or fully embedded into a surface of the host material 506. Optionally, suitable processing can be carried out to convert the softened or swelled composition 500 into the host material 506. During device assembly, the host material 506 with the embedded additives 502 can be laminated or otherwise connected to adjacent device layers, or can serve as a substrate onto which adjacent device layers are formed, laminated, or otherwise applied.

FIG. 5B is a process flow similar to FIG. 5A, but with a dry composition 508 provided in the form of a coating that is disposed on top of a substrate 510. The dry composition 508 can correspond to a host material, or can correspond to a host material precursor, which can be converted into the host material by suitable processing, such as drying, curing, cross-linking, polymerizing, or any combination thereof. Other characteristics of the dry composition 508 can be similar to those described above with reference to FIG. 5A, and are not repeated below. Referring to FIG. 5B, the substrate 510 can be transparent or opaque, can be flexible or rigid, and can be composed of, for example, a polymer, an ionomer, EVA, PVB, TPO, TPU, PE, PET, PETG, polycarbonate, PVC, PP, acrylic-based polymer, ABS, ceramic, glass, or any combination thereof, as well as any other material previously listed as suitable host materials. The substrate 510 can serve as a temporary substrate that is subsequently removed during device assembly, or can be retained in a resulting device as a layer or other component of the device. Next, additives 512 and an embedding fluid 514 are applied to the dry composition 508. The additives 512 can be in solution or otherwise dispersed in the embedding fluid 514, and can be simultaneously applied to the dry composition 508 via one-step embedding. Alternatively, the additives 512 can be separately applied to the dry composition 508 before, during, or after the embedding fluid 514 treats the dry composition 508. As noted above, the separate application of the additives 512 can be referred as two-step embedding. Subsequently, the resulting host material 516 (which is disposed on top of the substrate 510) has at least some of the additives 512 partially or fully embedded into a surface of the host material 516. Optionally, suitable processing can be carried out to convert the softened or swelled composition 508 into the host material 516. During device assembly, the host material 516 with the embedded additives 512 can be laminated or otherwise connected to adjacent device layers, or can serve as a substrate onto which adjacent device layers are formed, laminated, or otherwise applied.

In some embodiments, additives are dispersed in an embedding fluid, or dispersed in a separate carrier fluid and separately applied to a dry composition. Dispersion can be accomplished by mixing, milling, sonicating, shaking, vibrating, flowing, chemically modifying the additives' surfaces, chemically modifying a fluid, adding a dispersing or suspending agent to the fluid, or otherwise processing the additives to achieve the desired dispersion. The dispersion can be uniform or non-uniform. A carrier fluid can serve as an embedding fluid (e.g., an additional embedding fluid), or can have similar characteristics as an embedding fluid. In other embodiments, a carrier fluid can serve as a transport medium to carry or convey additives, but is otherwise substantially inert towards the additives and the dry composition.

Fluids (e.g., embedding fluids and carrier fluids) can include liquids, gases, or supercritical fluids. Combinations of different types of fluids are also suitable. Fluids can include one or more solvents. For example, a fluid can include water, an ionic or ion-containing solution, an organic solvent (e.g., a polar, organic solvent; a non-polar, organic solvent; an aprotic solvent; a protic solvent; a polar aprotic solvent, or a polar, protic solvent); an inorganic solvent, or any combination thereof. Oils also can be considered suitable fluids. Salts, surfactants, dispersants, stabilizers, or binders can also be included in the fluids.

Examples of suitable organic solvents include 2-methyltetrahydrofuran, a chloro-hydrocarbon, a fluoro-hydrocarbon, a ketone, a paraffin, acetaldehyde, acetic acid, acetic anhydride, acetone, acetonitrile, an alkyne, an olefin, aniline, benzene, benzonitrile, benzyl alcohol, benzyl ether, butanol, butanone, butyl acetate, butyl ether, butyl formate, butyraldehyde, butyric acid, butyronitrile, carbon disulfide, carbon tetrachloride, chlorobenzene, chlorobutane, chloroform, cycloaliphatic hydrocarbons, cyclohexane, cyclohexanol, cyclohexanone, cyclopentanone, cyclopentyl methyl ether, diacetone alcohol, dichloroethane, dichloromethane, diethyl carbonate, diethyl ether, diethylene glycol, diglyme, diisopropylamine, dimethoxyethane, dimethyl formamide, dimethyl sulfoxide, dimethylamine, dimethylbutane, dimethylether, dimethylformamide, dimethylpentane, dimethylsulfoxide, dioxane, dodecafluoro-1-hepatanol, ethanol, ethyl acetate, ethyl ether, ethyl formate, ethyl propionate, ethylene dichloride, ethylene glycol, formamide, formic acid, glycerine, heptane, hexafluoroisopropanol, hexamethylphosphoramide, hexamethylphosphorous triamide, hexane, hexanone, hydrogen peroxide, hypochlorite, i-butyl acetate, i-butyl alcohol, i-butyl formate, i-butylamine, i-octane, i-propyl acetate, i-propyl ether, isopropanol, isopropylamine, ketone peroxide, methanol and calcium chloride solution, methanol, methoxyethanol, methyl acetate, methyl ethyl ketone (or MEK), methyl formate, methyl n-butyrate, methyl n-propyl ketone, methyl t-butyl ether, methylene chloride, methylene, methylhexane, methylpentane, mineral oil, m-xylene, n-butanol, n-decane, n-hexane, nitrobenzene, nitroethane, nitromethane, nitropropane, 2-N-methyl-2-pyrrolidinone, n-propanol, octafluoro-1-pentanol, octane, pentane, pentanone, petroleum ether, phenol, propanol, propionaldehyde, propionic acid, propionitrile, propyl acetate, propyl ether, propyl formate, propylamine, p-xylene, pyridine, pyrrolidine, t-butanol, t-butyl alcohol, t-butyl methyl ether, tetrachloroethane, tetrafluoropropanol, tetrahydrofuran, tetrahydronaphthalene, toluene, triethyl amine, trifluoroacetic acid, trifluoroethanol, trifluoropropanol, trimethylbutane, trimethylhexane, trimethylpentane, valeronitrile, xylene, xylenol, or any combination thereof.

Suitable inorganic solvents include, for example, water, ammonia, sodium hydroxide, sulfur dioxide, sulfuryl chloride, sulfuryl chloride fluoride, phosphoryl chloride, phosphorus tribromide, dinitrogen tetroxide, antimony trichloride, bromine pentafluoride, hydrogen fluoride, or any combination thereof.

Suitable ionic solutions include, for example, choline chloride, urea, malonic acid, phenol, glycerol, 1-alkyl-3-methylimidazolium, 1-alkylpyridnium, N-methyl-N-alkylpyrrolidinium, 1-butyl-3-methylimidazolium hexafluorophosphate, ammonium, choline, imidazolium, phosphonium, pyrazolium, pyridinium, pyrrolidnium, sulfonium, 1-ethyl-1-methylpiperidinium methyl carbonate, 4-ethyl-4-methylmorpholinium methyl carbonate, or any combination thereof. Other methylimidazolium solutions can be considered suitable, including 1-ethyl-3-methylimidazolium acetate, 1-butyl-3-methylimidazolium tetrafluoroborate, 1-n-butyl-3-methylimidazolium tetrafluoroborate, 1-butyl-3-methylimidazolium hexafluorophosphate, 1-n-butyl-3-methylimidazolium hexafluorophosphate, 1-butyl-3-methylimidazolium 1,1,1-trifluoro-N-[(trifluoromethyl)sulfonyl]methanesulfonamide, 1-butyl-3-methylimidazolium bis(trifluoro methylsulfonyl)imide, 1-butyl-3-methylimidazolium bis[(trifluoromethyl)sulfonyl]amide, and 1-butyl-3-methylimidazolium bis[(trifluoromethyl)sulfonyl]imide, or any combination thereof.

Other suitable fluids include halogenated compounds, imides, and amides, such as N-ethyl-N,N-bis(1-methylethyl)-1-heptanaminium bis[(trifluoromethyl)sulfonyl]imide, ethyl heptyl-di-(1-methylethyl)ammonium 1,1,1-trifluoro-N-[(trifluoromethyl)sulfonyl]methane sulfonamide, ethylheptyl-di-(1-methyl ethyl)ammonium bis(trifluoromethylsulfonyl)imide, ethylheptyl-di-(1-methylethyl)ammonium bis[(trifluoromethyl)sulfonyl]amide, or any combination thereof. A fluid can also include ethylheptyl-di-(1-methylethyl)ammonium bis[(trifluoromethyl)sulfonyl]imide, $N_5N_5$N-tributyl-1-octanaminium trifluoromethanesulfonate, tributyloctylammonium triflate, tributyloctylammonium trifluoromethanesulfonate, N,N,N-tributyl-1-hexanaminium bis[(trifluoromethyl)sulfonyl]imide, tributylhexylammonium 1,1,1-trifluoro-N-[(trifluoromethyl)sulfonyl]methanesulfonamide, tributylhexylammonium bis(trifluoromethylsulfonyl)imide, tributylhexylammonium bis[(trifluoromethyl)sulfonyl]amide, tributylhexylammonium bis[(trifluoromethyl)sulfonyl]imide, N,N,N-tributyl-1-heptanaminium bis[(trifluoromethyl)sulfonyl]imide, tributylheptylammonium 1,1,1-trifluoro-N-[(trifluoro methyl)sulfonyl]methanesulfonamide, tributylheptylammonium bis(trifluoromethylsulfonyl)imide; tributylheptylammonium bis[(trifluoromethyl)sulfonyl]amide, tributylheptylammonium bis[(trifluoromethyl)sulfonyl]imide, N,N,N-tributyl-1-octanaminium bis[(trifluoromethyl)sulfonyl]imide, tributyloctylammonium 1,1,1-trifluoro-N-[(trifluoromethyl) sulfonyl]methane sulfonamide, tributyloctylammonium bis(trifluoromethylsulfonyl)imide, tributyloctylammonium bis[(trifluoromethyl)sulfonyl]amide, tributyloctylammonium bis[(trifluoromethyl)sulfonyl]imide, 1-butyl-3-methylimidazolium trifluoroacetate, 1-methyl-1-propylpyrrolidinium 1,1,1-trifluoro-N-[(trifluoromethyl)sulfonyl]methanesulfonamide, 1-methyl-1-propylpyrrolidinium bis(trifluoro methylsulfonyl)imide, 1-methyl-1-propylpyrrolidinium bis[(trifluoromethyl)sulfonyl]amide, 1-methyl-1-propylpyrrolidinium bis[(trifluoromethyl)sulfonyl]imide, 1-butyl-1-methyl pyrrolidinium 1,1,1-trifluoro-N-[(trifluoromethyl)sulfonyl]methanesulfonamide, 1-butyl-1-methylpyrrolidinium bis(trifluoromethylsulfonyl)imide, 1-butyl-1-methylpyrrolidinium bis[(trifluoromethyl)sulfonyl]amide, 1-butyl-1-methylpyrrolidinium bis[(trifluoromethyl)sulfonyl]imide, 1-butylpyridinium 1,1,1-trifluoro-N-[(trifluoromethyl)sulfonyl]methanesulfonamide, 1-butylpyridinium bis(trifluoromethylsulfonyl)imide, 1-butylpyridinium bis[(trifluoromethyl)sulfonyl]amide, 1-butylpyridinium bis[(trifluoromethyl)sulfonyl]imide, 1-butyl-3-methyl imidazolium bis(perfluoroethylsulfonyl)imide, butyltrimethylammonium bis(trifluoromethyl sulfonyl)imide, 1-octyl-3-methylimidazolium 1,1,1-trifluoro-N-[(trifluoromethyl)sulfonyl]methanesulfonamide, 1-octyl-3-methylimidazolium bis(trifluoromethylsulfonyl)imide, 1-octyl-3-methylimidazolium bis[(trifluoromethyl)sulfonyl]amide, 1-octyl-3-methylimidazolium bis[(trifluoromethyl)sulfonyl]imide, 1-ethyl-3-methylimidazolium tetrafluoroborate, $N_5N_5$N-trimethyl-1-hexanaminium bis[(trifluoromethyl)sulfonyl]imide, hexyltrimethylammonium 1,1,1-trifluoro-N-[(trifluoromethyl)sulfonyl]methanesulfonamide, hexyltrimethylammonium bis(trifluoromethylsulfonyl)imide, hexyltrimethylammonium bis[(trifluoromethyl)sulfonyl]amide, hexyltrimethylammonium bis[(trifluoromethyl)sulfonyl]imide, N,N,N-trimethyl-1-heptanaminium bis[(trifluoromethyl)sulfonyl]imide, heptyltrimethylammonium 1,1,1-trifluoro-N-[(trifluoromethyl)sulfonyl]methanesulfonamide, heptyltrimethylammonium bis(trifluoro methylsulfonyl)imide, heptyltrimethylammonium bis[(trifluoromethyl)sulfonyl]amide, heptyltrimethylammonium bis[(trifluoromethyl)sulfonyl]imide, N,N,N-trimethyl-1-octanaminium bis[(trifluoromethyl)sulfonyl]imide, trimethyloctylammonium 1,1,1-trifluoro-N-[(trifluoro methyl) sulfonyl]methanesulfonamide, trimethyloctylammonium bis (trifluoromethylsulfonyl)imide, trimethyloctylammonium bis[(trifluoromethyl)sulfonyl]amide, trimethyloctylammonium bis[(trifluoromethyl)sulfonyl]imide, 1-ethyl-3-methylimidazolium ethyl sulfate, or any combination thereof.

Control over surface-embedding of additives can be achieved through the proper balancing of the swelling-dispersion-evaporation-application stages. This balance can be controlled by, for example, a solvent-host material interaction parameter, sizes of additives, reactivity and volatility of an embedding fluid, impinging additive momentum or velocity, temperature, humidity, pressure, and others factors. More particularly, relevant processing parameters for surface-embedding are listed below for some embodiments of the invention:

Embedding Fluid Selection:
  Compatibility of embedding fluid with surface (e.g., matching or comparison of Hildebrand and Hansen solubility parameters, dielectric constant, partition coefficient, pKa, etc.)
  Evaporation rate, boiling point, vapor pressure, enthalpy of vaporization of embedding fluid
  Diffusion of embedding fluid into surface: thermodynamic and kinetics considerations Viscosity of embedding fluid
Surface tension of embedding fluid, wicking, and capillary effects
Azeotroping, miscibility, and other interactions with other fluids
Application Conditions:
Duration of fluid-surface exposure
Temperature
Humidity
Application method (e.g., spraying, printing, rolling coating, gravure coating, slot-die, cup coating, blade coating, airbrushing, immersion, dip coating, etc.)
Impact/momentum/velocity of additives onto surface (e.g., may influence depth or extent of embedding)
Shear applied to solvent between host material and applicator
Post-processing conditions (e.g., heating, evaporation, fluid removal, air-drying, etc.)
Host Material:
Surface energy
Roughness and surface area
Pre-treatments (e.g., ultraviolet ozonation, base etch, cleaning, solvent priming, heating, curing, vacuum, etc.)
Dispersion/suspension of additives in fluid prior to embedding (e.g., additives can remain dispersed in solution through physical agitation, chemical/capping stabilization, steric stabilization, or are inherently solubilized)
Mitigation of undesired effects (e.g., hazing, crazing, blushing, irreversible destruction of host material, uneven wetting, roughness, etc.)

Some, or all, of the aforementioned parameters can be altered or selected to tune a depth of embedding of additives into a given host material. For example, higher degrees of embedding deep into a surface of a host material can be achieved by increasing a solvency power of an embedding fluid interacting with the host material, matching closely Hansen solubility parameters of the embedding fluid-substrate, prolonging the exposure duration of the embedding fluid in contact with the host material, increasing an amount of the embedding fluid in contact with the host material, elevating a temperature of the system, increasing a momentum of additives impinging onto the host material, increasing a diffusion of either, or both, of the embedding fluid and the additives into the host material, or any combination thereof.

The following Table 2 provides examples of some embedding fluids suitable for embedding additives into dry compositions composed of particular polymers, according to an embodiment of the invention. Using the processing parameters set forth above, it will be understood that other embedding fluids can be selected for these particular polymers, as well as other types of polymers, ceramics, and ceramic precursors.

TABLE 2

| Polymer | Embedding Fluids |
| --- | --- |
| Acrylonitrile butadiene styrene (or ABS) | acetone, dichloromethane, dichloromethane/mineral spirits 80/20 vol %, methyl acetate, methylethylketone, tetrahydrofuran (or THF), ethyl lactate, cyclohexanone, toluene, tetrafluoropropanol (or TFP), trifluoroethanol (or TFE), hexafluoroisopropanol (or HFIP), or any combination thereof |
| Polycarbonate | cyclohexanone, dichloromethane, 60 vol % methyl acetate/20 vol % ethyl acetate/20 vol % cyclohexanone, tetrahydrofuran, toluene, tetrafluoropropanol, trifluoroethanol, hexafluoroisopropanol, methylethylketone, acetone, other pure ketones, or any combination thereof |
| Acrylic-polyacrylate, polymethyl methacrylate (or PMMA) | dichloromethane, methylethylketone, tetrafluoropropanol, trifluoroethanol, hexafluoroisopropanol, terpineol, 1-butanol, isopropanol, tetrahydrofuran, terpineol, trifluoroethanol/isopropanol, other fluorinated alcohols, or any combination thereof |
| Polystyrene | acetone, dichloromethane, tetrahydrofuran, toluene, 50 vol % acetone/50 vol % tetrahydrofuran, or any combination thereof |
| Polyvinyl chloride (or PVC) | tetrahydrofuran, 50% acetone/50% tetrahydrofuran, or any combination thereof |
| Ethylene vinyl acetate (or EVA) | tetrahydrofuran, dichloromethane, alcohol, or any combination thereof |

Fluids (e.g., embedding fluids and carrier fluids) can also include salts, surfactants, stabilizers, and other agents useful in conferring a particular set of characteristics on the fluids. Stabilizers can be included based on their ability to at least partially inhibit inter-additive agglomeration. Other stabilizers can be chosen based on their ability to preserve the functionality of additives. BHT, for instance, can act as a good stabilizer and as an antioxidant. Other agents can be used to adjust rheological properties, evaporation rate, and other characteristics.

Fluids and additives can be applied so as to be largely stationary relative to a surface of a dry composition. In other embodiments, application is carried out with relative movement, such as by spraying a fluid onto a surface, by conveying a dry composition through a falling curtain of a fluid, or by conveying a dry composition through a pool or bath of a fluid. Application of fluids and additives can be effected by airbrushing, atomizing, nebulizing, spraying, electrostatic spraying, pouring, rolling, curtaining, wiping, spin casting, dripping, dipping, painting, flowing, brushing, immersing, patterning (e.g., stamping, inkjet printing, controlled spraying, controlled ultrasonic spraying, and so forth), flow coating methods (e.g., slot die, capillary coating, meyer rod, cup coating, draw down, and the like), printing, gravure printing, lithography, offset printing, roll coating, inkjet printing, intaglio printing, or any combination thereof. In some embodiments, additives are propelled, such as by a sprayer, onto a surface, thereby facilitating embedding by impact with the surface. In other embodiments, a gradient is applied to a fluid, additives, or both. Suitable gradients include magnetic and electric fields. The gradient can be used to apply, disperse, or propel the fluid, additives, or both, onto a surface. In some embodiments, the gradient is used to manipulate additives so as to control the extent of embedding. An applied gradient can be constant or variable. Gradients can be applied before a dry composition is softened or swelled, while the dry composition remains softened or swelled, or after the dry composition is softened or swelled. It is contemplated that a dry composition can be heated to achieve softening, and that either, or both, a fluid and additives can be heated to promote embedding.

Application of fluids and additives and embedding of the additives can be spatially controlled to yield patterns. In some embodiments, spatial control can be achieved with a physical mask, which can be placed between an applicator and a surface to block a segment of applied additives from contacting the surface, resulting in controlled patterning of additive embedding. In other embodiments, spatial control can be achieved with a photomask. A positive or negative photomask can be placed between a light source and a surface, which can correspond to a photoresist. Light transmitted through non-opaque parts of the photomask can selectively affect a solubility of exposed parts of the photoresist, and resulting spatially controlled soluble regions of the photoresist can permit controlled embedding of additives. In other embodiments, spatial control can be achieved through the use of electric gradients, magnetic gradients, electromagnetic fields, thermal gradients, pressure or mechanical gradients, surface energy gradients (e.g., liquid-solid-gas interfaces, adhesion-cohesion forces, and capillary effects), or any combination thereof. Application of an overlying coating (e.g., as illustrated in FIG. 2C and FIG. 2G) can be carried out in a similar fashion. For example, in the case of ITO or another transparent metal oxide, a coating can be sputtered onto a composition with surface-exposed, surface-embedded additives. In the case of an electrically conductive polymer, a carbon-based coating, and other types of coatings, an electrically conductive material can be applied by coating, spraying, flow coating, and so forth. Spatial control can also be achieved by printing a material that differs from a host material and in which embedding does not occur (or is otherwise inhibited).

As noted above, additives can be dispersed in an embedding fluid, and applied to a dry composition along with the embedding fluid via one-step embedding. Additives also can be applied to a dry composition separately from an embedding fluid via two-step embedding. In the latter scenario, the additives can be applied in a wet form, such as by dispersing in a carrier fluid or by dispersing in the same embedding fluid or a different embedding fluid. Still in the latter scenario, the additives can be applied in a dry form, such as in the form of aerosolized powder. It is also contemplated that the additives can be applied in a quasi-dry form, such as by dispersing the additives in a carrier fluid that is volatile, such as methanol, another low boiling point alcohol, or another low boiling point organic solvent, which substantially vaporizes prior to impact with a dry composition.

By way of example, one embodiment involves spraying, airbrushing, or otherwise atomizing a solution of nanowires or other additives dispersed in an appropriate carrier fluid onto a dry composition.

As another example, one embodiment involves pre-treating a dry composition by spraying or otherwise contacting an embedding fluid with the dry composition, and then, after the passage of time $t_1$, spraying or airbrushing nanowires or other additives with velocity such that the combination of the temporarily softened dry composition and the velocity of the impinging nanowires allow rapid and durable surface-embedding of the nanowires. $t_1$ can be, for example, in the range of about 0 nanosecond to about 24 hours, such as from about 1 nanosecond to about 24 hours, from about 1 nanosecond to about 1 hour or from about 1 second to about 1 hour. Two spray nozzles can be simultaneously or sequentially activated, with one nozzle dispensing the embedding fluid, and the other nozzle dispensing, with velocity, atomized nanowires dispersed in a carrier fluid towards the dry composition. Air-curing or higher temperature annealing optionally can be included.

As another example, one embodiment involves spraying, airbrushing, or otherwise atomizing a solution of nanowires or other additives dispersed in a carrier fluid onto a dry composition. After the passage of time $t_2$, a second spraying, airbrushing, or atomizing operation is used to apply an embedding fluid so as to permit efficient surface-embedding of the nanowires. $t_2$ can be, for example, in the range of about 0 nanosecond to about 24 hours, such as from about 1 nanosecond to about 24 hours, from about 1 nanosecond to about 1 hour or from about 1 second to about 1 hour. Two spray nozzles can be simultaneously or sequentially activated, with one nozzle dispensing the embedding fluid, and the other nozzle dispensing, with velocity, atomized nanowires dispersed in the carrier fluid towards the dry composition. Air-curing or higher temperature annealing optionally can be included.

As a further example, one embodiment involves applying nanowires or other additives onto a dry composition composed of sodium silicate or another alkali metal silicate or other solid glass. Either simultaneously or as a separate operation, an embedding fluid composed of heated, basic water is applied in liquid or vapor form to the sodium silicate at either room temperature or elevated temperature, which causes the sodium silicate to at least partially dissolve, thereby permitting entry of the nanowires into the dissolved sodium silicate. The water is evaporated or otherwise removed, causing the sodium silicate to re-solidify with the nanowires embedded within the sodium silicate. Air-curing or higher temperature annealing optionally can be included.

Figure 5C:
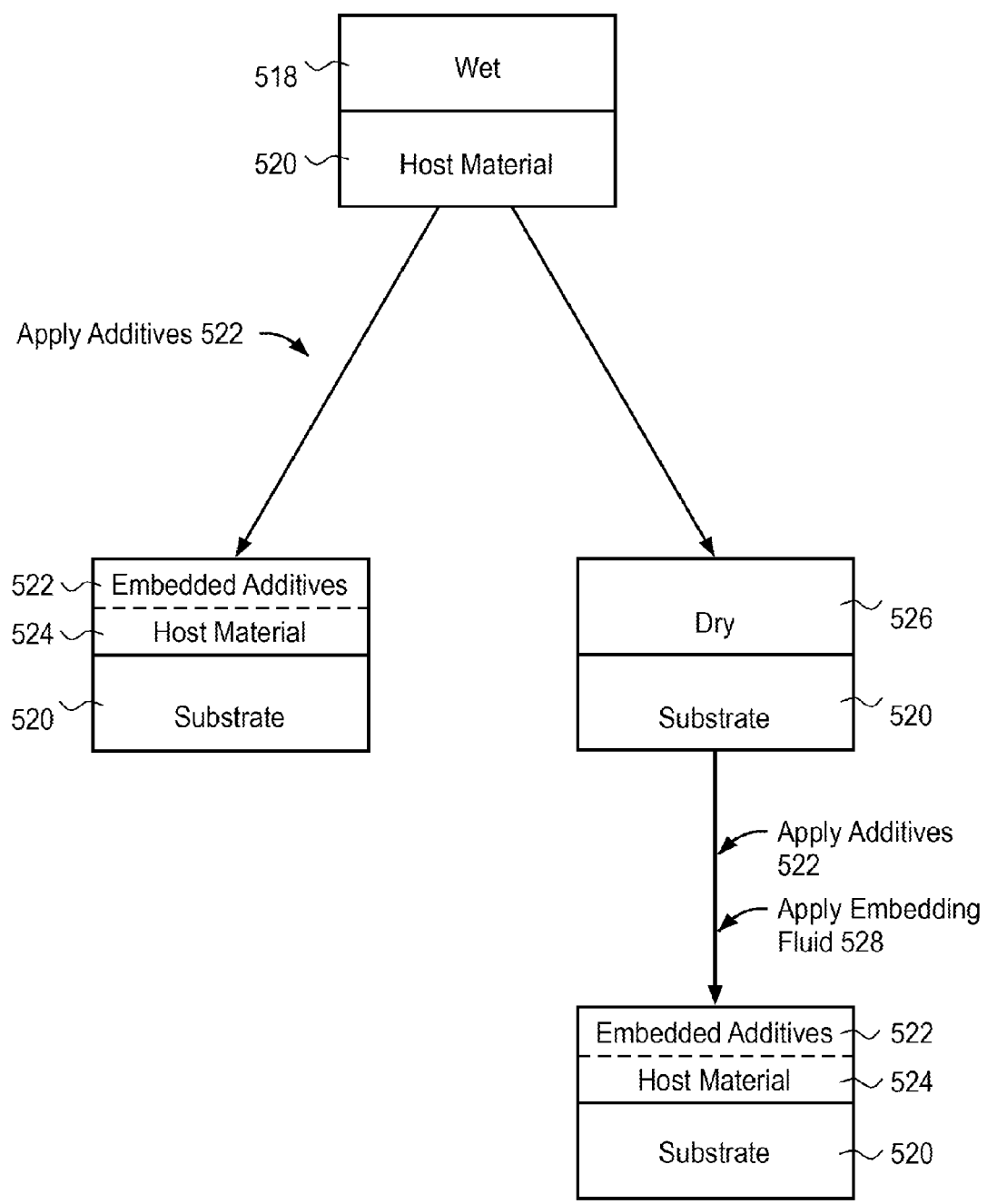

Attention next turns to FIG. 5C, which illustrates a manufacturing method for surface embedding additives 522 into a wet composition 518, according to an embodiment of the invention. Referring to FIG. 5C, the wet composition 518 is applied to a substrate 520 in the form of a coating that is disposed on top of the substrate 520. The wet composition 518 can correspond to a dissolved form of a host material and, in particular, can include a dissolved form of any material previously listed as suitable host materials, such as a polymer, a ceramic, a ceramic precursor, or any combination thereof. It is also contemplated that the wet composition 518 can correspond to a host material precursor, which can be converted into the host material by suitable processing, such as drying, curing, cross-linking, polymerizing, or any combination thereof. For example, the wet coating composition 518 can be a coating that is not fully cured or set, a cross-linkable coating that is not fully cross-linked, which can be subsequently cured or cross-linked using suitable polymerization initiators or cross-linking agents, or a coating of monomers, oligomers, or a combination of monomers and oligomers, which can be subsequently polymerized using suitable polymerization initiators or cross-linking agents. In some embodiments, the wet composition 518 can include a material with a liquid phase as well as a solid phase, or can include a material that is at least partially liquid or has properties resembling those of a liquid, such as a semisolid, a gel, and the like. The substrate 520 can be transparent or opaque, can be flexible or rigid, and can be composed of, for example, a polymer, an ionomer, EVA, PVB, TPO, TPU, PE, PET, PETG, polycarbonate, PVC, PP, acrylic-based polymer, ABS, siloxane, silane, sol-gel, ceramic, or any combination thereof, as well as any other material previously listed as suitable host materials. The substrate 520 can serve as a temporary substrate that is subsequently removed during device assembly, or can be retained in a resulting device as a layer or other component of the device.

Next, according to the option on the left-side of FIG. 5C, the additives 522 are applied to the wet composition 518 prior to drying or while it remains in a state that permits embedding of the additives 522 within the wet composition 518. In some embodiments, application of the additives 522 is via a flow coating method (e.g., slot die, capillary coating, meyer rod, cup coating, draw down, and the like). Although not illustrated on the left-side, it is contemplated that an embedding fluid can be simultaneously or separately applied to the wet composition 518 to facilitate the embedding of the additives 522. Subsequently, the resulting host material 524 has at least some of the additives 522 partially or fully embedded into a surface of the host material 524. Suitable processing can be carried out to convert the wet composition 518 into the host material 524. During device assembly, the host material 524 with the embedded additives 522 can be laminated or otherwise connected to adjacent device layers, or can serve as a substrate onto which adjacent device layers are formed, laminated, or otherwise applied.

Certain aspects regarding the application of the additives 522 and the embedding of the additives 522 in FIG. 5C can be carried out using similar processing conditions and materials as described above for FIG. 5A and FIG. 5B, and those aspects need not be repeated below. The following provides additional details on embodiments related to ceramics and ceramic precursors.

In some embodiments, additives are embedded into a wet composition in the form of a coating of a liquid ceramic precursor, which may include a solvent and a set of reactive species. The embedding is carried out before the solvent has fully dried and/or after drying but before curing, followed by the option of curing or otherwise converting the ceramic precursor to a fully condensed or restructured glass. Examples of ceramic precursor reactive species include spin-on glasses, silanes (e.g., Si(OR)(OR')(OR")(R'"), Si(OR)(OR')(R")(R'"), and Si(OR)(R')(R")(R'"), where R, R', R", and R'" are independently selected from alkyl groups, alkenyl groups, alkynyl groups, and aryl groups), titanium analogues of silanes, cerium analogues of silanes, magnesium analogues of silanes, germanium analogues of silanes, indium analogues of silanes, tin analogues of silanes, zinc analogues of silanes, aluminium analogues of silanes, any mixed metal analogues of silanes, siloxanes (e.g., Si(OR)(OR')(OR")(OR'"), where R, R', R", and R'" are independently selected from alkyl groups, alkenyl groups, alkynyl groups, and aryl groups), titanium analogues of siloxanes, cerium analogues of siloxanes, magnesium analogues of siloxanes, germanium analogues of siloxanes, indium analogues of siloxanes, tin analogues of siloxanes, zinc analogues of siloxanes, aluminium analogues of siloxanes, any mixed metal analogues of siloxanes, alkali metal silicates (e.g., sodium silicate and potassium silicate), or any combination thereof. As more specific examples, a ceramic precursor reactive species can be a siloxane such as tetramethoxysilane (or TMOS), tetraethoxysilane (or TEOS), tetra(isopropoxy)silane, titanium analogues thereof, cerium analogues thereof, magnesium analogues thereof, germanium analogues thereof, indium analogues thereof, tin analogues thereof, zinc analogues thereof, aluminium analogues thereof, any mixed metal analogues thereof, or any combination thereof.

In some embodiments, reactive species are at least partially reacted, prior to embedding of additives. Reaction can be carried out by, for example, hydrolysis in the presence of an acid and a catalyst and followed by condensation, thereby yielding oligomeric or polymeric chains. For example, silanes and siloxanes can undergo partial condensation to yield oligomeric or polymeric chains with Si—O—Si linkages, and at least some side groups corresponding to (OR) or (R).

In some embodiments, a liquid ceramic precursor includes at least two different types of reactive species. The different types of species can react with each other, as exemplified by two or more of TEOS, TMOS, and tetra(isopropoxy)silane, and can be suitably selected in order to control evaporation rate and pre-cured film morphology. Reactive species with larger side groups, such as isopropoxy in the case of tetra(isopropoxy)silane versus methoxy in the case of TMOS, can yield larger pore sizes when converted into a gel, which larger pore sizes can facilitate swelling in the presence of an embedding fluid. Also, upon hydrolysis, larger side groups can be converted into corresponding alcohols with lower volatility, such as isopropyl alcohol in the case of tetra(isopropoxy)silane versus methanol in the case of TMOS, which can slow the rate of drying. In other embodiments, the different types of species are not likely to react, such as sodium silicate and tetra(isopropoxy)silane. This can afford facile curing properties of a bulk of a matrix formed by drying the silicate, while retaining some amount of delayed condensation to allow embedding of additives.

In some embodiments, reactive species, either prior to reaction or subsequent to reaction, can include some amount of Si—C or Si—C—Si linkages, which can impart toughness, porosity, or other desirable characteristics, such as to allow trapping of a solvent to slow the rate of drying or to promote swelling in the presence of an embedding fluid.

In some embodiments, reactive species, either prior to reaction or subsequent to reaction, can include Si—OR groups, where R is a long chain side group with low volatility to slow the rate of drying of a coating of a liquid ceramic precursor. In other embodiments, reactive species can include Si—R' groups, where R' is a long chain side group with low volatility to slow the rate of drying of a coating of a liquid ceramic precursor. Either, or both, of R and R' also can have characteristics to interact and retain a solvent, thereby slowing the drying process. For example, R and R' can have polarity, non-polarity, aliphatic characteristics, or other characteristics that match those of the solvent.

In some embodiments, a solvent included in a liquid ceramic precursor can include water, an alcohol, dimethylformamide, dimethyl sulfoxide, another polar solvent, another non-polar solvent, any other suitable fluid listed above, or any combination thereof. For example, the solvent can be non-polar, and water can be used heterogeneously during hydrolysis, with complete condensation occurring after drying a coating of the ceramic precursor. As another example, a combination of solvents can be selected, such that a major component has high volatility in order to carry, wet, or level reactive species, whereas a minor component has low volatility to delay drying of the coating. It is also contemplated that the reactive species can form a relatively small fraction of a total coating volume to slow drying.

In some embodiments, a liquid ceramic precursor can be applied to a substrate using a wide variety of coating methods, such as a roll-to-roll process, roll coating, gravure coating, slot dye coating, knife coating, spray coating, and spin coating. For example, the liquid ceramic precursor can be applied by spin coating, and additives can be deposited upon the start of spin coating or after the start of spin coating, but before the resulting coating has dried on a spinner.

In some embodiments, additives can be dispersed in a carrier fluid, and then applied in a wet form to a liquid ceramic precursor. The carrier fluid can include the same solvent (or another solvent having similar characteristics) as a low volatility component of the liquid ceramic precursor in order to reduce or avoid adverse interaction upon impact. It is also contemplated that the carrier fluid can be volatile (e.g., methanol or another low boiling alcohol), which substantially vaporizes prior to impact. Another example of a suitable carrier fluid is water.

In some embodiments, curing can be carried out after embedding such that a liquid ceramic precursor is converted into a glass. For example, curing can involve heating to a temperature in the range of about 400° C. to about 500° C. in nitrogen (optionally containing water vapor (possibly saturated)), heating up to a temperature sufficient to remove residual solvent (e.g., from about 100° C. to about 150° C.), or heating to a temperature in the range of about 800° C. to about 900° C. to form a fully condensed glass. Curing can be omitted, such as in the case of sodium silicate (or another alkali silicate) that can dry under ambient conditions into a robust "clear coat." In some embodiments, curing can also serve as a sintering/annealing operation for embedded nanowires or other additives. In some embodiments, pre-curing can be carried out before embedding in order to stabilize a coating to withstand shear or fluid forces, but still be in a state to allow embedding of additives.

Turning back to FIG. 5C and referring to the option on the right-side, the wet composition 518 is initially converted into a dry composition 526 by suitable processing, such as by at least partially drying, curing, cross-linking, polymerization, or any combination thereof. Next, the additives 522 and an embedding fluid 528 are applied to the dry composition 526. The additives 522 can be in solution or otherwise dispersed in the embedding fluid 528, and can be simultaneously applied to the dry composition 526 via one-step embedding. Alternatively, the additives 522 can be separately applied to the dry composition 526 before, during, or after the embedding fluid 528 treats the dry composition 526. As noted above, the separate application of the additives 522 can be referred as two-step embedding. Subsequently, the resulting host material 524 has at least some of the additives 522 partially or fully embedded into the surface of the host material 524. Optionally, suitable processing can be carried out to convert the dry composition 526 into the host material 524, such as by additional drying, curing, cross-linking, polymerization, or any combination thereof. Any, or all, of the manufacturing stages illustrated in FIG. 5C can be carried out in the presence of a vapor environment of a suitable fluid (e.g., an embedding fluid or other suitable fluid) to facilitate the embedding of the additives 522, to slow drying of the wet composition 518, or both.

Certain aspects regarding the application of the additives 522 and the embedding fluid 528 and the embedding of the additives 522 in FIG. 5C can be carried out using similar processing conditions and materials as described above for FIG. 5A and FIG. 5B, and those aspects need not be repeated below. In particular, and in at least certain aspects, the processing conditions for embedding the additives 522 into the dry composition 526 of FIG. 5C can be viewed as largely parallel to those used when embedding the additives 512 into the dry composition 508 of FIG. 5B. The following provides further details on embodiments related to ceramics and ceramic precursors.

In some embodiments, additives are embedded into a dry composition in the form of a coating of an uncured (or not fully cured) ceramic precursor, which has been initially dried but is later swelled by an embedding fluid. This is followed by drying of the embedding fluid, contracting a coating matrix around the additives. In some instances, the embedding fluid can include the same solvent (or another solvent having similar characteristics) as that of the ceramic precursor prior to drying, in which case the processing conditions can be viewed as largely parallel to those used when embedding additives into a wet composition. Embedding of additives is followed by the option of curing or otherwise converting the ceramic precursor to a fully condensed or restructured glass.

In some embodiments, reactive species are selected to be initially oligomeric or polymeric (e.g., as opposed to monomers like TEOS or TMOS) prior to hydrolysis and condensation. Such oligomeric or polymeric form of the reactive species can promote swelling in the presence of an embedding fluid. Examples include reactive species available under the designations of Methyl 51, Ethyl 50, Ethyl 40, and the like. In other embodiments, oligomeric or polymeric reactive species can be formed by reacting monomeric reactive species, such as via hydrolysis and condensation, to reach a desired molecular weight. The oligomeric or polymeric reactive species can be combined with monomeric reactive species, with the different species being miscible, partially miscible, or largely immiscible. Such oligomeric or polymeric reactive species also can be used according to the left-side option of FIG. 5C, namely by including such oligomeric or polymeric reactive species in a coating of a liquid ceramic precursor and embedding additives into the coating prior to drying, optionally in the presence of an embedding fluid.

In some embodiments, reactive species can include monomers with up to two reactive sites, such as silicones, silsesquioxanes, and the like. Upon reaction, such reactive species can form polymer chains with a controllable amount of cross-linking, thereby promoting swelling in the presence of an embedding fluid and facilitating embedding of additives. For example, the reactive species can include $Si(OR)_2R'_2$, such as $Si(OCH_2CH_3)_2(CH_3)_2$, which typically does not crosslink below about 400° C., can swell with an embedding fluid due to its polymeric nature, and can be subsequently cross-linked into a glass by heating to above 400° C. Such polymeric reactive species also can be used according to the left-side option of FIG. 5C, namely by including such polymeric reactive species in a coating of a liquid ceramic precursor and embedding additives into the coating prior to drying, optionally in the presence of an embedding fluid.

EXAMPLES

The following examples describe specific aspects of some embodiments of the invention to illustrate and provide a description for those of ordinary skill in the art. The examples should not be construed as limiting the invention, as the examples merely provide specific methodology useful in understanding and practicing some embodiments of the invention.

Example 1

Formation of Surface-Embedded Encapsulant Layer

This example sets forth the formation of a surface-embedded encapsulant layer with spectral shifting functionality that can be laminated adjacent to a front surface of a solar device. A sheet of ethylene vinyl acetate (or EVA) is sprayed with a solution of a solvent system and a phosphor. Another encapsulant material, such as polyvinyl alcohol (or PVA), polyvinyl butaryl (or PVB), or thermoplastic polyurethane (or TPU), can be used in place of, or in combination with, EVA. The EVA sheet can be between about 250 µm and about 2.5 mm in thickness, such as about 500 µm in thickness. By way of example, the solvent system can be tetrahydrofuran and dichloromethane in a combination, and the phosphor can be a down-shifting species such as either, or both, of tris(dibenzoylmethane)(phenanthroline)europium(III) (or $Eu(dbm)_3phen$) and tris[3-(trifluoromethylhydroxymethylene)-d-camphorate]europium(III) (or $Eu(tfc)_3$). Another solvent or solvent combination can be used, and another phosphor or other type of additive can be used in place of, or in combination with, the phosphor. The phosphor is mixed into the solvent system prior to spray application. The solution sprayed onto the EVA sheet temporarily softens or solubilizes a top surface of the EVA sheet by a depth of about 500 nm, and this softening (in combination with a velocity of the impinging phosphor) permits rapid surface embedding of the phosphor into the EVA sheet. Spray conditions can involve about 1 ml to about 16 ml of the solution onto each square foot of the EVA sheet at a spray nozzle distance of about 6 inches from the EVA sheet, and an atomizing pressure of about 20 pounds per square inch. In such manner, the phosphor is localized within an embedding region and securely embedded beneath the top surface of the EVA sheet by a depth of about 500 nm. Following spray-embedding of the phosphor, evaporation of the solvent system proceeds in a rapid manner, rendering the EVA sheet dry within about 5 seconds. Curing or other suitable processing can proceed next with the phosphor now securely embedded into the top surface of the EVA sheet. The spray-embedding process can be conducted in a substantially continuous, roll-to-roll fashion, where the EVA sheet is wound and unwound substantially continuously.

Example 2

Formation of Surface-Embedded Encapsulant Layer

This example sets forth the formation of a surface-embedded encapsulant layer that can be incorporated within a solar device. Additives, such as in the form of silver nanowires suspended in an alcohol, are sprayed onto a surface of an EVA sheet. After the alcohol has evaporated leaving a superficially deposited layer of the silver nanowires on top of the EVA sheet, tetrahydrofuran is sprayed onto the surface of the EVA sheet, softening and embedding the nanowires into the EVA sheet. The amount of tetrahydrofuran can be controlled to tune the degree of embedding of the nanowires partially or fully beneath the surface of the EVA sheet. The resulting nanowire-embedded EVA sheet can exhibit light scattering characteristics and electrical conductivity due to percolation of contacting nanowires adjacent to the surface of the EVA sheet. This embedding process can be carried out at room temperature and atmospheric pressure. The nanowire-embedded EVA sheet can be laminated onto either, or both, a glass cover and a photoactive layer via vacuum lamination during device assembly. The resulting encapsulated solar device has an electrically conducting encapsulant layer to collect or augment the collection of current adjacent to a front electrode, as well as to enhance light scattering towards or otherwise induce absorption of sunlight by the photoactive layer, such as for sunlight at oblique angles of incidence. Additionally, the encapsulant layer offers enhanced thermal conductivity to distribute heat more efficiently and evenly across the solar device to ensure more reliable performance. Other types of additives can be used in place of, or in combination with, silver nanowires.

Example 3

Formation of Surface-Embedded Encapsulant Layer

About 250 mg of $Eu(dbm)_3phen$ was combined with about 13 mL of tetrahydrofuran. The entirety of this solution was sprayed using an iwata Eclipse HP-CS air brush onto 19 cm×27 cm pieces of Mars Rock EVA sheet providing a coverage of about 0.487 $mg/cm^2$. The EVA sheet was cut into 2.1 inches×2.1 inches pieces. 2 inches×2 inches pieces of borofloat glass from McMaster were cleaned with Micro 90 detergent and rinsed with dionized water and isopropanol, followed by about 30 minutes of UV-ozone treatment. The glass pieces were laminated to crystalline silicon photovoltaic cells obtained from Mars Rock. One piece was laminated with untreated EVA. The other piece was laminated with EVA treated with the europium phosphor. Lamination was carried out by sandwiching each EVA piece between a glass piece and a photovoltaic cell, followed by application of vacuum started empty at about 99° C. The assembly was placed into an oven, causing the temperature to drop to about 74° C. The oven was evacuated to −25 mm Hg, during which time the temperature moved up to about 86° C. The assembly was left in the oven for about 20 minutes under vacuum.

Example 4

Characterization of Surface-Embedded Structures

Figure 11:
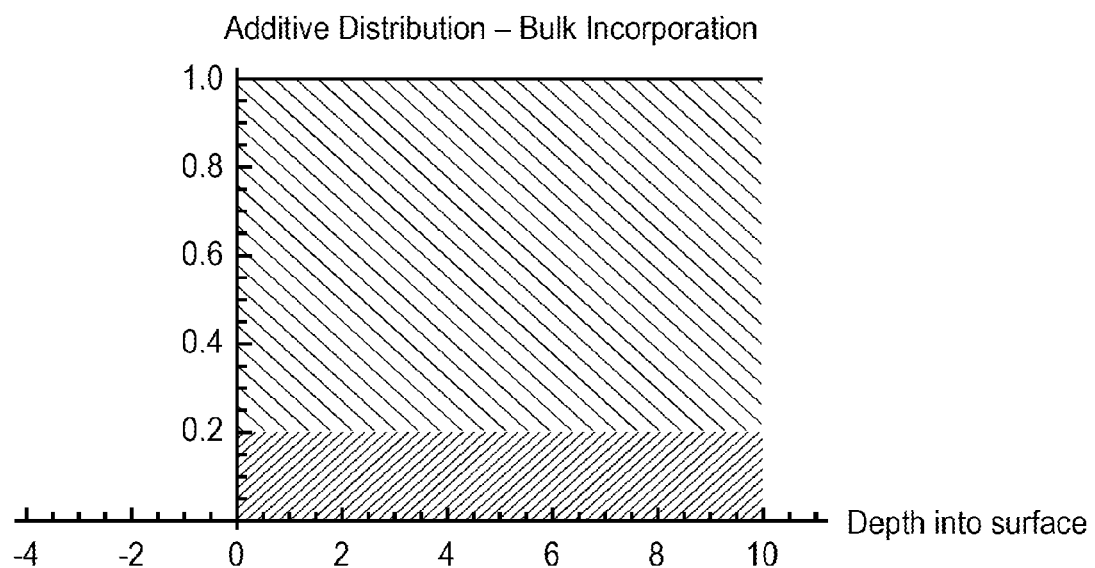
FIG. 11, FIG. 11A, FIG. 11B, FIG. 11C, FIG. 11D, FIG. 11E, FIG. 11F, FIG. 11G, FIG. 11H, FIG. 11I, FIG. 11J, FIG. 11K, and FIG. 11L illustrate various configurations of additive concentrations relative to an embedding surface of a host material, according to an embodiment of the invention.
Figure 11:
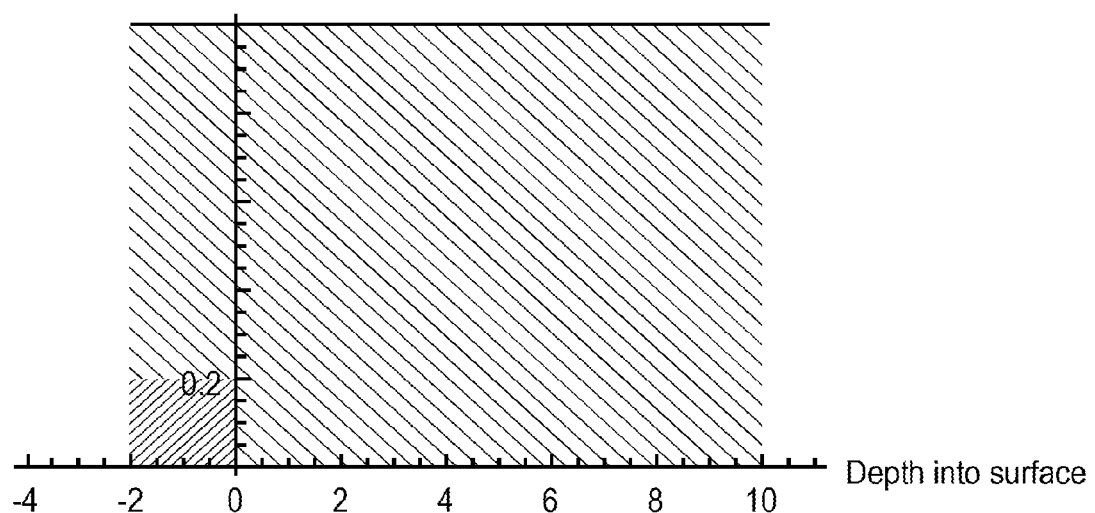

FIG. 11 illustrates various configurations of additive concentrations relative to an embedding surface of a host material, where non-zero additive concentrations denote the embedding regions. For all of the plots in FIG. 11, the host material is confined between the x-axis values of 0 and 10. If a coating is present, then it is deposited on top of the host material, and is located between x=−2 and x=0. The x-axis denote the depth/thickness of the host material from the embedding surface. The first plot is of a substrate that has been bulk incorporated or compounded with additives mixed throughout the bulk of the entire substrate. Its additive concentration is depicted as a uniform distribution held at y=0.2 concentration. The second plot illustrates a similar geometry, but with additives mixed throughout a coating material.

Figure 11A:
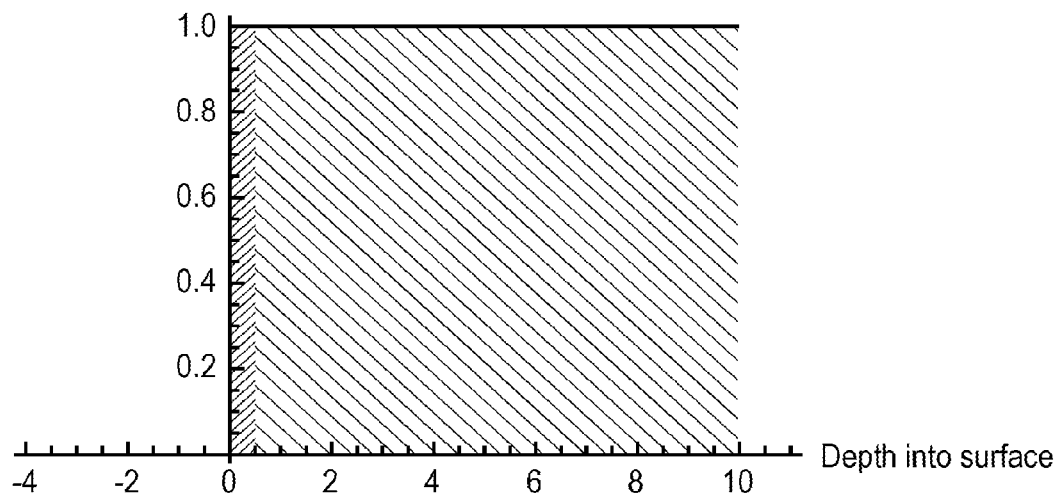
Figure 11B:
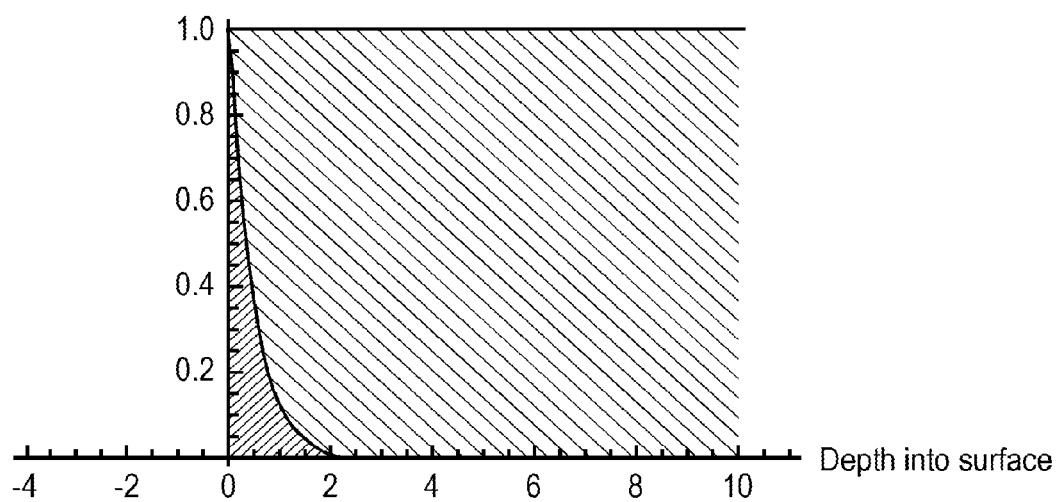
Figure 11C:
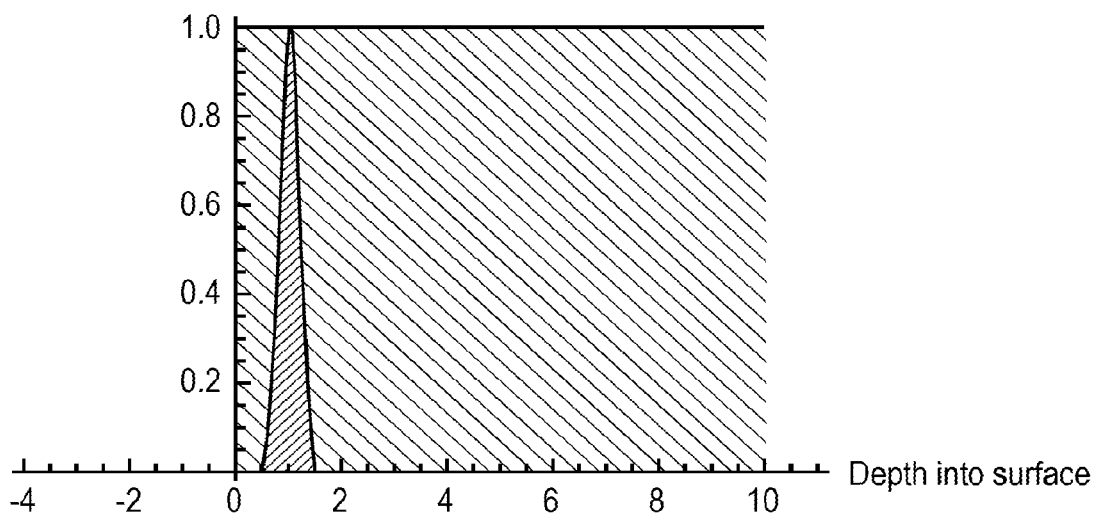
Figure 11D:
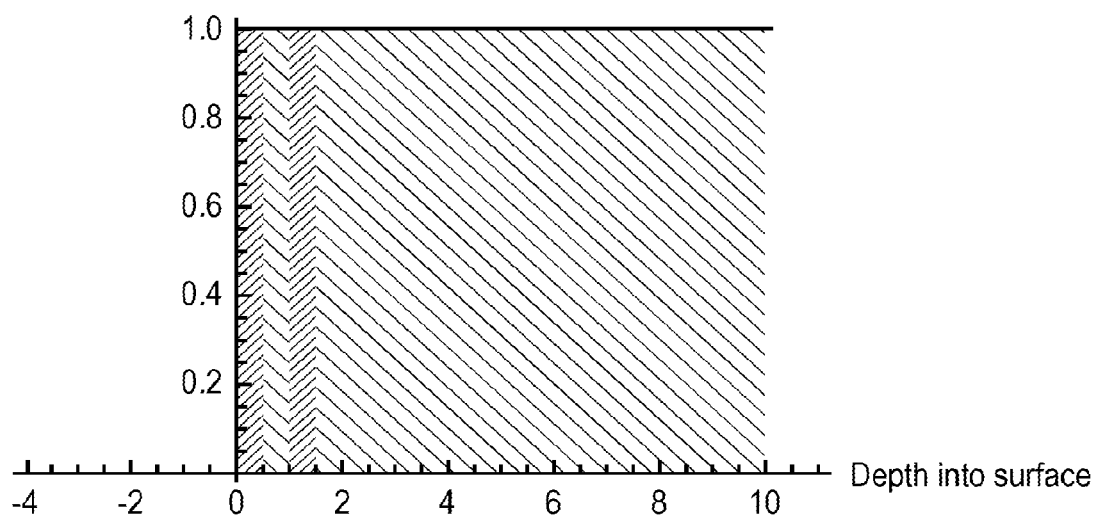
Figure 11E:
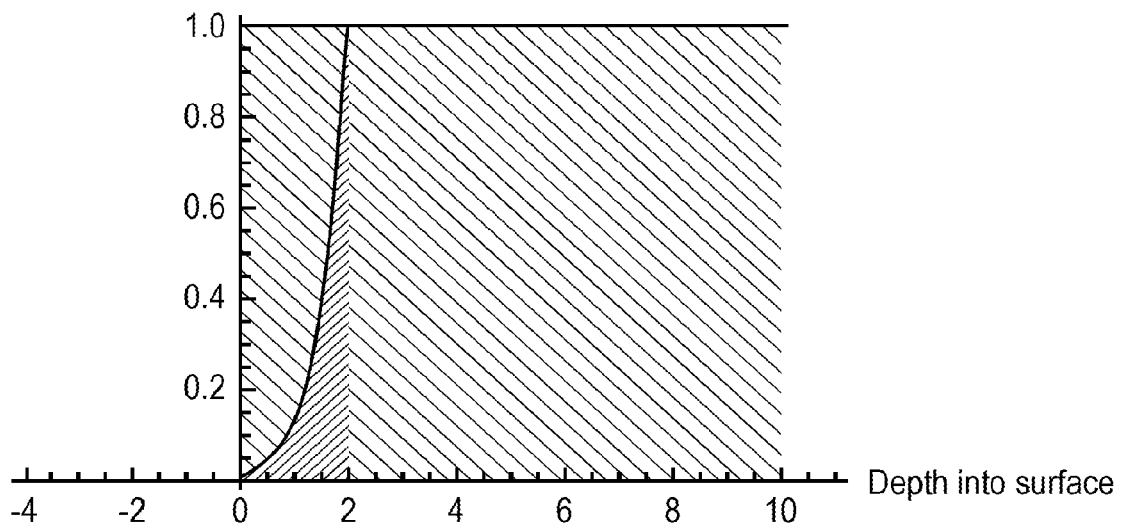
Figure 11F:
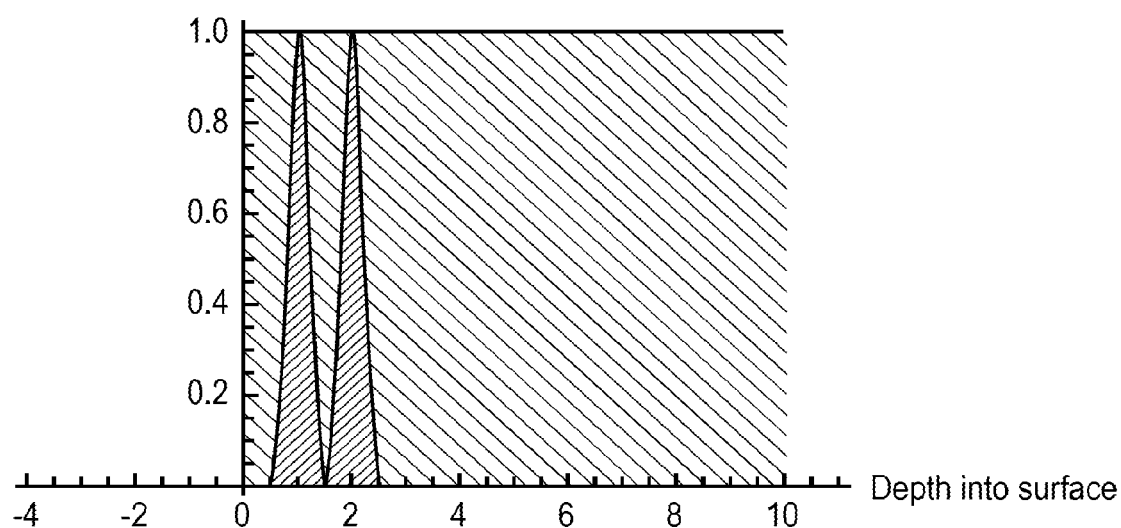
Figure 11G:
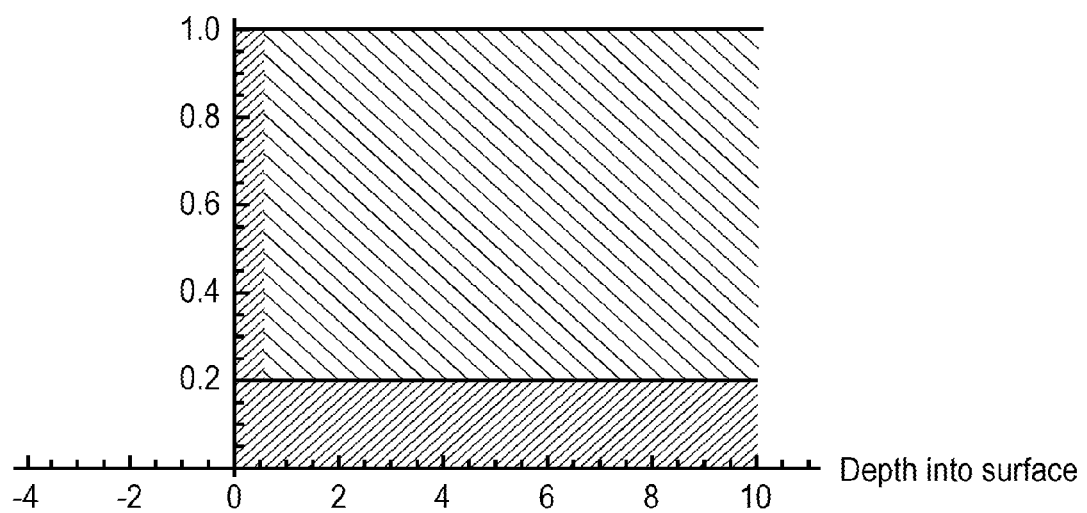
Figure 11H:
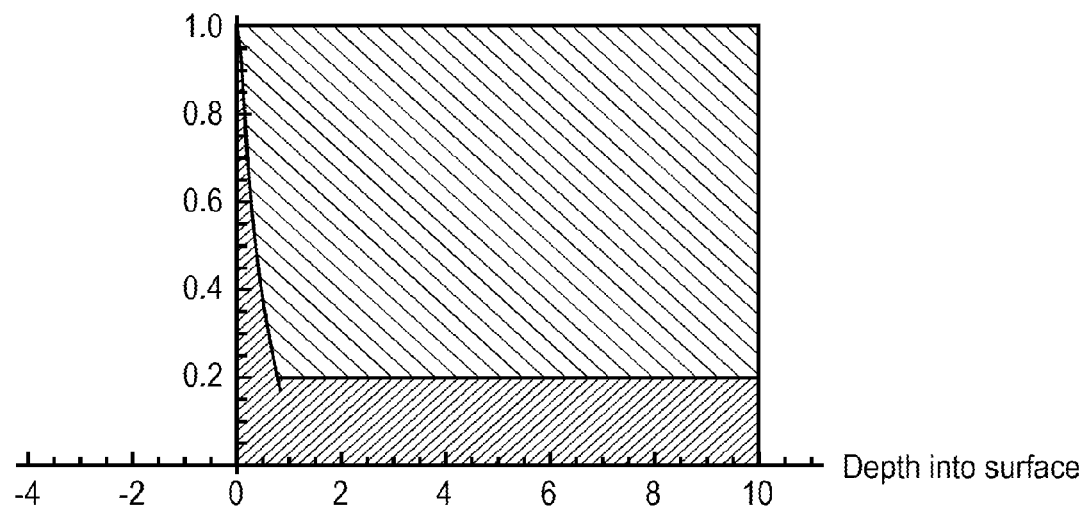
Figure 11I:
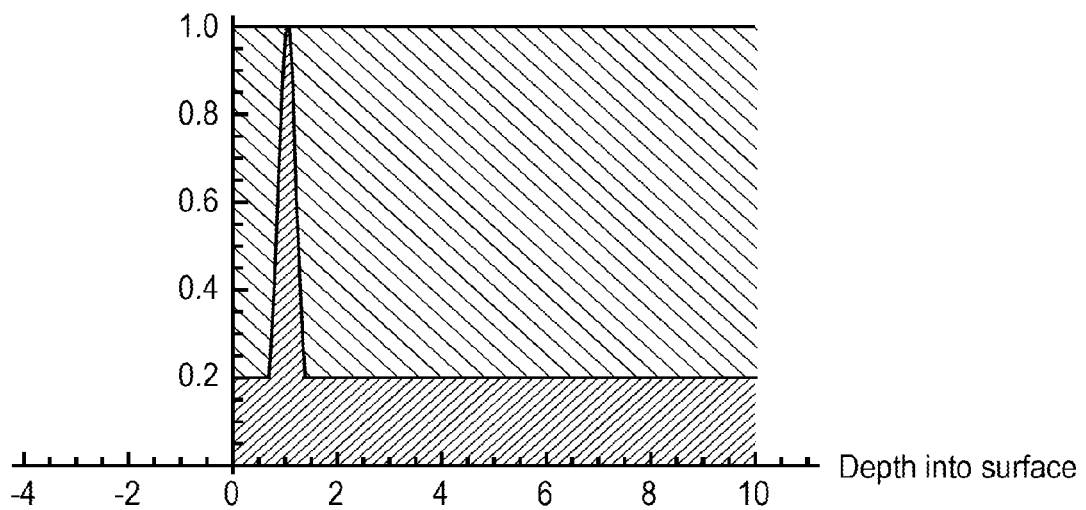
Figure 11J:
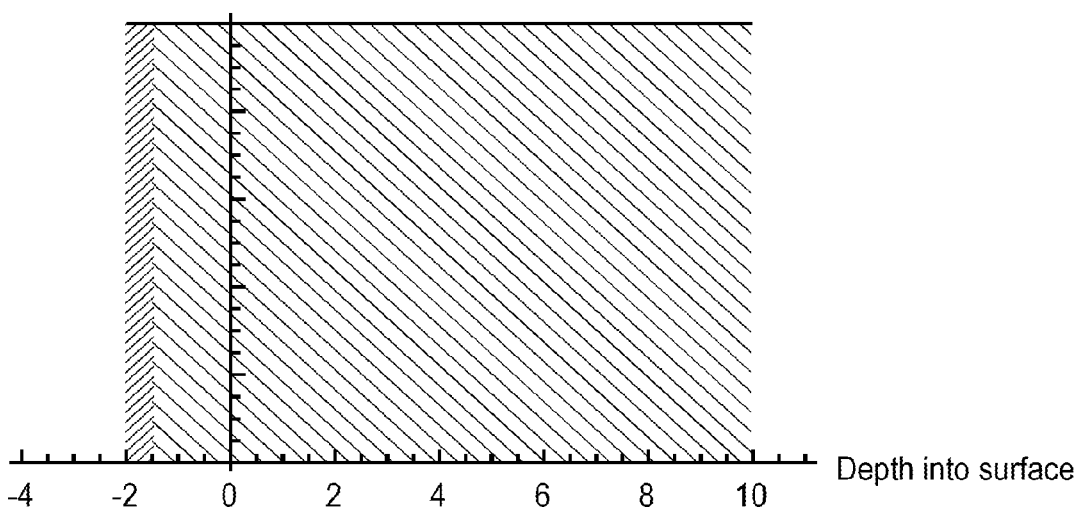
Figure 11K:
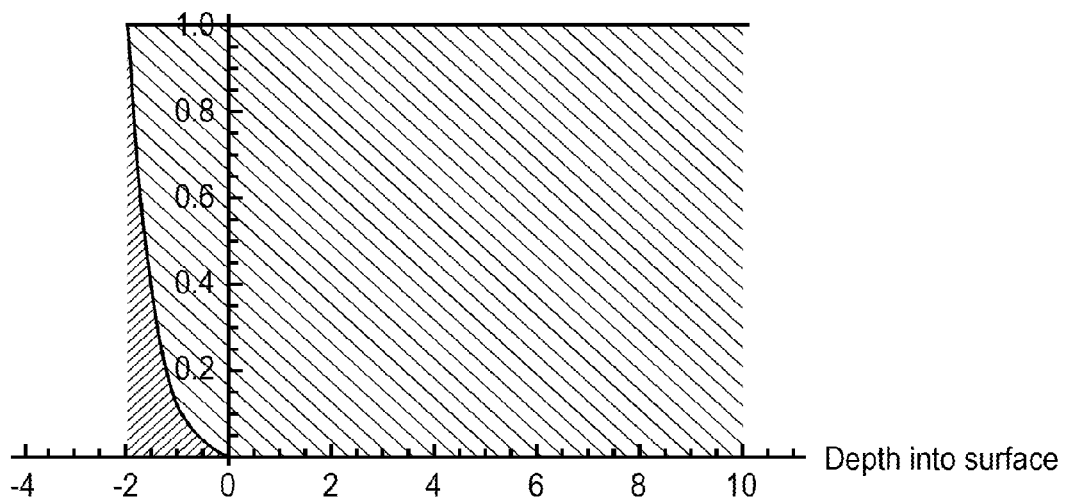
Figure 11L:
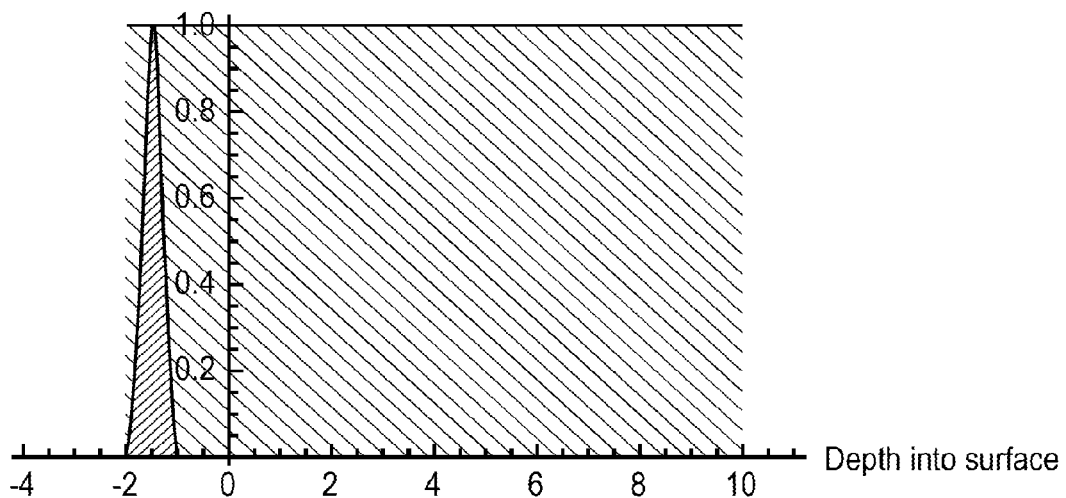
Figure 12C:
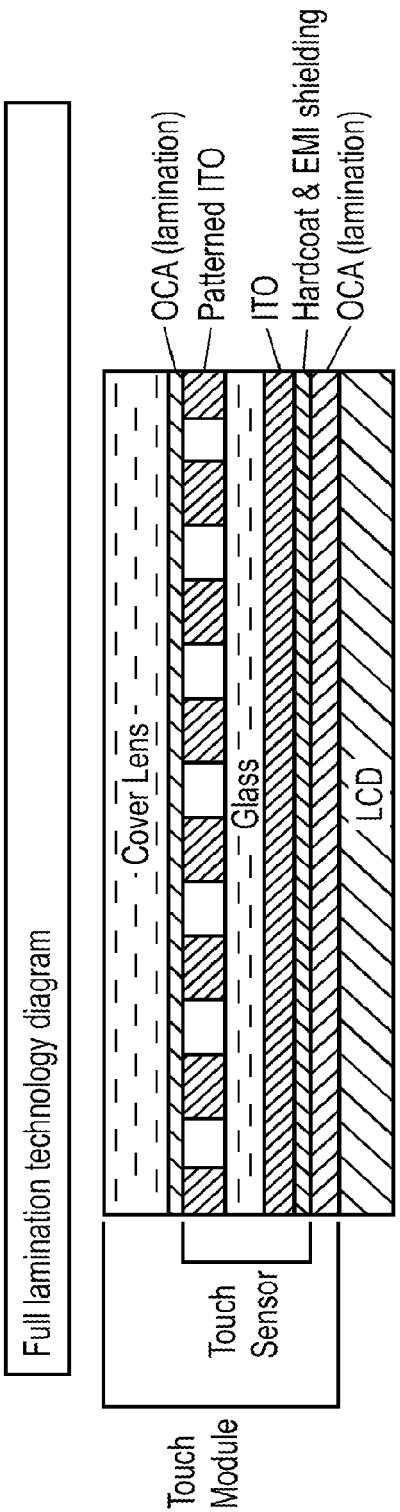
Figure 12D:
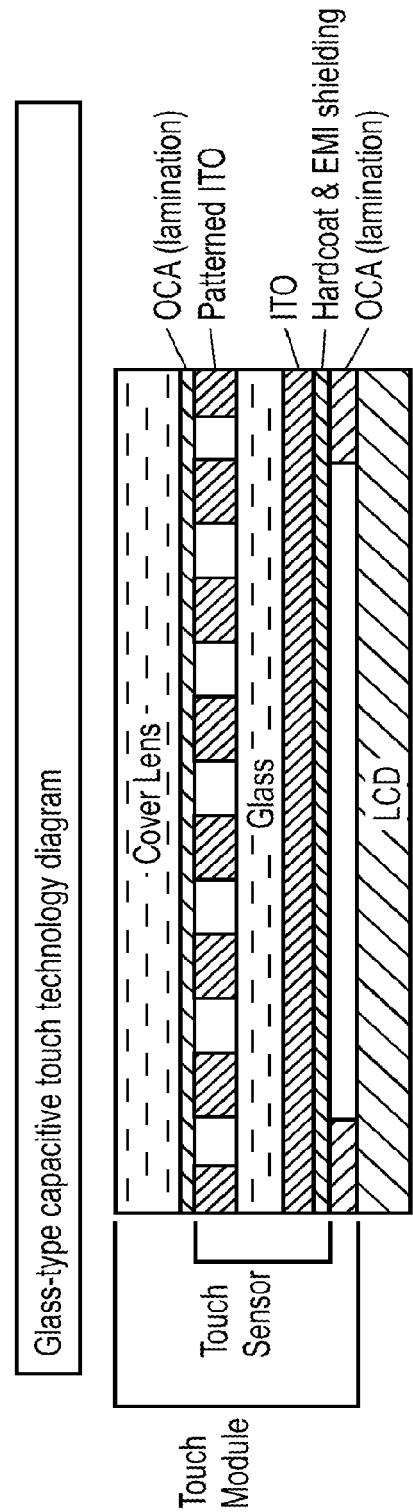
Figure 12E:
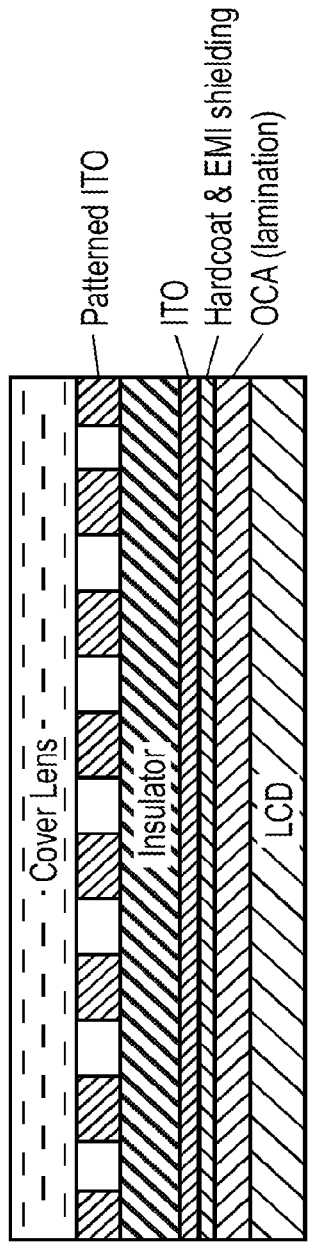
Figure 12F:
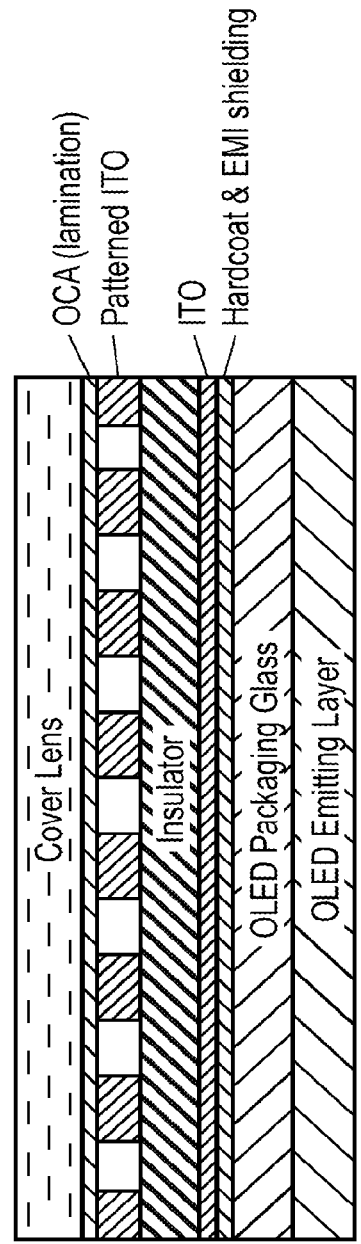

Surface-embedded additives can be localized in a discrete step or delta function as a function of thickness or depth from the embedding surface of the host material, as illustrated in FIG. 11A. Alternatively, the additives can be largely localized at the embedding surface but having a concentration tailing off the deeper into the embedding surface as in FIG. 11B or the closer to the embedding surface as in FIG. 11E. Additives can be surface-embedded fully beneath the embedding surface in the fashion of FIG. 11C, where there is a maximum concentration of additives at a discrete depth followed by a tailing off of additive concentration from that discrete depth below the embedding surface in both directions. Multiple depths of additive embedding can be achieved by adjusting parameters to tune the depth of embedding, and multiple operations can be performed onto the substrate to permit this multiple layered embedding geometry as captured in FIG. 11D and FIG. 11F. Similar geometries can be achieved by surface-embedding via the aforementioned approaches but on (or in) a substrate that has already been bulk incorporated, as in FIG. 11G through FIG. 11I. Similar geometries can be achieved by surface-embedding not only into a substrate material but also into a coating material, as those illustrated in FIG. 11J through FIG. 11L.

While the invention has been described with reference to the specific embodiments thereof, it should be understood by those skilled in the art that various changes may be made and equivalents may be substituted without departing from the true spirit and scope of the invention as defined by the appended claims. In addition, many modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A device comprising:
   a first layer;
   a second layer; and
   an interlayer disposed between the first layer and the second layer, wherein the interlayer includes:
   a polymeric film; and
   a first type of nano-additives and a second type of nano-additives at least partially embedded into the polymeric film, wherein the first type of nano-additives are completely localized within a first embedding layer of the polymeric film, and wherein the second type of nano-additives are completely localized within a second embedding layer of the polymeric film, wherein the first embedding layer is different from the second embedding layer.

2. The device of claim 1, wherein a thickness of the first embedding layer is less than an overall thickness of the polymeric film, a thickness of the second embedding layer is less than the overall thickness of the polymeric film, and a remainder of the polymeric film is devoid of any of the first type of nano-additives or the second type of nano-additives.

3. The device of claim 2, wherein the thickness of the first embedding layer or the second embedding layer is no greater than 50% of the overall thickness of the polymeric film.

4. The device of claim 1, wherein at least some of the first type of nano-additives or some of the second type of nano-additives partially extend out from a surface of the polymeric film.

5. The device of claim 1, wherein at least some of the first type of nano-additives or some of the second type of nano-additives are fully embedded below a surface of the polymeric film.

6. The device of claim 1, wherein at least one of the first type of nano-additives or the second type of nano-additives are patterned to form an array of interconnects.

7. The device of claim 6, further comprising a metallization that is electrically connected to at least one of the interconnects.

8. The device of claim 1, further comprising a display device, and the first layer, the interlayer, and the second layer are coupled to the display device.

9. The device of claim 1, wherein the first embedding layer and the second embedding layer form a layered arrangement.

10. The device of claim 1, wherein the first type of nano-additives and the second type of nano-additives are different types of nanowires.

11. The device of claim 1, wherein the first type of nano-additives and the second type of nano-additives are different types of nanoparticles.

12. The device of claim 1, wherein the first type of nano-additives are nanowires, and wherein the second type of nano-additives are nanoparticles.

13. The device of claim 1, wherein the a first embedding layer is adjacent to a top embedding surface of the polymeric film, and wherein the second embedding layer is adjacent to a bottom embedding surface of the polymeric film.

14. A touch display comprising:
    a first device layer;
    an interlayer disposed on the first device layer, the interlayer comprising:
    a polymeric film; and
    a first type of nano-additives and a second type of nano-additives at least partially embedded into the polymeric film, wherein the first type of nano-additives are completely localized within a first embedding layer of the polymeric film, and wherein the second type of nano-additives are completely localized within a second embedding layer of the polymeric film, wherein the first embedding layer is different from the second embedding layer; and
    a second device layer disposed on the interlayer.

15. The touch display of claim 14, wherein the second device layer fully covers the first type of nano-additives and the second type of nano-additives.

16. The touch display of claim 14, wherein the first type of nano-additives and the second type of nano-additives are partially exposed from the second device layer.

17. The touch display of claim 14, wherein the first device layer is an optically clear adhesive layer.

18. The touch display of claim 14, wherein at least one of the first type of nano-additives or the second type of nano-additives are patterned to form an array of interconnects.

19. The touch display of claim 14, wherein the first embedding layer is adjacent to a top embedding surface of the polymeric film, and wherein the a second embedding layer is adjacent to a bottom embedding surface of the polymeric film.

20. The touch display of claim 19, wherein the first type of nano-additives and the second type of nano-additives form a projected capacitive touch sensor, a capacitive touch sensor, a resistive touch sensor, or a combination thereof.

* * * * *